United States Patent [19]

Kotayama et al.

[11] Patent Number: 5,415,974
[45] Date of Patent: May 16, 1995

[54] PHOTOSENSITIVE MATERIAL AND IMAGE FORMING METHOD USING SAME

[75] Inventors: Masato Kotayama, Yokohama; Tetsuro Fukui, Kawasaki; Akihiro Mouri, Atsugi; Kazuo Isaka, Tokyo; Kyo Miura, Yokohama; Kenji Kagami, Atsugi; Masao Suzuki, Tokyo, all of Japan

[73] Assignee: Canon Kabushiki Kaisha, Tokyo, Japan

[21] Appl. No.: 51,807

[22] Filed: Apr. 26, 1993

Related U.S. Application Data

[63] Continuation of Ser. No. 844,933, Mar. 4, 1992, abandoned, which is a continuation of Ser. No. 395,518, Aug. 18, 1989, abandoned.

[30] Foreign Application Priority Data

| Aug. 23, 1988 | [JP] | Japan | 63-207230 |
| Oct. 4, 1988 | [JP] | Japan | 63-250173 |
| May 24, 1989 | [JP] | Japan | 1-128729 |
| May 25, 1989 | [JP] | Japan | 1-130165 |
| May 30, 1989 | [JP] | Japan | 1-134699 |
| Jun. 2, 1989 | [JP] | Japan | 1-139130 |
| Jun. 23, 1989 | [JP] | Japan | 1-159715 |
| Jul. 13, 1989 | [JP] | Japan | 1-179039 |
| Jul. 26, 1989 | [JP] | Japan | 1-191333 |
| Aug. 1, 1989 | [JP] | Japan | 1-197981 |

[51] Int. Cl.$^6$ .......................... G03C 8/40; G03C 8/10
[52] U.S. Cl. ................... 430/201; 430/203; 430/254; 430/281; 430/330
[58] Field of Search ............. 430/201, 203, 254, 281, 430/330, 138

[56] References Cited

U.S. PATENT DOCUMENTS

| 3,245,796 | 4/1966 | Burg | 430/201 |
| 3,874,947 | 4/1975 | Hayakawa et al. | 430/264 |
| 4,587,198 | 5/1986 | Fisch | 430/203 |
| 4,624,910 | 11/1986 | Takeda | 430/203 |
| 4,649,098 | 3/1987 | Takeda | 430/203 |
| 4,764,451 | 8/1988 | Ishikawa | 430/254 |
| 4,764,451 | 8/1988 | Ishikawa | 430/254 |
| 4,956,260 | 9/1990 | Nakamura | 430/203 |
| 5,001,032 | 3/1991 | Katayama et al. | 430/254 |
| 5,064,744 | 11/1991 | Fukui et al. | 430/254 |
| 5,166,040 | 11/1992 | Takeda | 430/281 |

FOREIGN PATENT DOCUMENTS

| 0258971 | 3/1988 | European Pat. Off. |
| 2227134 | 4/1974 | France |
| 3207064 | 12/1982 | Germany |
| 62-70836 | 4/1987 | Japan |
| 1066966 | 4/1967 | United Kingdom |

OTHER PUBLICATIONS

Patent Abstr. of Japan, vol. 7, No. 38, (P-176)(1183), Feb. 16, 1983.
Patent Abstr. of Japan, vol. 10, No. 130, (M-478)(2187), May 14, 1986.

Primary Examiner—Richard L. Schilling
Attorney, Agent, or Firm—Fitzpatrick, Cella, Harper & Scinto

[57] ABSTRACT

A photosensitive material comprises a photosensitive silver halide, an organic silver salt, a reducing agent, a polymerizable polymer precursor, a photopolymerization initiator and a heat-diffusible coloring matter. As a preferred embodiment, the photosensitive material comprises a photosensitive layer containing the photosensitive silver halide, the organic silver salt and the reducing agent, a polymerizing layer containing the polymerizable polymer precursor and the photopolymerization initiator, and a coloring material layer containing the heat-diffusible coloring material. A image forming method employing the photosensitive material comprises the steps of a) subjecting the photosensitive material to imagewise exposure; b) heating the photosensitive material; c) subjecting to whole areas exposure at least the polymerizing layer; and d) heating at least the coloring material layer to transfer the heat-diffusible coloring matter to an image-receiving material, thus forming a color image.

6 Claims, 7 Drawing Sheets

PHOTOSENSITIVE MATERIAL AND IMAGE FORMING METHOD USING SAME

This application is a continuation of application Ser. No. 07/844,933, filed Mar. 4, 1992, now abandoned; which, in turn is a continuation of application Ser. No. 07/395,518, filed Aug. 18, 1989, now abandoned

BACKGROUND OF THE INVENTION

1. Field of the Invention

The present invention relates to a silver salt type photosensitive material used in forming an image, and to an image forming method using the photosensitive material.

More particularly, the present invention relates a photosensitive material containing a coloring matter, and an image forming method that forms an image by transferring to an image-receiving material and the like the coloring matter contained in the photosensitive material.

2. Related Background Art

Energies used to form or record an image include light, sound, electricity, magnetism, heat, radiations such as electron rays and X-rays, and chemical energy, among which, in particular, widely used are light, electricity, heat energy, or a combination of any of these.

For example, the image forming method that employs light energy and chemical energy in combination includes a silver salt photographic process and a method in which a diazo copying paper is used. The method that employs light energy and electric energy in combination includes an electrophotographic system. Also, the method that utilizes heat energy includes a method in which a thermal recording paper or transfer recording paper is used. On the other hand, known as the method that utilizes electric energy is a method in which an electrostatic recording paper, electrothermal recording paper, or electrosensitive recording paper is used.

Of the above image forming methods, the silver salt photographic process can obtain an image having a high resolution. The silver salt photographic process, however, requires the complicated developing and fixing treatments that uses liquid compositions, or the drying of an image (or a print).

Now, development is energetically made on image forming methods that can form an image through a simple processing.

For example, Japanese Patent Application Laid-Open No. 62-69062 teaches a method in which polymerization reaction under dry (thermal) conditions is caused by the photosensitive reaction of silver halide that acts as a trigger, to form an image comprising a polymer.

Japanese Patent Application Laid-Open No. 62-70836, for example, also discloses a method of forming a polymer image, comprising: forming a latent image comprising silver metal produced from silver halide by imagewise exposure; converting, under heating, a reducing agent into an oxidized product having a polymerization inhibitory power different from that of the reducing agent by utilizing a catalytic action of the above silver metal, thereby producing a difference in the polymerization inhibitory power between the reducing agent and the resulting oxidized product; and also causing a thermal polymerization reaction utilizing the thermal polymerization initiator, thus forming a polymer latent image corresponding with the difference in the polymerization inhibitory power.

From such a polymer latent image comprising polymerized areas and unpolymerized areas, an image comprising a polymer can be obtained by selectively carrying out adhesion transfer or etching of the polymerized areas or unpolymerized areas.

These methods, however, have been involved in a disadvantage that a good contrast tends not to be achieved in the polymer latent image.

This disadvantage arises presumably because the oxidation-reduction reaction taking place in a latent image portion to form the oxidized product and the polymerization reaction to form the polymer image are allowed to take place in the same heating step, so that these reactions may proceed in a competitive fashion and thus the respective reactions may not proceed in a good efficiency.

Also, the image formation according to this method is very unstable in that, for example, an areas where the polymer is formed may turn into imagewise exposed areas or unexposed areas only because of a slight change in the amount of the reducing agent to be added.

In addition, Japanese Patent Application Laid-Open No. 61-75342 discloses a method in which a reducing agent having a polymerization inhibitory power is brought into an oxidized product by imagewise consumption (at imagewise exposed areas) in the course of the developing of silver halide, and after imagewise inhibition (at imagewise unexposed areas) of polymerization reaction by the action of the residual reducing agent, light energy is uniformly applied from the outside (whole areal exposure) to cause photopolymerization at the part where the reducing agent has been consumed, thus forming a polymer image.

The above method has advantages that it can achieve a high sensitivity in the writing of a latent image since the silver halide is used, and the steps of from the writing for the formation of an image up to the whole areal exposure can be separated in a good efficiency. It, however, is difficult to obtain a polymer latent image having a sufficient contrast. This is caused by the following reason.

The reducing agent used in the above method is in itself a reducing agent that acts as a polymerization inhibitor and turns not to act as the polymerization inhibitor after the reduction of silver halide. If the polymerization is sufficiently achieved, the reducing agent at the imagewise exposed area will not be sufficiently converted into the oxidized product. However, the application of heat energy in a sufficient amount in carrying out a development, with the intention to sufficiently convert the reducing agent at the imagewise exposed area into the oxidized product, may cause an undesired oxidation-reduction reaction at the imagewise unexposed areas. To the contrary, the application of heat energy in a reduced amount in carrying out the development, with the intention to prevent the oxidation-reduction reaction from taking place at the imagewise unexposed area, may cause the oxidation-reduction reaction not to sufficiently proceed at the exposed areas. Since in this instance the imagewise exposed area of an oxidation-reduction image is polymerized with difficulty, light energy in carrying out the whole areal exposure must be applied in an increased amount. This may cause an undesired polymerization at the unexposed areas with increase in the amount of light energy, eventually making it impossible to obtain a polymer latent image with a sufficient contrast.

SUMMARY OF THE INVENTION

An object of the present invention is to provide a photosensitive material capable of more fastly and more stably form a polymer image having a good contrast, and an image forming method using the photosensitive material.

Another object of the present invention is to provide a photosensitive material capable of forming an image having a superior brightness and chroma, without being affected by the black color of a silver image, and an image forming method using the photosensitive material.

Still another object of the present invention is to provide an image forming method capable of obtaining an image with a high gradation, and also capable of controlling the gradation and carrying out an image forming process with ease, and a photosensitive material used in the method.

The present invention provides a photosensitive material, comprising a photosensitive silver halide, an organic silver salt, a reducing agent, a polymerizable polymer precursor, a photopolymerization initiator and a heat-diffusible coloring matter.

In a preferred embodiment of the photosensitive material, the photosensitive silver halide, the organic silver salt, the reducing agent, the polymerizable polymer precursor, the photopolymerization initiator and the heat-diffusible coloring matter are contained in the same layer.

In another preferred embodiment, the photosensitive material comprises a photosensitive layer containing the photosensitive silver halide, the organic silver salt and the reducing agent, and a polymerizing layer containing the polymerizable polymer precursor, the photopolymerization initiator and the heat-diffusible coloring matter.

In still another preferred embodiment, the photosensitive material comprises a photosensitive layer containing the photosensitive silver halide, the organic silver salt, the reducing agent, the polymerizable polymer precursor and the photopolymerization initiator, and a coloring material layer containing the heat-diffusible coloring matter.

In a further preferred embodiment, the photosensitive material comprises a photosensitive layer containing said photosensitive silver halide, the organic silver salt and the reducing agent, a polymerizing layer containing the polymerizable polymer precursor and the photopolymerization initiator, and a coloring material layer containing said heat-diffusible coloring matter.

In another embodiment, the present invention provides a photosensitive material, comprising a photosensitive silver halide, an organic silver salt, a reducing agent, a polymerizable polymer precursor, a photopolymerization initiator and a heat-diffusible coloring matter; a plurality of regions being arranged in in-plane in said photosensitive material, and hues of the heat-diffusible coloring matter, when heat-diffusible coloring matters have been transferred to an image-receiving material by heating, being different from each other at adjacent regions.

The present invention also provides an image forming method using a photosensitive material containing a photosensitive silver halide, an organic silver salt, a reducing agent, a polymerizable polymer precursor, a photopolymerization initiator and a heat-diffusible coloring matter; which comprises the steps of:

a) subjecting the photosensitive material to imagewise exposure;
b) heating the photosensitive material;
c) subjecting to whole areal exposure at least a layer containing the polymerizable polymer precursor and a photopolymerization initiator of the photosensitive material;
d) heating at least a layer containing the heat-diffusible coloring matter of the photosensitive material, to transfer the heat-diffusible coloring matter to an image-receiving material, thus forming a color image.

In another embodiment of the image forming method, the present invention provides an image forming method using a photosensitive material, comprising a photosensitive silver halide, an organic silver salt, a reducing agent, a polymerizable polymer precursor, a photopolymerization initiator and a heat-diffusible coloring matter; a plurality of regions being arranged in in-plane arrangement in the photosensitive material, and hues of the heat-diffusible coloring matter, when heat-diffusible coloring matters have been transferred to an image-receiving material by heating, being different from each other at adjacent regions; which comprises the steps of;

a) subjecting the photosensitive material to imagewise exposure;
b) heating the photosensitive material;
c) subjecting to whole areal exposure at least a layer containing the polymerizable polymer precursor and a photopolymerization initiator of the photosensitive material; and
d) heating at least a layer containing the heat-diffusible coloring matter of the photosensitive material, to transfer the heat-diffusible coloring matter to an image-receiving material.

In still another embodiment of the image forming method, the present invention provides an image forming method using a first sheet containing a photosensitive silver halide, an organic silver salt and a reducing agent, and a second sheet containing a heat-diffusible coloring matter, any one or both of which contain a polymerizable polymer precursor and a photopolymerization initiator; which comprises the steps of:

a) subjecting the first sheet to imagewise exposure;
b) forming a laminate by laminating the first sheet and the second sheet;
c) heating the laminate;
d) subjecting the laminate to whole areal exposure; and
e) heating at least the second sheet to transfer the heat-diffusible coloring matter to an image-receiving material.

DETAILED DESCRIPTION OF THE PREFERRED EMBODIMENTS

Figure 1A:
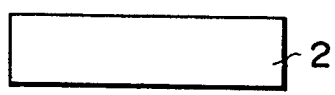
FIGS. 1 to 8 schematically illustrates various embodiments of the layer constitution of the photosensitive material of the present invention.

The photosensitive material of the present invention will now described first.

The photosensitive material of the present invention is characterized by containing a photosensitive silver halide, an organic silver salt, a reducing agent, a polymerizable polymer precursor, a photopolymerization initiator and a heat-diffusible coloring matter.

The above photosensitive material has a characteristic that a silver metal is produced by imagewise exposure to light with a wavelength region of from 400 nm to 900 nm and the organic silver and so forth are reduced by the catalytic action between the reducing agent and the above metal silver under heating to 60° to 180° C. The reducing agent has a characteristic that it is capable of being oxidized by the oxidation-reduction reaction during the above heating to form distribution of the reducing agent and oxidized product having different polymerization inhibitory power to the polymerizable polymer precursor, where the polymerizable polymer precursor is area-selectively polymerized, corresponding to this distribution, by whole areal exposure to light with a wavelength region of from 250 to 700 nm, so that a polymer latent image comprising a polymerized area and an unpolymerized area can be formed.

In the photosensitive material of the present invention, the polymer latent image is also formed by the utilization of a difference in heat-diffusibility of the heat-diffusible coloring matter between the polymerized areas and unpolymerized area of the above polymer latent image. For example, the polymer latent image formed on the photosensitive material and an image-receiving material such as image-receiving paper are laminated and heated so that the heat-diffusible coloring matter is heat-diffusion-transferred to the image-receiving material, corresponding with said polymer latent image. Thus an image comprised of the transferred coloring matter can be obtained.

The "polymerized area" mentioned in the present invention refers to an area polymerized in the course of the area-selective polymerization (in a desired pattern) of the polymerizable polymer precursor contained in the photosensitive material, and the "unpolymerized area" refers to an area not polymerized. Thus the "polymer latent image" mentioned in the present invention refers to a desired pattern comprised of the "polymerized area" and "unpolymerized area". The polymerization herein mentioned also includes the cross-linking polymerization. The "unpolymerized area" also includes not only an area at which no polymerization took place at all but also an area substantially unpolymerized, in other words, an area at which the polymerization took place only to the extent that a satisfactory diffusibility of the heat-diffusible coloring matter may not be inhibited (i.e., an extent that no influence may be given to the formation of an image). The "heat-diffusible coloring matter" mentioned in the present invention refers to, for example, a heat-diffusible dye, a diffusible color former capable of forming a color as a result of the reaction with a developer after heat-diffusion or the like substance. The "photosensitive material" mentioned in the present invention also refers typically to a material comprising a support and a photosensitive layer or the like formed thereon, but also includes a material having no support because of a sufficient strength possessed by the photosensitive layer itself.

The photosensitive material of the present invention, which takes the above constitution, is a photosensitive material capable of more lastly and more stably form a polymer image having a good contrast and density gradation, and capable of forming an image having a superior brightness and chroma, without being affected by the black color of a silver image.

The photosensitive material of the present invention will be described below in more detail.

The heat-diffusible coloring matter contained in the photosensitive material of the present invention should preferably be a substance that can diffuse or sublimate from the inside of the photosensitive material and transfer to the image-receiving material, at temperatures of not less than 70° C. It may include, for example, monoazo dyes, thiazoleazo dyes, anthraquinone dyes, triallylmethane dyes, rhodamine dyes, naphthol dyes, triallylmethane coloring matters, fluorane coloring matters, and phthalide coloring matters. The heat-diffusible coloring matter has, in general, a greater heat-diffusibility with a decrease in its molecular weight. It also has a smaller heat-diffusibility with an increase in the polar groups as exemplified by a carboxyl group, an amino group, a hydroxyl group, a nitro group and a sulfonic group possessed by a dye. Accordingly, dyes having the desired heat-diffusibility may be appropriately selected depending on cross-link density or heating conditions for the photosensitive material of the present invention, taking into consideration molecular weights and functional groups as a measure. As a measure of selection, preferred are dyes such that a dye transfers to an image-receiving material when a layer of 3 μm thick having the dye content of 25 wt %, which layer is obtained by dissolving in a suitable solvent a binder and a dye which have a glass transition temperature of about 40° C. and coating a polyester film of 12 μm thick with the resulting solution, is laid overlapping on an image-receiving material, left on a hot plate of 70° C. to stand for 20 seconds and then peeled from the image-receiving material.

The heat-diffusible coloring matter may preferably include dyes that diffuse or sublimate by heating, and may particularly preferably include; for example yellow dyes styryl types:

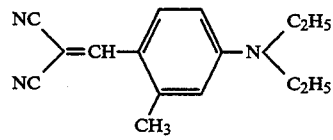

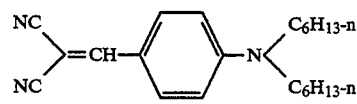

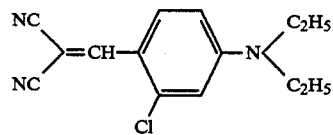

-continued
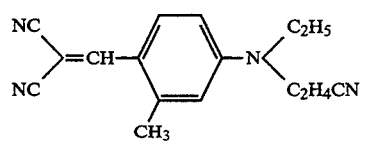
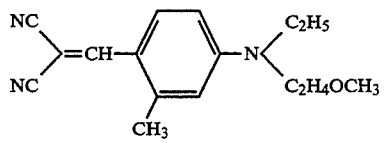
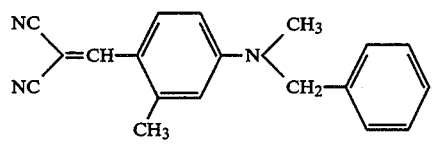
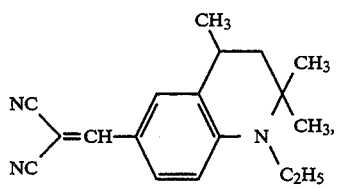
pyridonian types and pyrazoleazo types:
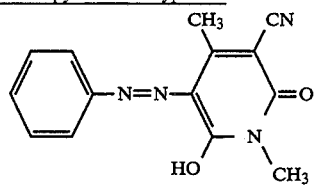
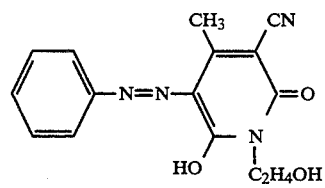
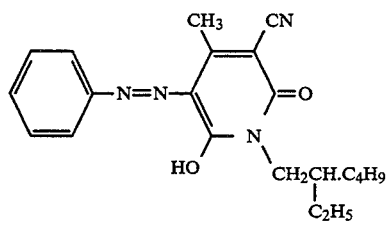
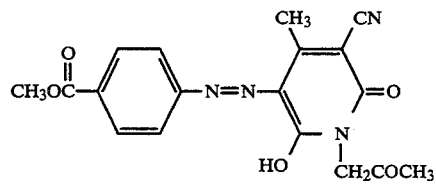
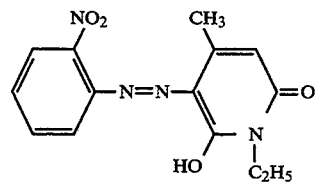
-continued
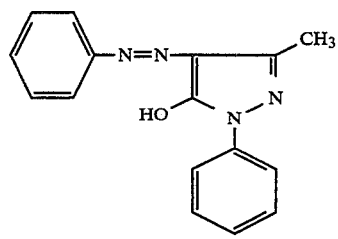
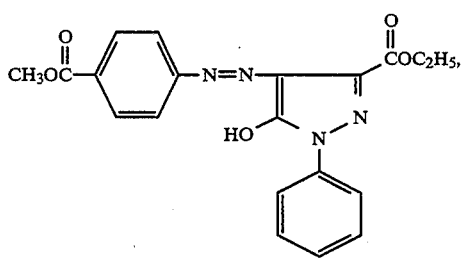
benzeneazo types, quinophthalone types, and anthraisothiazole types;
magenta dyes
anthraquinone types:
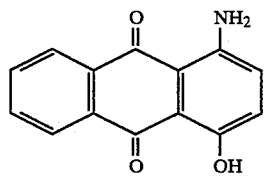
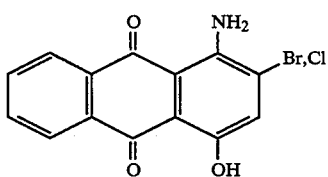
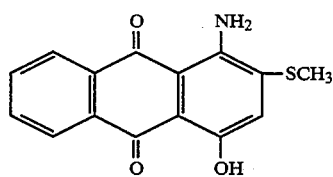
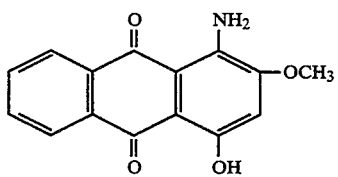
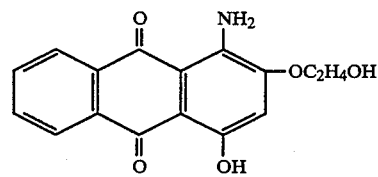

-continued
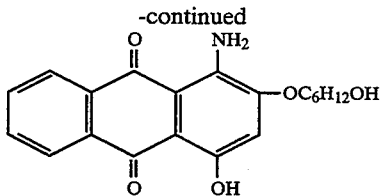
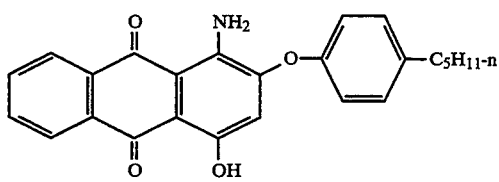
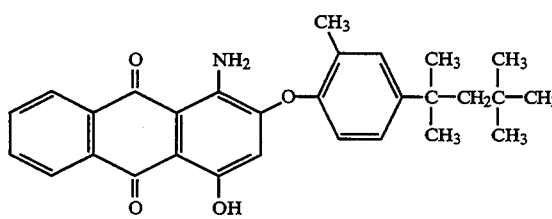
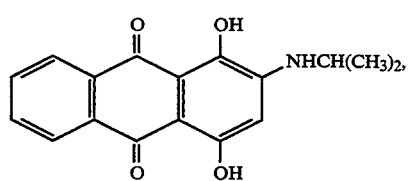
tricyanostyryl types:
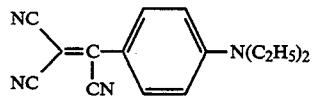
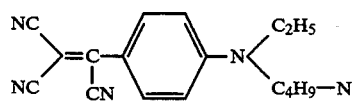
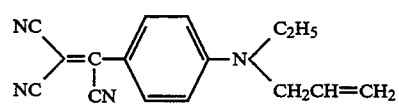
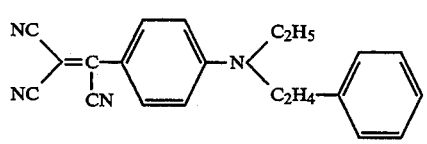
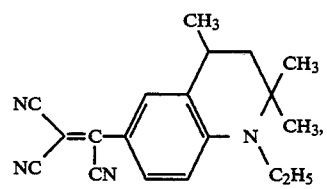
heteroazo types and bezeneazo types:
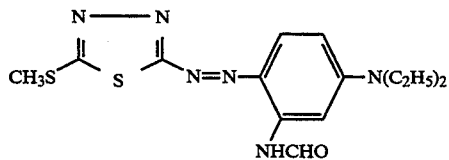
-continued
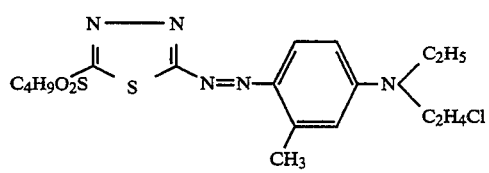
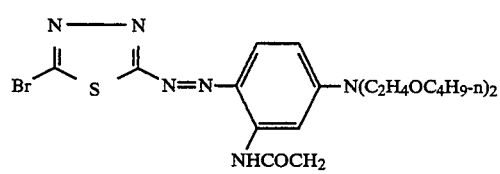
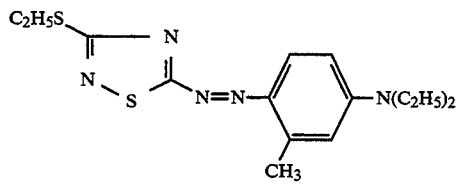
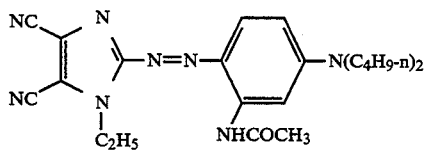
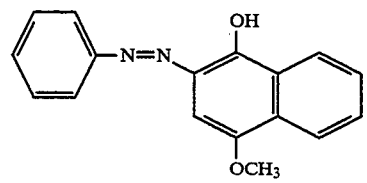
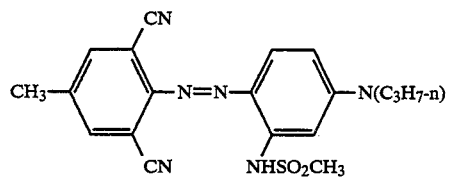
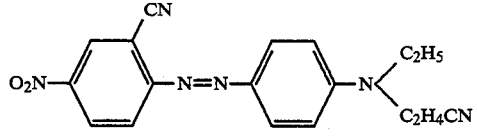
cyan dyes
anthraquinone types:
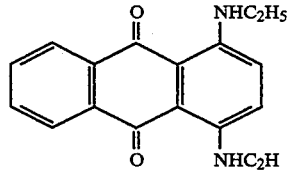
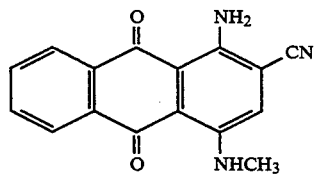

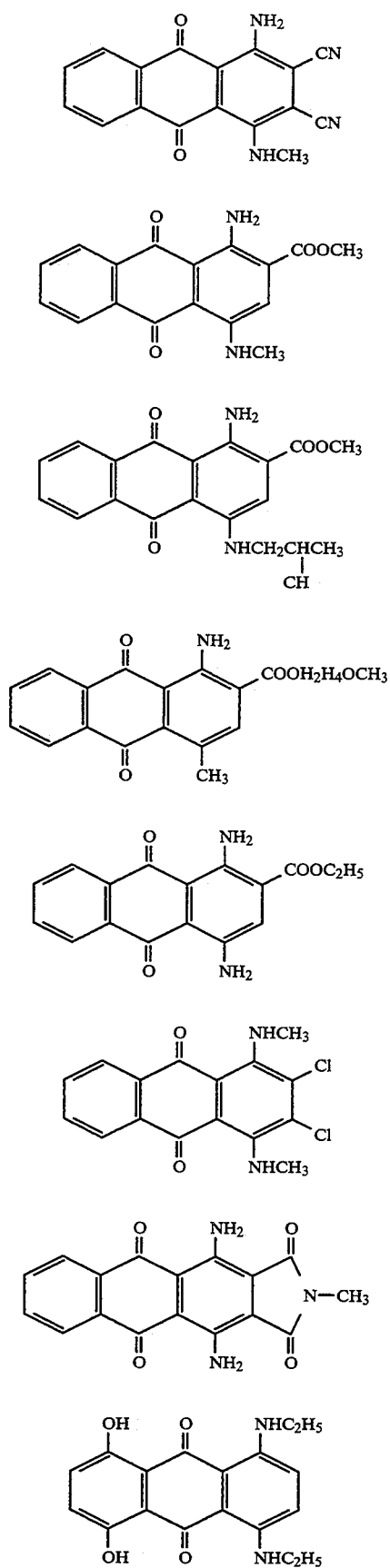
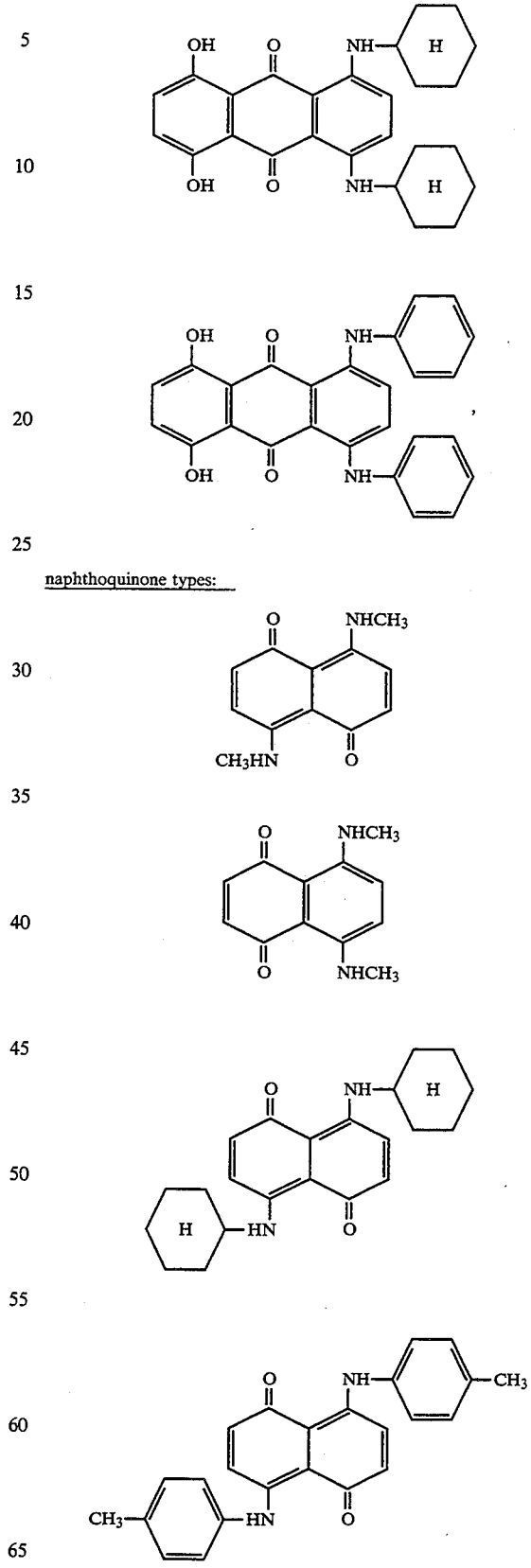
naphthoquinone types:
indoaniline types:

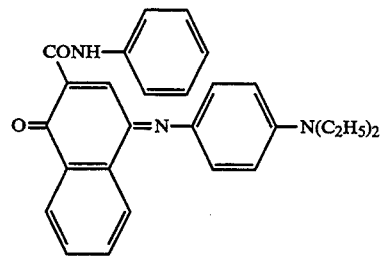
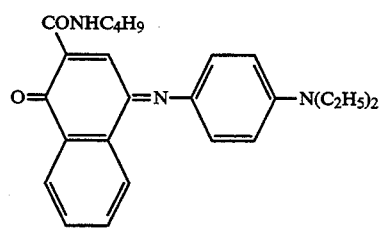
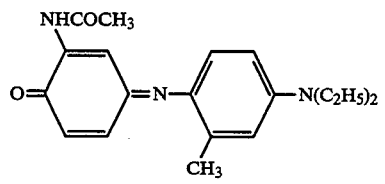
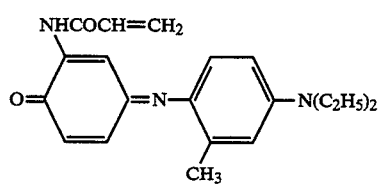
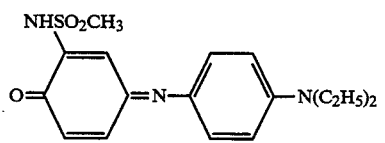
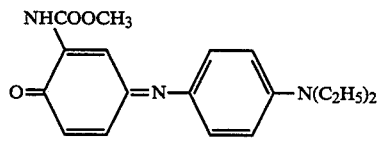
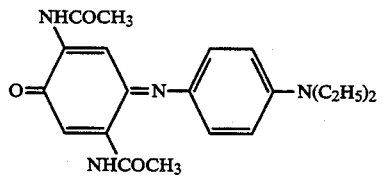
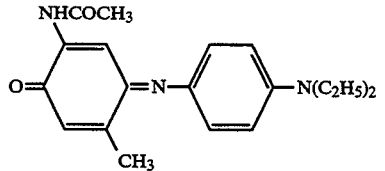
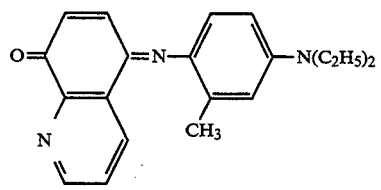
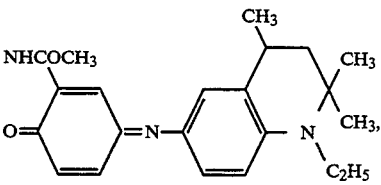
heteroazo types and benzeneazo types:
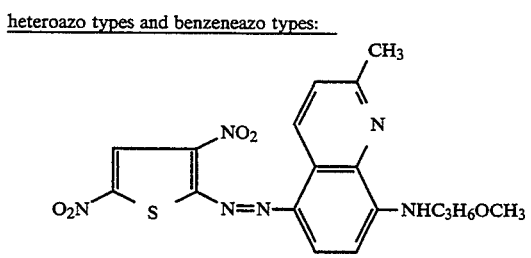
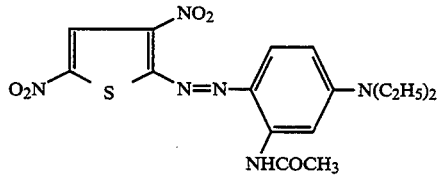
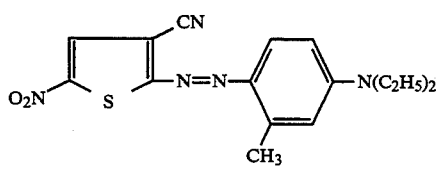
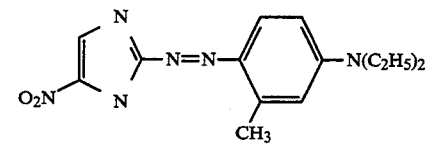
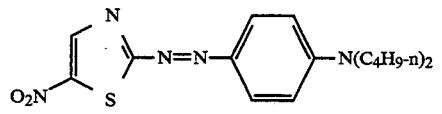
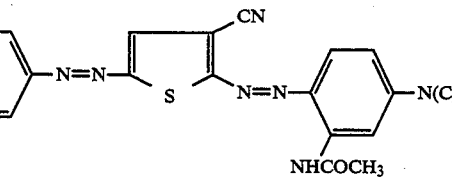
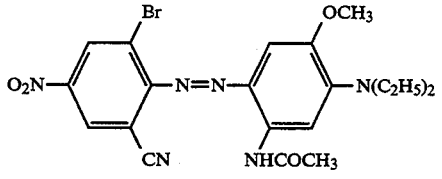

The dyes as described above may be used alone in the respective yellow, magenta and cyan colors, or may be used as a mixture of plural dyes from the viewpoints of tone, sublimation properties and light-resistance.

As a heat-diffusible color-former, there may be used, among color-formers for pressure-sensitive dyes or heat-sensitive dyes, those capable of being diffused by action of thermal energy. The heat-diffusible color-former may be selected similarly to the measure of selection for the heat-diffusible dye, except that an image-receiving paper containing a developer is used. Examples of the heat-diffusible color-formers include triphenylmethane-phthalide type color-former, fluorane type color-formers, phenothiazine type color-formers, indolylphthalide type color-formers, leuco-auramine type color-formers, spiropyrane type color-formers, rhodamine type color-formers, triphenylmethane type color-formers, azaphthalide type color-formers, chlonenoindole type color-formers and triazene type color-formers. Of these color-formers, preferred are:

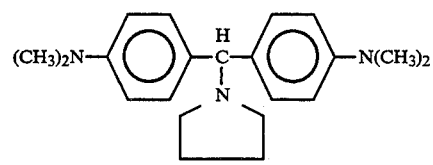

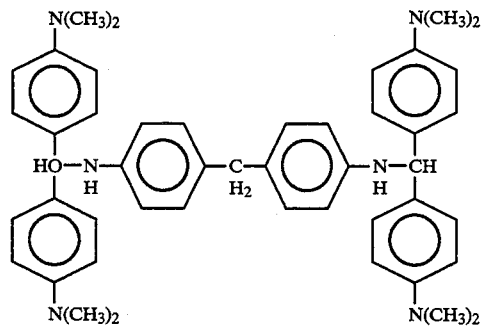

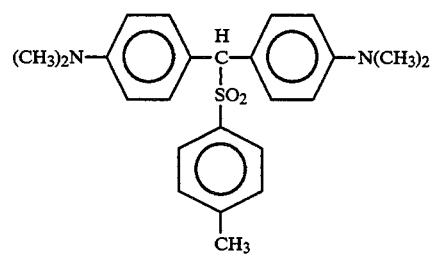

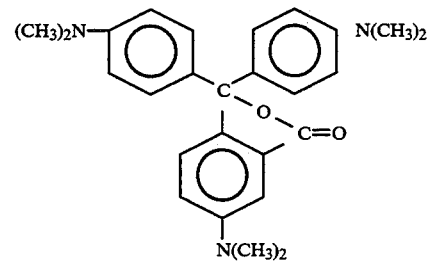

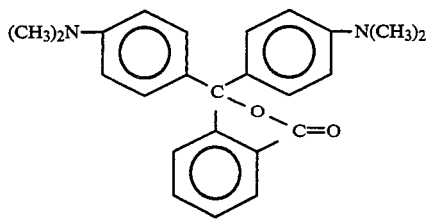

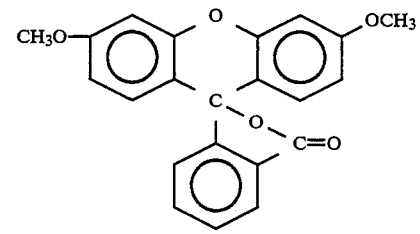

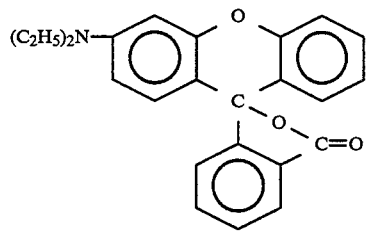

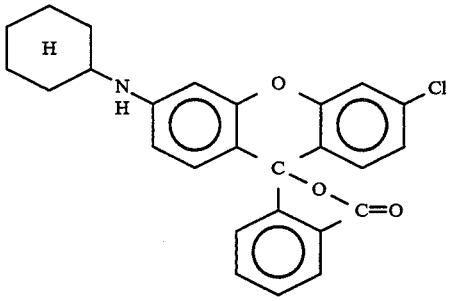

-continued

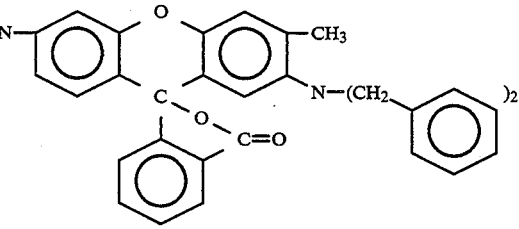

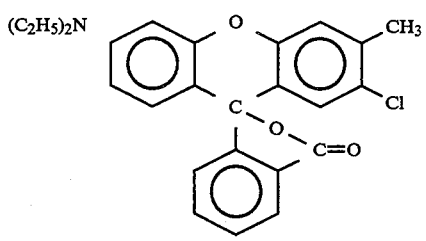

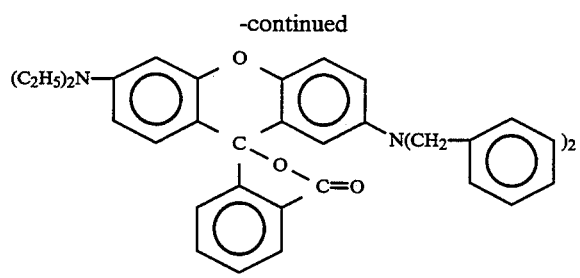
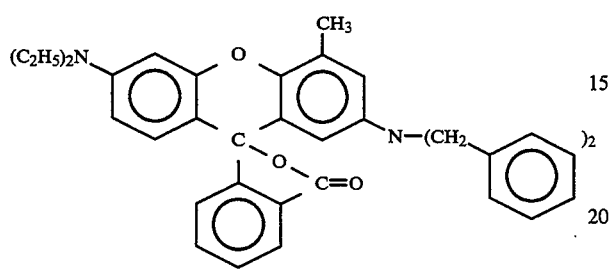
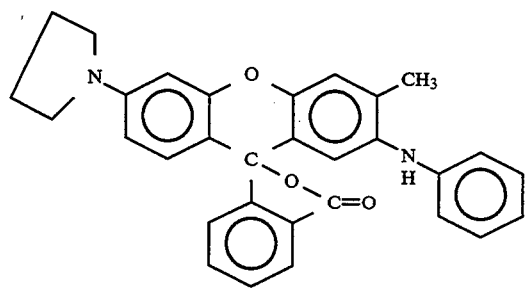
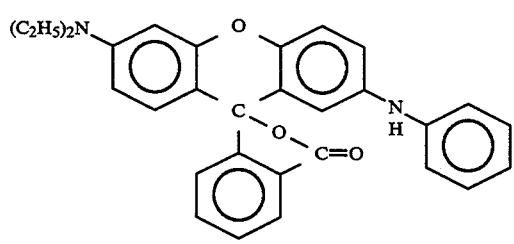
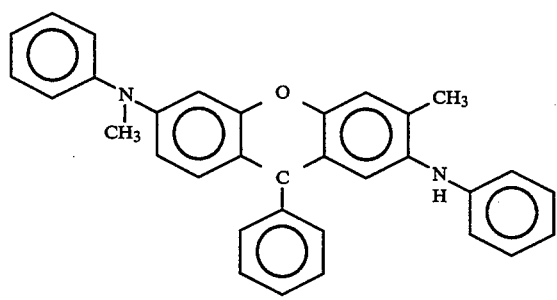
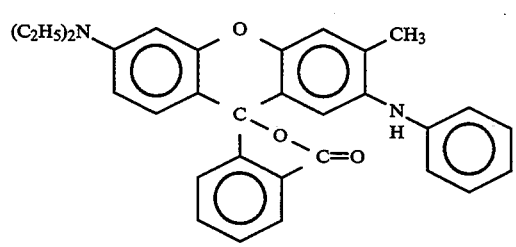
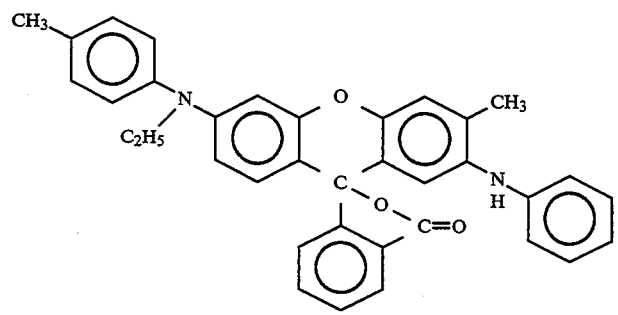
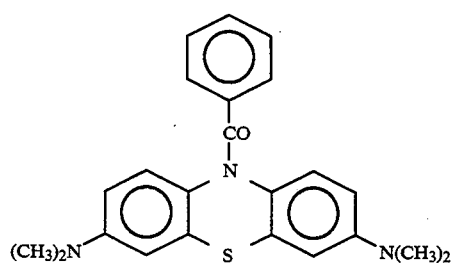
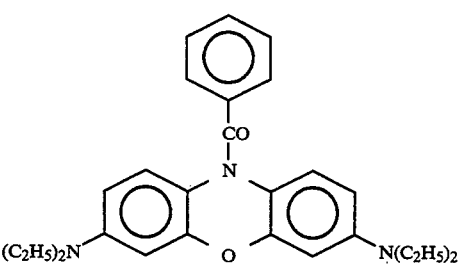
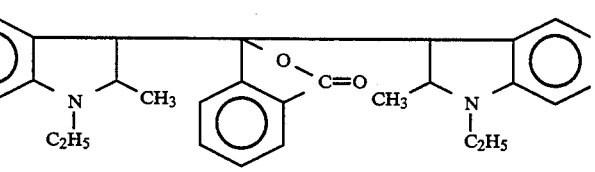
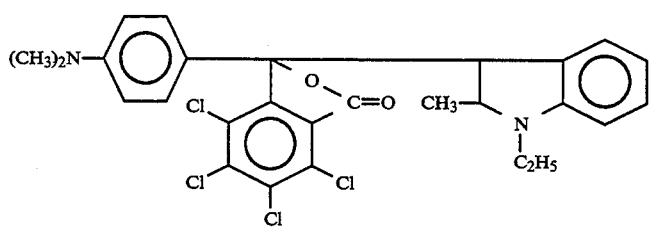
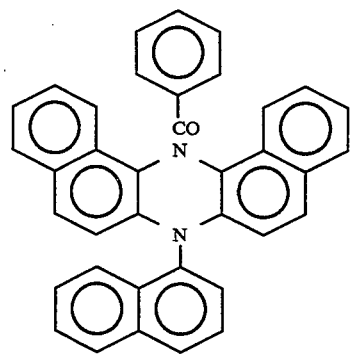

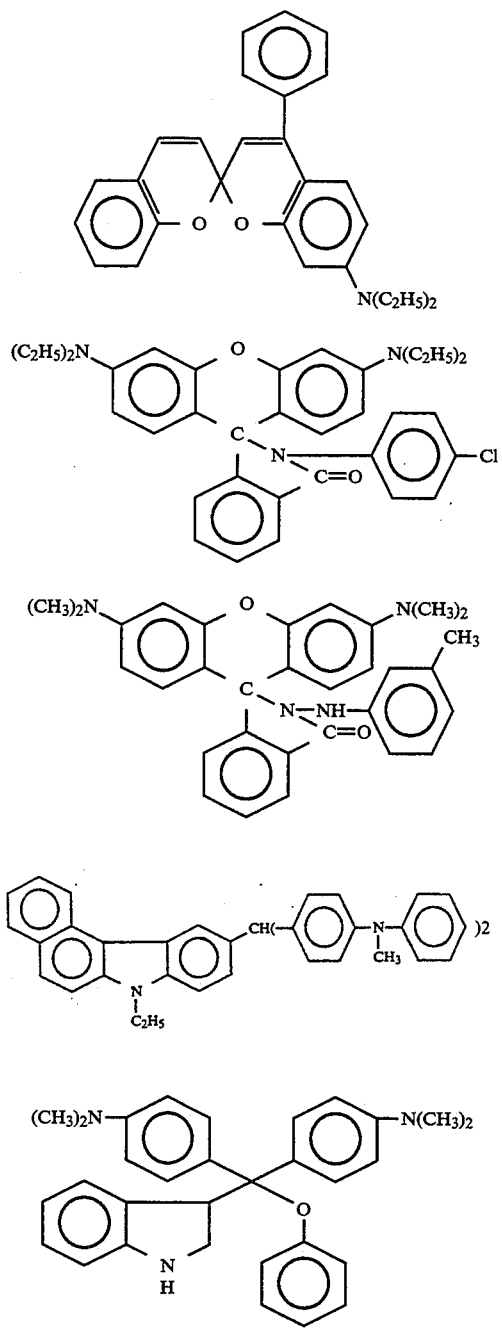

Zinc oxide, calcium sulfate, novolac resins, zinc 3,5-dimethyl-t-butylsalicylate and so forth can be also used as a developer in the image-receiving material, which is used to form a color as a result of its reaction with the heat-diffusible color-former.

The photosensitive silver halide, organic silver salt, reducing agent, polymerizable polymer precursor, and photopolymerization initiator will be described below, which are contained in addition to the above heat-diffusible color-former, in the photosensitive material of the present invention as essential components.

The photosensitive silver halide contained in the photosensitive material of the present invention includes any of silver chloride, silver bromide, silver chlorobromide, silver iodide bromide and silver chloroiodobromide, and may have a multi-layer structure with uniform or different halide composition in a grain. Two or more types of silver halides with different halide composition, grain size, grain size distribution and so forth may also be used in combination. These may also have been spectrally or chemically sensitized owing to a coloring matter or the like.

The organic silver salt contained in the photosensitive material of the present invention includes silver salts of aliphatic carboxylic acids, aromatic carboxylic acids, thiocarbonyl group compounds having a mercapto group or α-hydrogen, and imino group-containing compounds.

The aliphatic carboxylic acids include acetic acid, burytic acid, succinic acid, sebacic acid, adipic acid, oleic acid, linolic acid, lenolenic acid, tartaric acid, palmitic acid, stearic acid, behenic acid and camphor acid. Since, silver salts having a smaller number of carbon atoms are proportionally unstable in general, those having an appropriate number of carbon atoms are preferred.

The aromatic carboxylic acids include benzoic acid derivatives, quinolinic acid derivatives, naphthalene carboxylic acid derivatives, salicylic acid derivatives, gallic acid, tannic acid, phthalic acid, phenyl acetic acid derivatives, and pyromellitic acid.

The compounds having mercapto or α-hydrogen include 3-mercapto-4-phenyl-1,2,4-triazole, 2-mercaptobenzimidazole, 2-mercapto-5-aminothiadiazole, 2-mercaptobenzothiazole, S-alkylthioglycolic acid wherein the alkyl group has a carbon atom number of 12 to 22, dithiocarboxylic acids such as dithioacetic acid, thioamides such as thiostearoamide, and mercapto compounds such as 5-carboxy-1-methyl-2-phenyl-4-thiopyridine, mercaptotriazine, 2-mercaptobenzoxazole, mercaptooxazole, and 3-amino-5-benzylthio-1,2,4-triazole, which are described in U.S. Pat. No. 4,123,274.

The compounds having an imino group typically include benzotriazole or derivatives thereof, described in Japanese Patent Publication No. 44-30270 or No. 45-18416, as exemplified by benzotriazole and alkyl-substituted benzotriazoles such as methylbenzotriazole, halogen-substituted benzotriazoles such as 5-chlorobenzotriazole, carboimidobenzotriazoles such as butylcarboimidobenzotriazole, nitrobenzotriazoles, described in Japanese Patent Application Laid-Open No. 58-118639, sulfobenzotriazole, carboxybenzotriazole or salts thereof, or hydroxybenzotriazole, described in Japanese Patent Application Laid-Open No. 58-115638, 1,2,4-triazole, described in U.S. Pat. No. 4,220,709, or 1H-tetrazole, carbazole, saccharin, imidazole, and derivatives thereof.

As the reducing agent contained in the photosensitive material of the present invention, a reducing agent can be used which is capable of producing a compound having a different polymerization inhibitory power to the polymerizable polymer precursor as described later, upon reaction with the organic silver salt under heating using silver as a catalyst (in the present invention, the compound is generally referred to as "oxidized product"), where aromatic hydroxyl compounds are preferably used.

To describe specifically, they include phenol derivatives as exemplified by hydroquinone, catechol, t-butyl-catechol, chlorohydroquinone, o-cresol, p-cresol, 2-tert-butylphenol, 3-tert-butylphenol, 4-tert-butylphenol, 4-tert-amylphenol, p-benzylphenol,, 5-hydroxyhydroindene, orthoxylenol, 3-butyl-4-isopropylphenol, tetrahydro-β-naphthol, 3,4,5-trimethylphenol, 2,3,5-trimethylphenol, tyramine, tyromine, 2-dimethylaminomethylphenol, 2,6-dihydroxymethylphenol, 2,6-bis(hydroxymethyl)-p-cresol, 6-chloro-m-cresol, 4,6-dichloro-o-cresol, o-acetylphenol, o-hydroxyphenylacetic acid, p-hydroxyphenylacetic acid, p-methoxyphenonl, m-methoxyphenol, resorcinol monoacetate, p-aminophenol, 2,6-dichloro-aminophenol, m-benzylaminophenol, 5-hydroxy-N,N-dimethyl-o-toluidine, m-(p-toluenesulfonamido)phenol, m-hydroxydiphenylamine, 2,2-bis(p-hydroxyphenyl)butane, and bis(p-hydropxyphenyl)methane; resorcinol, and resorcinol derivatives as exemplified by 5-methylresorcinol, 4-hexylresorcinol, 3,5-dihydroxybenzoic acid, 2,6-dihydroxybenzoic acid, 2-nitroresorcinol, fluoroglucinol, 4-cyclohexylresorcinol, 4-benzylresorcinol, 3,5-dihydroxybenzoic acid amide, 2,6-dihydroxybenzoic acid amide, 2-acetylresorcinol, 2-acetylfluoroglucinol, 2,4-6-trihydroxybenzaldehyde, and 4-propynylresorcinol; α-naphtol, β-naphtol, naphthol derivatives as exemplified by 2-acetyl-α-naphthol, 2-(N,N-diethylaminomethyl-α-naphthol, sodium α-naphthol-4-sulfonate, 1,3-naphthalenediol, 2-hydroxy-3-naphthoic hydrazide, potassium α-naphthol-2-sulfonate, 2-hydroxy-l-naphthaldehyde, 1-nitro-2-naphthol, 1,7-naphthalenediol, 2,3-naphthalenediol, 1,7-dihydroxy-6-naphthoic acid, and 2,4-dichloro- 1-naphthol; phenylene diamines as examplified by phenylene diamine, N,N-dimethyl-p-phenylene diamine and tolylene diamines; and pyrazolones or pyrazolidones as exemplified by 3,4-dimethyl-5-pyrazolone, 3-methyl-4-hydroxyethyl-pyrazolone, 4,4-dihydroxymethyl-1-phenyl-3-pyrazolidone and 4-methyl-4-hydroxymethyl-1-phenyl-3-pyrazolidone.

On account of a more improvement in the contrast and density gradation of the image obtained using the photosensitive material of the present invention, however, the reducing agent may particularly preferably comprise at least one of the compounds represented respectively by the following Formulas (I), (II), (III), (IV) and (V). More specifically, the compound represented by the following Formulas (I), (II), (III), (IV) and (V) has the action of producing a polymerization inhibitory power upon oxidation, and is a compound very suited to exhibit a performance, in the photosensitive material of the present invention, that "imagewise unexposed areas undergo polymerization". These can partially generate a polymerization inhibitor in the photosensitive material originally having no polymerization inhibitor, and can stably form a polymer latent image having a sufficient contrast and gradation, even with slight generation of the polymerization inhibitor. Thus, the image finally obtainable, comprised of the heat-diffusible coloring matter, can also have a sufficient contrast and gradation.

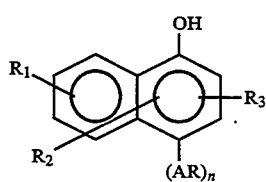
(I)

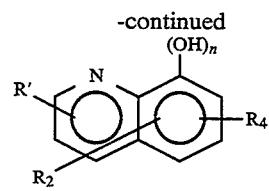
(II)

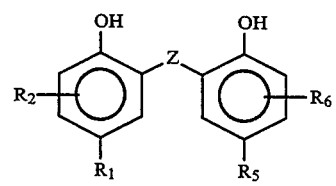
(III)

In the above Formulas (I) to (III), $R^1$, $R^2$, $R^3$, $R^5$ and $R^6$ independently represent a hydrogen atom a halogen atom, a hydroxyl group, a substituted or unsubstituted alkyl group, a substituted or unsubstituted aralkyl group, a substituted or unsubstituted aryl group, an alkoxyl group, or a substituted or unsubstituted cycloalkyl group; $R^4$ represents a hydrogen atom, a halogen atom, a substituted or unsubstituted alkyl group, a substituted or unsubstituted aralkyl group, a substituted or unsubstituted aryl group, a substituted or unsubstituted cycloalkyl group, a carboxyl group, or a carboxylic acid ester group; A represents an oxygen atom, or a sulfur atom; R represents a hydrogen atom, an unsubstituted alkyl group, or a substituted or unsubstituted aralkyl group; n represents 0 or 1; and Z is a divalent linking group and represents an alkylidene group, an aralkylidene group, or a sulfur atom.

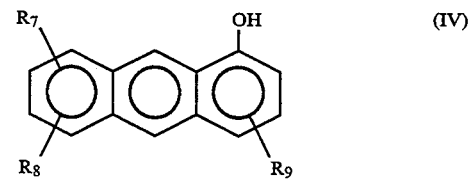
(IV)

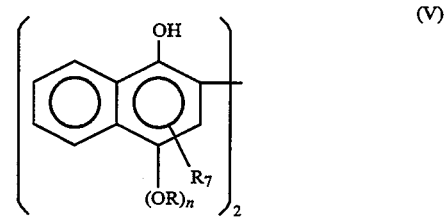
(V)

In the above Formulas (IV) and (V), R represents a hydrogen atom, a substituted or unsubstituted alkyl group or a substituted or unsubstituted aralkyl group; $R^7$ and $R^8$ represent independently a hydrogen atom, a halogen atom, an alkoxy group, a substituted or unsubstituted alkyl group, a substituted or unsubstituted aryl group or a substituted or unsubstituted aralkyl group; $R^9$ represents a hydrogen atom, a hydroxyl group or a substituted or unsubstituted alkyl group; and n is 0 or 1.

The groups represented by $R^1$ to $R^6$ in Formulas (I) to (V) are exemplified below in more detail.

The halogen atom includes a fluorine atom, a chlorine atom, a bromine atom, and an iodine atom.

The substituted or unsubstituted alkyl group includes a straight-chain or branched alkyl group having 1 to 18 carbon atoms, as exemplified preferably by methyl, ethyl, propyl, i-propyl, butyl, t-butyl, i-butyl, amyl, i-amyl, hexyl, texyl, heptyl, octyl, nonyl, dodecyl, stearyl, methoxyethyl, ethoxyethyl, ethoxypropyl, ethoxybutyl, propoxybutyl, i-propoxypentyl, t-butoxyethyl, hexyloxybutyl, hydroxymethyl, hydroxyethyl, hydroxypropyl, hydroxybutyl, hydroxypentyl, hydroxyhexyl, hydroxyheptyl, aminomethyl, dimethylaminomethyl, aminoethyl, dimethylaminoethyl, diethylaminoethyl, morpholinoethyl, piperidinoethyl, aminopropyl, diethylaminopropyl, dipropylaminoethyl, aminobutyl, and morpholinobutyl.

The substituted or unsubstituted aralkyl group includes those having 7 to 19 atoms, as exemplified preferably by benzyl, phenethyl, benzhydryl, trityl, phenylpropyl, naphthylmethyl, chlorobenzyl, dichlorobenzyl, methoxybenzyl, and methylbenzyl.

The substituted or unsubsititued aryl group include those having 6 to 16 carbon atoms, as exemplified preferably by phenyl, naphthyl, anthryl, phenanthryl, tolyl, xylyl, cumenyl, mesityl, chlorophenyl, methoxyphenyl, and fluorophenyl.

The alkoxyl group includes those having 1 to 18 carbon atoms, as exemplified preferably by methoxy, ethoxy, propoxy, i-propoxy, and butoxy.

The substituted or unsubstituted cycloalkyl group includes those having 5 to 18 carbon atoms, as exemplified preferably by cyclopentyl, cyclohexyl, cycloheptyl, cyclooctyl, methylcyclohexyl, dimethylcyclohexyl, and ethylcyclohexyl.

The carboxylic acid ester group includes those having 2 to 10 carbon atoms, as exemplified preferably by methoxycarbonyl, ethoxycarbonyl, and propoxycarbonyl.

The alkylidene group includes those having 1 to 8 carbon atoms, as exemplified preferably by methylidene, ethylidene, butylidene, and hexylidene.

The aralkylidene group includes those having 7 to 18 carbon atoms, as exemplified preferably by benzylidene, naphthylmethylene, p-dimethylaminophenylmethylene, p-hydroxyphenylmethylene, and p-tolylmethylene.

Of the compounds (reducing agents) represented by the above Formulas (I) to (V), specific examples of particularly preferred compounds are set out below, but the reducing agent used in the present invention is by no means limited to these.

Specific examples of the compound represented Formula (I) includes, for example, 1,4-dihydroxynaphthalene, 4-methoxy-1-naphthol, 4-ethoxy- 1-naphthol, 5-methyl-4-methoxy-1-naphthol, 1,5-dihydroxynaphthalene, 4-chloro-1-naphthol, 5-chloro-1-naphthol, 4-methylthio-1-naphthol, 4-ethylthio-1-naphthol, 6-phenyl-4-methyl-1-naphthol, 6-phenyl-4-methoxy-1-naphthol, 6-benzyl-1-naphthol, 6-benzyl-4-methoxy-1-naphthol, 4-methyl-1,7-dihydroxynaphthalene, 4-methoxy-6-benzyl-1-naphthol, 4-methoxy-6-cyclohexyl-1-naphthol, 4-methylthio-6-cyclohexyl-1-naphthol, 3,4-dimethyl-1-naphthol, 4-benzyloxy-1-naphthol, 2-methyl-4-methoxy-1-naphthol, and 5-methyl-4-methoxy-1-naphthol.

Specific examples of the compound represented by Formula (II) includes, for example, 8-hydroxyquinoline, 4,8-dihydroxyquinoline-2-carboxylic acid, 4-hydroxyquinoline-2-carboxylic acid, 4-methyl-8-hydroxyquinoline, 4-benzyl-8-hydroxyquinoline, 4,8-dihydroxy-5-methylquinoline, and 4,8-dihydroxyquinoline.

Specific examples of the compound represented by Formula (III) includes, for example, 2,2'-methylenebis(6-t-butyl-1,4-dihydroxybenzene), 2,2'-methylenebis(4-methoxyphenol), 2,2'-methylenebis(4,6-di-t-butylphenol), 2,2'-methylenebis(4-methyl-6-t-butylphenol), 2,2'-butylidenebis(4-methoxyphenol), 2,2'-butylidenebis(6-t-butyl-1,4-dihydroxybenzene), 2,2'-thiobis(4-methoxyphenol), 2,2'-thiobis(6-methyl-1,4-dihydroxybenzene), 2,2'-thiobis(4,6-di-t-butylphenol), bis(2-hydroxy-5-methylphenyl) phenylmethane, (3-t-butyl-5-methyl-2-hydroxyphenyl)-(5-methoxy-2-hydroxyphenyl)methane and 1,1'-dihydroxy-2,2'-binaphthyl, and 4,4'-dimethoxy-1,1'-bihydroxy-2,2'-binaphthyl.

Specific examples of the compound represented by Formula (IV) includes, for example, 1-methoxy-5-hydroxyanthracene, 1-ethoxy-5-hydroxyanthracene, 1-methoxy-4-methyl-5-hydroxyanthracene, and 1-methoxy-4,8-dimethyl-5-hydroxyanthracene.

Specific examples of the compound represented by Formula (V) includes, for example, 2,2'-methylenebis(4-methoxyphenol), 2,2'-methylenebis(4-ethoxyphenol), 2,2'-methylenebis(4-methylphenol), and 2,2'-methylenebis(4-ethylphenol).

As a polymerizable polymer precursor contained in the photosensitive material of the present invention, a compound having at least one reactive vinyl group in its molecule can be utilized.

The reactive vinyl group in these compounds includes substituted or unsubstituted vinyl groups having polymerization reactivity, as exemplified by styrene type vinyl groups, acrylic acid type vinyl groups, methacrylic acid type vinyl groups, allyl type vinyl groups, and vinyl ethers, as well as ester type vinyl groups such as vinyl acetate.

Specific examples of the polymerizable polymer precursor satisfying such conditions are as follows.

They may include monovalent monomers as exemplified by styrene, methylstyrene, chlorostyrene, bromostyrene, methoxystyrene, dimethylaminostyrene, cyanostyrene, nitrostyrene, hydroxystyrene, aminostyrene, carboxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole, 2-vinylimidazole, N-methyl-2-vinylimidazole, propyl vinyl ether, butyl vinyl ether, isobutyl vinyl ether, β-chloroethyl vinyl ether, phenyl vinyl ether, p-methylphenyl vinyl ether, and p-chlorophenyl vinyl ether; divalent monomers as exemplified by divinylbenzene, distyryl oxalate, distyryl malonate, distyryl succinate, distyryl glutarate, distyryl adipate, distyryl maleate, distyryl fumarate, distyryl β,β'-dimethylglutarate, distyryl 2-bromoglutarate, distyryl α,α'-dichloroglutarate, distyryl terephthalate, oxalic acid di(ethyl acrylate), oxalic acid di(methyl ethyl acrylate) , malonic acid di (ethyl acrylate), malonic acid di(methyl ethyl acrylate), succinic acid di(ethyl acrylate), glutaric acid di(ethyl acrylate), adipic acid di(ethyl acrylate) , maleic acid di(ethyl acrylate), fumaric acid di(ethyl acrylate), β,β'-dimethylglutaric acid di(ethyl acrylate), ethylenediacrylamide, propylenediacrylamide, 1,4-phenylenediacrylamide, 1,4-phenylenebis(oxyethyl acrylate), 1,4-phenylenebis(oxymethyl ethyl acrylate), 1,4-bis(acryloyloxyethoxy)cyclohexane, 1,4-bis(acryloyloxymethylethoxy)cyclohexane, 1,4-bis(acryloyloxyethoxycarbamoyl)benzene, 1,4-bis(acryloyloxymethylethoxycarbamoyl)benzene, 1,4-bis(acryloyloxyethoxycarbamoyl)cyclohexane, bis(acryloyloxyethoxycarbamoylcyclohexyl)methane, oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(ethyl methacrylate), fumaric acid di(methyl ethyl methacrylate), $\beta,\beta'$-dimethylglutaric acid di(ethyl methacrylate), 1,4-phenylenebis(oxyethyl methacrylate), and 1.4-bis(methacryloyloxyethoxy)cyclohexane, acryloyloxyethoxyethyl vinyl ether; trivalent monomers as exemplified by pentaerythritol triacrylate, pentaerythritol trimethacrylate, pentaerythritol tri(hydroxystyrene), cyanuric acid triacrylate, cyanuric acid trimethacrylate, 1,1,1-trimethylolpropane triacrylate, 1,1,1-trimethylolpropane trimethacrylate, 1,1,1-trimethylolpropane tri(ethyl acrylate), a condensate of a reaction product between 1,1,1-trimethylolpropane and three-fold mols of toluenediisocyanate with hydroxyethyl acrylate, and a condensate of a reaction product between 1,1,1-trimethylolpropane and three-fold mols of hexanediisocyanate with p-hydroxystyrene; and tetravalent monomers as exemplified by ethylenetetraacrylamide and propylenetetraacrylamide.

As previously mentioned, two or more of these polymerizable polymer precursors may be used in combination.

As a polymerization initiator contained in the photosensitive material, a photopolymerization initiator may be used.

The photopolymerization initiator includes, for example, carbonyl compounds, sulfur compounds, halogen compounds, and photopolymerization initiators of a redox type.

Specifically, the carbonyl compounds include diketones as exemplified by benzyl, 4,4'-dimethoxybenzyl, diacetyl, and camphorquinone; benzophenones as exemplified by 4,4'-diethylaminobenzophenone, and 4,4'-dimethylbenzophenone; acetophenones as exemplified by acetophenone, 4-methoxyacetophenone; benzoin alkyl ethers; thioxanthones as exemplified by 2-chlorothioxanthone, 2,5-diethylthioxanthone, and thioxanthone-3-carboxylic acid $\beta$-methoxy ethyl ester; chalcones and styrylketones having a dialkylamino group; and cumarines as exemplified by 3,3'-carbonylbis(7-methoxycumarin), and 3,3'-carbonylbis(7-diethylaminocumarin).

The sulfur compounds include disulfides as exemplified by dibenzothiazolyl sulfide, decylphenyl sulfide and disulfides.

The halogen compounds include, for example, carbon tetrabromide, quinolinesulfonyl chloride, and Striazines having a trihalomethyl group.

The photopolymerization initiators of a redox type include those used a trivalent iron ionic compound (as exemplified by ferric ammonium citrate) and a peroxide in combination, and those used in combination a photoreducing coloring matter such as riboflavin or Methylene Blue and a reducing agent such as triethanolamine or ascorbic acid.

In the photopolymerization initiator described above, two or more compounds can also be used in combination to obtain a more efficient photopolymerization reaction.

Such combination of the photopolymerization initiators includes a combination of chalcones having a dialkylamino group and styrylketones or cumarins, with S-triazines having a trihalomethyl group or camphorquinone.

Two or more of these photopolymerization initiators may also be used in combination, may be heated to accelerate the polymerization, or may be used with mixture of a thermopolymerization initiator.

The photosensitive silver halide, organic silver salt, reducing agent, polymerizable polymer precursor, photopolymerization initiator and heat-diffusible coloring matter described above must be contained in the photosensitive material of the present invention as essential components.

When the photosensitive material of the present invention is formed in a layer structure such as a single layer or multiple layers, the above essential components are dissolved in a solvent together with a binder appropriately used, and the resulting solution is applied to a support, followed by drying. Alternatively, if the binder itself can maintain strength, the above essential components may be incorporated in a film-like or sheet-like material formed of the binder to form the layer structure without use of a support. In forming the photosensitive material of the present invention into a desired form, it may be of any form including a flat sheet, a cylinder, a roll and so forth, without any particular limitations. Moreover, when a layer structure is taken, the layer may also be constituted of one layer, or, if necessary, multiple layers as will be described later.

Suitable binders used in the present invention can be selected from a wide range of resins.

They specifically include cellulose esters as exemplified by nitrocellulose, cellulose phosphate, cellulose sulfate, cellulose acetate, cellulose propionate, cellulose butyrate, cellulose myrystate, cellulose palmirate, cellulose acetate propionate, and cellulose acetate butyrate, cellulose esters as exemplified by methyl cellulose, ethyl cellulose, propyl cellulose, and butyl cellulose; vinyl resins as exemplified by polystyrene, polyvinyl chloride, polyvinyl acetate, polyvinyl butyral, polyvinyl acetal, polyvinyl alcohol, and polyvinyl pyrrolidone; copolymer resins as exemplified by a styrene/butadiene copolymer, a styrene/acrylonitrile copolymer, a styrene/butadiene/acrylonitrile copolymer, and a vinyl chloride/vinyl acetate copolymer; acrylic resins as exemplified by polymethyl methacrylate, polymethyl acrylate, polybutyl acrylate, polyacrylic acid, polymethacrylic acid, polyacrylamide, and polyacrylonitrile; polyesters as exemplified by polyethylene terephthalate; polyarylate resins as exemplified by poly(4,4'-isopropylidenediphenylene-co-1,4-cyclohexylenedimethylene carbonate), poly(ethylenedioxy-3,3'-phenylene thiocarbonate), poly(4,4'-isopropylidenediphenylene carbonate-co-terephthalate), poly(4,4'-isopropylidenediphenylene carbonate), poly(4,4'-sec-butylidenediphenylene carbonate), and poly(4,4'-isopropylidenediphenylene carbonate-block-oxyethylene); polyamides; polyimides; epoxy resins; phenol resins; polyolefins as exemplified by polyethylene, polypropylene, and chlorinated polyethylene; and natural polymers such as gelatin.

In the photosensitive material of the present invention, the binder is not an essential component. It may not necessarily be contained when film properties, dispersibility, sensitivity and so forth of the photosensitive material can be sufficiently attained.

Besides these, coloring materials, antifogging agents, light color-change preventive agents, solid solvents, surface active agents, and antistatic agents may also be optionally added in the photosensitive material of the present invention.

Supports 3 that can be used in the present invention are those made of metals such as aluminum and cupper; plastic films such as polyester films, polyimide films, aromatic polyamide films, polycarbonate films, polysulfone films, polyphenylelensulfite films, polyether imide films, and fluororesin films; coated papers, synthetic papers, and so forth.

The layer constitution the above photosensitive material of the present invention has will be described below.

A first embodiment of the layer constitution which the photosensitive material of the present invention has is a photosensitive material comprising a photosensitive layer containing the photosensitive silver halide, organic silver salt, reducing agent, polymerizable polymer precursor, photopolymerization initiator, and heat-diffusible coloring matter, described above, which are the essential components of the photosensitive material of the present invention (hereinafter "the photosensitive material (A)" of the present invention).

Namely, the photosensitive material (A) is a photosensitive material characterized by containing the above essential components in the same layer.

Figure 1B:
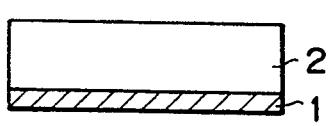
Figure 1C:
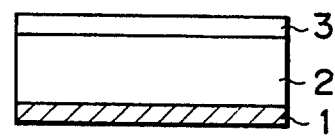

When a photosensitive layer 2 of the photosensitive material (A) is formed to have the desired layer structure as illustrated in FIGS. 1A to 1C, the above essential components are dissolved in a solvent together with a binder appropriately used, and the resulting solution is applied to a support 1, followed by drying (FIG. 1B). Alternatively, if the binder itself can maintain strength, the above essential components are incorporated in a film-like or sheet-like material formed of the binder without use of the support to form the layer structure (FIG. 1A). In forming the photosensitive material (A) into the desired form, it may be of any form including a flat sheet, a cylinder, a roll and so forth, without any particular limitations. Moreover, when the layer structure is taken, the layer may also be constituted of one layer, or, if necessary, multiple layers. The photosensitive layer of the photosensitive material (A), however, may be preferably formed so as to have a thickness of from 0.1 $\mu$m to 2 mm, and preferably from 1 $\mu$m to 0.1 mm.

In the photosensitive material (A), a support is not essential as previously described, but, in the instance where it has the support, it may be made to have a thickness of from 2 $\mu$m to 2 mm, preferably from 3 $\mu$m to 1 mm, and may be of any form including a flat sheet, a cylinder, a roll and so forth without any particular limitations, although its form is fitted with the form of the above photosensitive layer.

For the purpose of preventing polymerization from being inhibited by oxygen at the time of polymerization, a protective layer 3 (for example, comprising polyvinyl alcohol, polyvinyl fluoride or polyester) may also be provided on the photosensitive layer 2 of the photosensitive material (A), formed to have the desired form (FIG. 1C). The support 1 as shown in FIGS. 1B and 1C may also concurrently have the function possessed by such a protective layer. Herein, the above protective layer may have a thickness of from 0.1 $\mu$m to 200 $\mu$m, and preferably from 0.2 $\mu$m to 30 $\mu$m, and also may be of any form without any particular limitations, although its form is fitted with the form of the above photosensitive layer Suitable binders used in the photosensitive material (A) of the present invention can be selected from a wide range of resins, as previously described.

In the photosensitive material (A), the binder is not an essential component. It may not necessarily be contained when film properties, dispersibility, sensitivity and so forth of the photosensitive layer in the photosensitive material (A) can be sufficiently attained.

Besides these, coloring materials, antifogging agents, light color-chang preventive agents, solid solvents, surface active agents, and antistatic agents may also be optionally added in the photosensitive material (A).

In the photosensitive material (A), the above components may preferably be used in the following mixing ratios.

The silver halide should preferably be contained in an amount of from 0.001 mol to 2 mols, more preferably from 0.05 mol to 1 mol, per mol of the organic silver salt. The reducing agent should preferably be contained in an amount of from 0.2 mol to 3 mols, more preferably from 0.5 mol to 2 mols, per mol of the organic silver salt. The photopolymerization initiator should preferably be contained in an amount of from 0.01 mol to 10 mols, more preferably from 0.5 mol to 5 mols, per mol of the reducing agent. The photopolymerization initiator should also preferably be used in an amount of from 0.1 to 50 parts by weight, more preferably from 0.5 to 30 parts by weight, based on 100 parts by weight of the polymerizable polymer precursor.

The heat-diffusible coloring matter may preferably be contained in an amount of from 3 to 200 parts by weight, more preferably from 5 to 100 parts by weight, based on 100 parts by weight of the total sum of the silver halide, organic silver salt, reducing agent, polymerizable polymer precursor, photopolymerization initiator, and binder optionally contained.

A second embodiment of the layer constitution which the photosensitive material of the present invention has is a photosensitive material comprising a photosensitive layer containing the photosensitive silver halide, organic silver salt and reducing agent, which are the essential components of the photosensitive material of the present invention, and a polymerizing layer containing the polymerizable polymer precursor, photopolymerization initiator and heat-diffusible coloring matter, which also are the essential components (hereinafter "the photosensitive material (B)" of the present invention).

Namely, the photosensitive material (B) is characterized by the above photosensitive layer and the above polymerizing layer which are functionally separated.

Figure 2A:
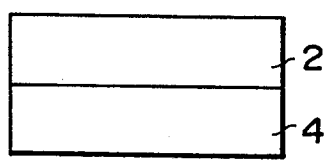
Figure 2B:
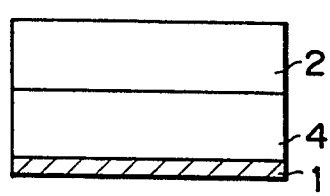
Figure 2C:
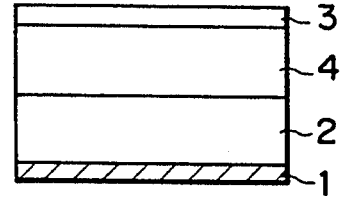

As illustrated in FIGS. 2A to 2C, the photosensitive layer of the photosensitive material (B) may be formed by dissolving the above essential components in water or solvents together with a binder appropriately used, and applying the resulting solutions to a support 1 shown in FIG. 2B, followed by drying. Alternatively, if the binder itself can maintain strength, the above essential components may also be incorporated in a film-like or sheet-like material formed of the binder without use of the support to form the layer structure, as shown in FIG. 2A.

There are no particular limitations on the order of laminating the photosensitive layer 2 and polymerizing layer 4 on the support 1.

The photosensitive layer and polymerizing layer each may have a film thickness of preferably from 0.1 $\mu$m to 2 mm, more preferably from 1 $\mu$m to 0.1

The photosensitive layer 1 may also contain antifogging agents, surface active agents, photographic sensitizers, stabilizers, thickening agents, antistatic agents, plasticizers, and alkali-generating agents. It may be of any form including a flat sheet, a cylinder, a roll and so forth, without any particular limitations.

In the photosensitive layer, the above components may preferably be used in the mixing ratios described below.

The silver halide should preferably be contained in an amount of from 0.001 mol to 2 mols, more preferably from 0.05 mol to 1 mol, per mol of the organic silver salt. The reducing agent should preferably be contained in an amount of from 0.2 mol to 3.0 mols, more preferably from 0.5 mol to 2.0 mols, per mol of the organic silver salt.

The polymerizing layer may also optionally contain polymerization inhibitors, surface active agents, binders and so forth for the purpose of improving the storage stability of the polymerizing layer.

With regard to the composition of the polymerizing layer, the photopolymerization initiator should preferably be contained in an amount of from 0.1 to 50 parts by weight, more preferably from 0.5 to 30 parts by weight, based on 100 parts by weight of the polymerizable polymer precursor.

The heat-diffusible coloring matter may preferably be contained in an amount of from 3 to 200 parts by weight, more preferably from 5 to 100 parts by weight, based on 100 parts by weight of the total sum of the polymerizable polymer precursor, photopolymerization initiator, and binder optionally contained.

In the photosensitive material (B), a support is not essential as previously described, but, in the instance where it has the support, it may be made to have a thickness of preferably from 2 $\mu$m to 2 mm, more preferably from 3 $\mu$m to 1 mm, and may be of any form including a flat sheet, a cylinder, a roll and so forth without any particular limitations, although its form is fitted with the form of the above photosensitive layer.

For the purpose of preventing polymerization from being inhibited by oxygen at the time of polymerization, a protective layer 3 (for example, comprising polyvinyl alcohol, polyvinyl fluoride or polyester) may also be provided on the photosensitive layer 2 of the photosensitive material (B) of the present invention, formed to have the desired form (FIG. 2C). The support 1 as shown in FIGS. 2B and 2C may also concurrently have the function possessed by such a protective layer. Herein, the above protective layer may have a thickness of from 0.1 $\mu$m to 200 $\mu$m, preferably from 0.2 $\mu$m to 10 $\mu$m, and also may be of any form without any particular limitations, although its form is fitted with the form of the above photosensitive layer.

Suitable binders used in the photosensitive material (B) can be selected from a wide range of resins, as previously described.

In the photosensitive material (B), as will be described later, the reducing agent previously described, contained in the the photosensitive layer, is oxidized upon oxidation-reduction reaction, and at least the reducing agent thus oxidized (hereinafter "oxidized product") is moved from the photosensitive layer to the polymerizing layer, whereupon the polymerizing layer is area-selectively polymerized and thus a polymerized image can be formed. For this reason, the photosensitive layer and polymerizing layer may preferably be directly laminated. If, however, it is possible for the oxidized product to move between the layers, these layers may not necessarily be directly laminated. In other words, there may be provided between the layers a layer (a layer-peeling layer) for improving layer-peeling of a film substrate. It is more preferred if the layer-peeling layer is an anti-halation layer.

In the photosensitive material (B) in which the photosensitive layer and polymerizing layer are separated, the respective layers can be readily designed. This brings about the advantages, for example, that the speed of diffusion of the heat-diffusible coloring matter and the speed of thermal development in the photosensitive layer can be controlled with greater ease.

A third embodiment of the layer constitution which the photosensitive material of the present invention has is a photosensitive material comprising a photosensitive layer containing the photosensitive silver halide, organic silver salt, reducing agent, polymerizable polymer precursor and photopolymerization initiator, which are the essential components as previously described and a coloring material layer containing the heat-diffusible coloring matter, which also is the essential component (herein after "the photosensitive material (C)" of the present invention).

Namely, the photosensitive material (C) is characterized by the above photosensitive layer and the above polymerizing layer which are functionally separated.

Figure 3C:
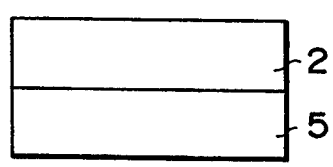
Figure 3B:
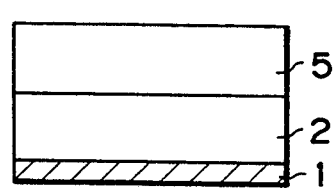

As illustrated in FIGS. 3A to 3C, the photosensitive material (C) can be obtained by dissolving the above essential components in solvents together with a binder appropriately used, and applying the resulting solutions to a support 1 shown in FIG. 3B to provide the layers of the coloring material layer 5 and photosensitive layer 2, respectively followed by drying. Alternatively, if the binder itself can maintain strength, the above essential components each may also be incorporated in a film-like or sheet-like material formed of the binder to form the corresponding layer without use of the support 1 as shown in FIG. 3A, and then the coloring material layer and photosensitive layer 2 may be laminated. The coloring material layer 5 and photosensitive layer 2 may also be provided by separately coating them on supports 1 and then the coloring material layer 5 and photosensitive layer 2 may be laminated.

The photosensitive material (C) may be of any form including a flat sheet, a cylinder, a roll and so forth, without any particular limitations. When the layer structure is taken, the photosensitive layer and coloring material layer each may preferably be formed so as to have a thickness of preferably from 1Nm to 2 mm, more preferably from 1 $\mu$m to 0.1 mm, in approximation.

In the photosensitive material (C), a support is not essential as previously described, but, in the instance where it has the support, it may be made to have a thickness of preferably from 2 $\mu$m to 2 mm, more preferably from 3 $\mu$m to 1 mm, and may be of any form including a flat sheet, a cylinder, a roll and so forth without any particular limitations, although its form is fitted with the form of the above photosensitive layer and coloring material layer.

There are no particular limitations on the order of laminating the photosensitive layer 2 and coloring material layer 5 provided on the support 1. The photosensitive layer 2 and coloring material layer 5 of the present photosensitive material (C) may preferably be directly laminated.

A primer layer for imparting adhesion may also be provided between the support and coloring material layer.

For the purpose of preventing polymerization from being inhibited by oxygen at the time of polymerization, a layer comprising polyvinyl alcohol, polyvinyl fluoride, polyester or the like may be provided as a protective layer on the photosensitive layer. A film made of any of these layers may also be laminated on the photosensitive layer. The support 1 as shown in FIGS. 3B and 3C may also concurrently have the function possessed by such a protective layer. Herein, the above protective layer may have a thickness of from 0.1 μm to 200 μm, preferably from 0.2 μm to 30 μm, and also may be of any form without any particular limitations, although its form is fitted with the form of the above photosensitive layer.

In the photosensitive layer of the photosensitive material (C), the above components may preferably be used in the mixing ratios described below.

The silver halide should preferably be contained in an amount of from 0.001 tool to 2 mols, more preferably from 0.05 mol to 1 mol, per mol of the organic silver salt. The reducing agent should preferably be contained in an amount of from 0.2 mols to 3.0 mols, more preferably from 0.5 mol to 2.0 mols, per mol of the organic silver salt. The photopolymerization initiator should preferably be contained in an amount of from 0.01 mol to 10 mols, more preferably from 0.5 mol to 5 mols, per mol of the reducing agent. The photopolymerization initiator should also preferably be used in an amount of from 0.1 to 50 parts by weight, more preferably from 0.5 to 30 parts by weight, based on 100 parts by weight of the polymerizable polymer precursor.

Besides these, antifogging agents, light color-change preventive agents, solid solvents, surface active agents, antistatic agents, binder and so forth may also be optionally added in the photosensitive layer.

The coloring material layer of the photosensitive material (C) may preferably contain, in addition to the above heat-diffusible coloring matter, a binder that keeps the coloring matter in a layer form.

The heat-diffusible coloring matter in the coloring material layer of the photosensitive material (C) may be contained in an amount of preferably from 3 to 200 parts by weight, more preferably from 5 to 100 parts by weight, based on 100 parts by weight of the binder.

As a binder to be used, a binder having a low glass transition temperature (Tg) is preferably used, because it has release the heat-diffusible coloring matter at a lower temperature. Besides this, plasticizers, surface active agents, adhesion-imparting agents, antistatic agents and so forth can also be optionally added.

Suitable binders used in the photosensitive material (C) can be selected from a wide range of resins previously described.

The photosensitive material (C), in which the photosensitive layer and coloring material layer are separated, has a advantage that, in forming a multi-color image, the common photosensitive layer can be used with respect to yellow, magenta and cyan coloring material layers in the case of subtractive color mixing.

A fourth embodiment of the layer constitution which the photosensitive material of the present invention has is a photosensitive material comprising a photosensitive layer containing the photosensitive silver halide, organic silver salt, reducing agent, polymerizable polymer precursor and photopolymerization initiator, which are the essential components previously described, and a coloring material layer containing the polymerizable polymer precursor, photopolymerization initiator and heat-diffusible coloring matter, which also are the essential components (hereinafter "the photosensitive material (D)" of the present invention).

Figure 3C:
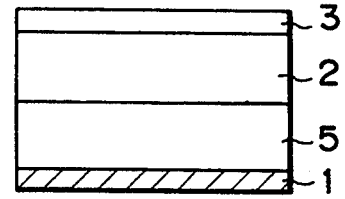

Namely, the photosensitive material (D) is characterized by further incorporating the polymerizable polymer precursor and photopolymerization initiator in the coloring material layer 5 shown in FIG. 3, of the photosensitive material (C) described above.

Thus, the photosensitive material (D) has the same as the photosensitive material (C) except the mixing ratios of the above essential components contained in the coloring material layer thereof.

In the coloring material layer, the photopolymerization initiator should preferably be used in an amount of from 0.1 to 50 parts by weight, more preferably from 0.5 to 30 parts by weight, based on 100 parts by weight of the polymerizable polymer precursor.

The heat-diffusible coloring matter should also preferably be contained in an amount of from 3 to 200 parts by weight, more preferably from 5 to 100 parts by weight, based on 100 parts by weight of the total sum of the polymerizable polymer precursor, photopolymerization initiator, and binder optionally used.

The photosensitive material (D) in which both the photosensitive layer and coloring material layer contain the polymerizable polymer precursor and polymerizable monomer, has the advantage that polymer patterns can be formed on both layers of the photosensitive layer and coloring material layer and hence the diffusion of the heat-diffusible coloring matter at the polymerized areas can be suppressed in both the layers, so that color fog can be decreased at the polymerized areas.

A fifth embodiment of the layer constitution which the photosensitive material of the present invention has is a photosensitive material comprising a photosensitive layer containing the photosensitive silver halide, organic silver salt and reducing agent, which are the essential components as previously described, a polymerizing layer containing the polymerizable polymer precursor and photopolymerization initiator, and a coloring material layer containing the heat-diffusible coloring matter (hereinafter "the photosensitive material (E)" of the present invention).

Namely, the photosensitive material (E) is characterized by the above photosensitive layer, polymerizing layer and coloring material layer which are functionally separated into three layers.

Figure 4A:
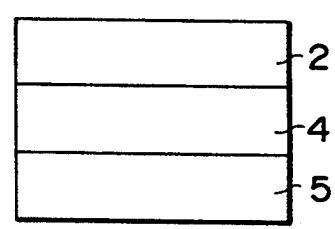
Figure 4B:
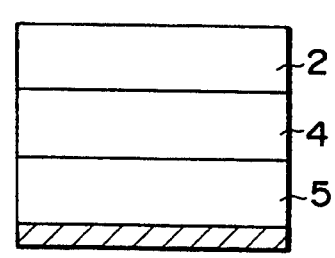
Figure 4C:
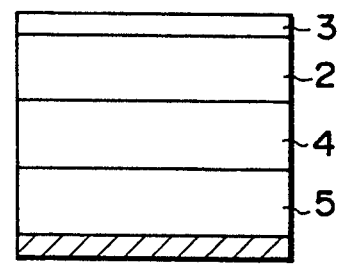

As illustrated in FIGS. 4A to 4C, the photosensitive material (E) can be obtained by dissolving the above essential components in solvents together with a binder appropriately used, and applying the resulting solutions to a support 1 shown in FIG. 4B to provide the coloring material layer 5, polymerizing layer 4 and photosensitive layer 2, respectively followed by drying. Alternatively, if the binder itself can maintain strength, the above essential components each may also be incorporated in a film-like or sheet-like material formed of the binder to form the corresponding layer without use of the support 1 as shown in FIGS. 4A, and then the coloring material layer 5, polymerizing layer 4 and photosensitive layer 2 may be laminated. The coloring material layer 5, polymerizing layer 4 and photosensitive layer 2 may also be provided by separately coating them on supports 1 and then the respective layers may be laminated.

The photosensitive material (E) may be of any form including a flat sheet, a cylinder, a roll and so forth, without any particular limitations. When the layer structure is taken, the photosensitive layer, polymerizing layer and coloring material layer each may preferably be formed so as to have a thickness of from 1 μm to 2 mm, more preferably from 1 μm to 0.1 mm, in approximation.

In the photosensitive material (E), a support is not essential as previously described, but, in the instance where it has the support, it may be made to have a thickness of preferably from 2 μm to 2 mm, more preferably from 3 μm to 1 mm, and may be of any form including a flat sheet, a cylinder, a roll and so forth without any particular limitations, although its form is fitted with the form of the above photosensitive layer, polymerizing layer and coloring material layer.

There are no particular limitations on the order of laminating the photosensitive layer 2, polymerizing layer 4 and coloring material layer 5. In particular, there may be provided between both the photosensitive layer and polymerizing layer a layer (a layer-peeling layer) for improving layer peeling of a film substrate. It is more preferred if the layer-peeling layer is an anti-halation layer.

In the photosensitive material (E), however, as will be described later, the previously described reducing agent contained in the photosensitive layer is oxidized upon oxidation-reduction reaction, and at least the reducing agent thus oxidized (hereinafter "oxidized product") is moved from the photosensitive layer to the polymerizing layer, whereupon the polymerizing layer is area-selectively polymerized and thus a polymerized image can be formed. For this reason, at least the photosensitive layer and polymerizing layer may preferably be directly laminated. More preferably, there may be laminated the photosensitive layer, the polymerizing layer and the coloring material layer in this order.

A primer layer for imparting adhesion may also be provided between the support and coloring material layer.

For the purpose of preventing polymerization from being inhibited by oxygen at the time of polymerization, a layer comprising polyvinyl alcohol, polyvinyl fluoride, polyester or the like may be provided as a protective layer 3 on the photosensitive layer or polymerizing layer. A film made of any of these may also be laminated on the photosensitive layer (FIG. 4C). The support 1 as shown in FIGS. 4B and 4C may also concurrently have the function possessed by such a protective layer. Herein, the above protective layer may have a thickness of from 0.1 μm to 200 μm, preferably from 0.2 μm to 30 μm, and also may be of any form without any particular limitations, although its form is fitted with the form of the above photosensitive layer, polymerizing layer and coloring material layer.

In the photosensitive layer of the photosensitive material (E), the above components may preferably be used in the mixing ratios described below.

The silver halide should preferably be contained in an amount of from 0.001 mol to 2 mols, more preferably from 0.05 mol to 1 mol, per mol of the organic silver salt. The reducing agent should preferably be contained in an amount of from 0.2 mol to 3 mols, more preferably from 0.5 mol to 2 mols, per mol of the organic silver salt. The photopolymerization initiator,-in the polymerizing layer, should also preferably be used in an amount of from 0.1 to 50 parts by weight, more preferably from 0.5 to 30 parts by weight, based on 100 parts by weight of the polymerizable polymer precursor.

Besides these, the photosensitive layer may also optionally contain antifogging agents, surface active agents, photographic sensitizing agents, stabilizers, thickening agents, antistatic agents, plasticizers, and alkali-generating agent.

The polymerizing layer may also optionally contain polymerization inhibitors, surface active agents, binders and so forth for the purpose of improving the storage stability of the polymerizing layer.

The coloring material layer of the photosensitive material (E) may preferably contain, in addition to the above heat-diffusible coloring matter, a binder that keeps the coloring matter in a layer form.

The heat-diffusible coloring matter in the coloring material layer of the photosensitive material (E) should be contained in an amount of preferably from 3 to 200 parts by weight, more preferably from 5 to 100 parts by weight, based on 100 parts by weight of the binder.

As a binder to be used, binder having a low glass transition temperature (Tg) is preferred because it can release the heat-diffusible coloring matter at a lower temperature. Besides this, plasticizers, surface active agents, adhesion-imparting agents, antistatic agents and so forth can also be optionally added.

Suitable binders used in the photosensitive material (E) can be selected from a wide range of resins previously described.

In the photosensitive material (E), the required three elements, i.e. the photosensitive element, polymerizing element and coloring material element, are respectively contained in different layers, so that the respective layers can be designed with ease. Since also the polymerizing layer and coloring material layer are separated, no desensitization due to the coloring material may occur at the time of polymerization and also it is unnecessary to make different from each other the absorption wavelength region of the coloring material and the absorption wavelength region of the photopolymerization initiator, thus bringing about advantages that the photopolymerization initiator can be selected in a vast range and the polymerizing layer and photosensitive layer can be made common.

A sixth embodiment of the layer constitution which the photosensitive material of the present invention has is a photosensitive material, comprising a photosensitive layer containing the photosensitive silver halide, organic silver salt and reducing agent, which are the essential components as previously described, a polymerizing layer containing the polymerizable polymer precursor and photopolymerization initiator, and a coloring material layer containing the polymerizable polymer precursor, photopolymerization initiator and heat-diffusible coloring matter (hereinafter "the photosensitive material (F)" of the present invention).

Namely, the photosensitive material (F) is characterized by further incorporating the polymerizable polymer precursor and photopolymerization initiator in the coloring material layer 5, shown in FIG. 4, of the photosensitive material (E) described above.

Thus, the photosensitive material (F) has the same as the photosensitive material (E) except the mixing ratios of the above essential components contained in the coloring material layer thereof.

In the coloring material layer, the photopolymerization initiator should preferably be used in an amount of from 0.1 to 50 parts by weight, more preferably from 0.5 to 30 parts by weight, based on 100 parts by weight of the polymerizable polymer precursor.

The heat-diffusible coloring matter should also preferably be contained in an amount of from 3 to 200 parts by weight, more preferably from 5 to 100 parts by weight, based on 100 parts by weight of the total sum of the polymerizable polymer precursor, photopolymerization initiator, and binder optionally used.

In addition to the advantage pointed out in the above photosensitive material (E), the photosensitive material (F), in which the coloring material layer contains the polymerizable polymer precursor and polymerizable monomer, has an advantage that a polymer pattern can be formed at the same area corresponding with the polymer pattern in the polymerizing layer and hence color fog can be decreased.

The photosensitive material of the present invention should preferably be any of photosensitive materials (A) to (F) having the layer constitution as described above, but may not be limited to these embodiments. It may include all the photosensitive materials so long as they contain as the essential components the photosensitive silver halide, organic silver salt, reducing agent, polymerizable polymer precursor, photopolymerization initiator and heat-diffusible coloring matter, as previously described.

Another embodiment of the photosensitive material of the present invention is a multi-color photosensitive material suitably used particularly when a multi-color image is formed. Its constitution will be described below in detail.

The above multi-color photosensitive material is a photosensitive material comprising a photosensitive silver halide, an organic silver salt, a reducing agent, a polymerizable polymer precursor, a photopolymerization initiator and a heat-diffusible coloring matter; a plurality of regions being arranged in in-plane in said photosensitive material; and hues of the heat-diffusible coloring matter, when heat-diffusible coloring matters have been transferred to an image-receiving material by heating, being different from each other at adjacent regions (hereinafter "the photosensitive material (G)" of the present invention).

As the photosensitive silver halide, organic silver salt, reducing agent, polymerizable polymer precursor, photopolymerization initiator and heat-diffusible coloring matter, which are the essential components contained in the photosensitive material (G), the same compounds as those previously exemplified are respectively used.

Among the plural regions in the photosensitive material (G), at least the regions adjacent to each other contain;

i) a plurality of heat-diffusible coloring matters having different hues from each other, as in yellow, magenta and cyan, when the heat-diffusible coloring matters have been transferred to the image-receiving material by heat; or ii) heat-diffusible coloring matters capable of generating hues different from each other upon reaction with a developer after diffusion by heat. These heat-diffusible coloring matters are appropriately selected from among the specific examples of the heat-diffusible coloring matters previously described, and incorporated in the photosensitive material.

In the photosensitive material (G), in the instance where the polymerizable polymer precursor, photopolymerization initiator and heat-diffusible coloring matter are contained in the same layer, the photopolymerization initiator contained therein should more preferably have an absorption maximum wavelength different from those of the polymerizable polymer precursor and heat-diffusible coloring matter. For example, in instances where the multi-color image is formed according to a subtractive color mixing method, a photopolymerization initiator with a maximum absorption wavelength region of from 290 to 380 nm, preferably from 310 to 360 nm may preferably be used at the photosensitive region having a yellow heat-diffusible coloring matter. Similarly, a photopolymerization initiator with a maximum absorption wavelength region of from 340 to 440 nm, and preferably from 360 to 420 nm, may preferably be used in the photosensitive region having a magenta heat-diffusible coloring matter, and a photopolymerization initiator with a maximum absorption wavelength region of from 410 to 500 nm, and preferably from 430 to 490 nm, may preferably be used in the photosensitive region having a cyan heat-diffusible coloring matter. In instances in which the heat-diffusible coloring matter comprises a coupler and a color image is formed as a result of a color-forming reaction, a photopolymerization initiator may be used which has an absorption at the region having no absorption wavelength of the coupler.

In the photosensitive material (G), it may be optionally provided with a support, and the photosensitive material may be of any form including a flat sheet, a cylinder, a roll or the like, without any particular limitations. Also when the layer structure is taken, it may be constituted of a single layer or, if necessary, multiple layers.

The binder is not the essential layer also in the photosensitive material (G), and may not necessarily be contained when film properties, dispersibility and sensitivity can be sufficiently attained.

Besides this, it is also possible to add coloring materials, antifogging agents, light color-change preventive agents, solid solvents, surface active agents, antistatic agents and so forth.

The layer constitution the above photosensitive material (G) has will be described below in more detail.

Figure 5:
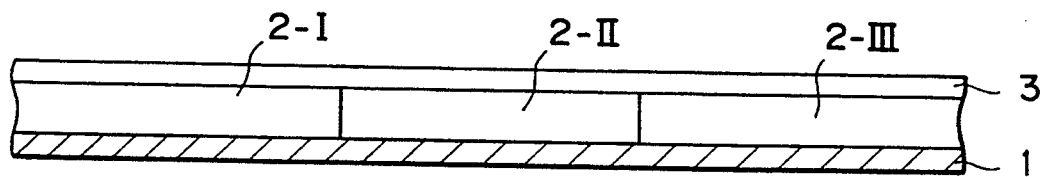

A first embodiment of the layer constitution which the photosensitive material (G) has is a photosensitive material in which, as illustrated in FIG. 5, the photosensitive layer as in the photosensitive material (A) previously described comprises a plurality of photosensitive layers 2-I, 2-II, 2-III respectively separately containing heat-diffusible coloring matters of yellow, magenta and cyan (for example, 2-I contains a heat-diffusible coloring matter of yelow, 2-II contains that of cyan and 2-III contains that of magenta), and these photosensitive layers 2-I, 2-II, 2-III are successively arranged on a film-like or sheet-like support 1 (hereinafter "the photosensitive material (G-a)" of the present invention). The protective layer 3 shown in FIG. 5 may be optionally provided.

A photosensitive layer containing a black heat-diffusible coloring matter may also be optionally further provided.

The photopolymerization initiator contained in each photosensitive layer (for example, 2-I) of the photosensitive material (G-a) should also preferably comprise, as previously described, a photopolymerization initiator having an absorption maximum wavelength different from those of the polymerizable polymer precursor and heat-diffusible coloring matter contained in the same layer (2-I).

All the constituent factors other than the above-described, of the photosensitive material (G-a) may be the same as those in the layer constitution of the photosensitive material (A).

Figure 6:
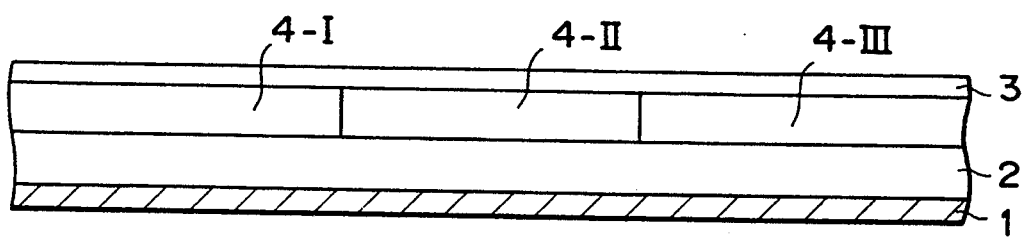

A second embodiment of the layer constitution which the photosensitive material (G) has is a photosensitive material in which, as illustrated in FIG. 6, the polymerizing layer as in the photosensitive material (B) previously described comprises a plurality of polymerizing layers 4-I, 4-II, 4-III respectively separately containing heat-diffusible coloring matters of yellow, magenta and cyan, and these polymerizing layers 4-I, 4-II, 4-III are successively arranged on a film-like or sheet-like support 1 (hereinafter "the photosensitive material b)" of the present invention). The protective layer 3 shown in FIG. 6 may be optionally provided.

A polymerizing layer containing a black heat-diffusible coloring matter may also be optionally further provided.

The photopolymerization initiator contained in each polymerizing layer (for example, 4-I) of the photosensitive material (G-b) should also preferably comprise, as previously described, a photopolymerization initiator having an absorption maximum wavelength different from those of the polymerizable polymer precursor and heat-diffusible coloring matter contained in the same layer (4-I).

All the constituent factors other than the above-described, of the photosensitive material (G-b) may be the same as those in the layer constitution of the photosensitive material (B).

Figure 7:
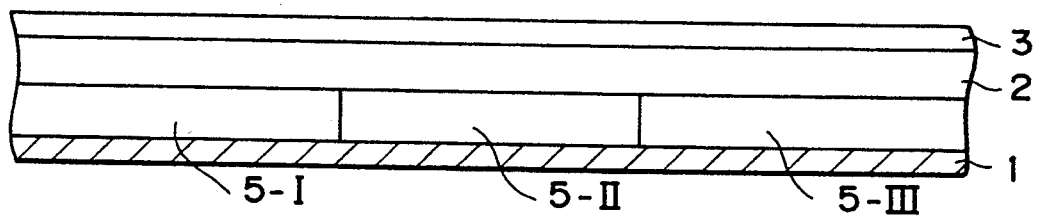

A third embodiment of the layer constitution which the photosensitive material (G) has is a photosensitive material in which, as illustrated in FIG. 7, the coloring material layer as in the photosensitive material (C) previously described comprises a plurality of coloring material layers 5-I, 5-II, 5-III respectively separately containing heat-diffusible coloring matters of yellow, magenta and cyan, and these coloring material layers 5-I, 5-II, 5-III are successively arranged on a film-like or sheet-like support 1 (hereinafter "the photosensitive material (G-c)" of the present invention). The protective layer 3 shown in FIG. 7 may be optionally provided.

A coloring material layer containing a black heat-diffusible coloring matter may also be optionally further provided.

All the constituent factors other than the above-described, of the photosensitive material (G-c) may be the same as those in the layer constitution of the photosensitive material (C).

A fourth embodiment of the layer constitution which the photosensitive material (G) has is a photosensitive material in which, as illustrated in common in FIG. 7, the coloring material layer as in the photosensitive material (D) previously described comprises a plurality of coloring material layers 5-I, 5-II, 5-III respectively separately containing heat-diffusible coloring matters of yellow, magenta and 1 cyan, and these coloring material layers 5-I, 5-II, 5-III are successively arranged on a film-like or sheet-like support I (hereinafter "the photosensitive material (G-d)" of the present invention). The protective layer 3 shown in FIG. 7 may be optionally provided.

A coloring material layer containing a black heat-diffusible coloring matter may also be optionally further provided.

The photopolymerization initiator contained in each area of each coloring material layer (for example, 5-I) of the photosensitive material (G-d) should also preferably comprise, as previously described, a photopolymerization initiator having an absorption maximum wavelength different from those of the polymerizable polymer precursor and heat-diffusible coloring matter contained in the coloring material layer (5-I).

All the constituent factors other than the above-described, of the photosensitive material (G-d) may be the same as those in the layer constitution of the photosensitive material (D).

Figure 8:
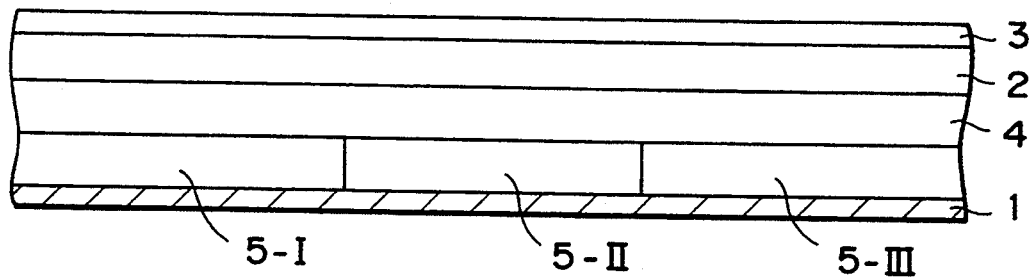
Figure 9A:
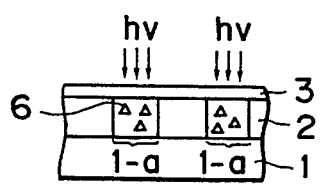
FIGS. 9 to 14 and 17 to 19 are explanatory views for various embodiments of the image forming method of the present invention.
Figure 9B:
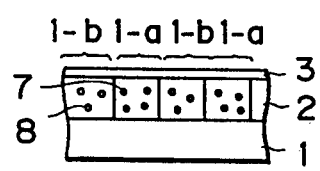

A fifth embodiment of the layer constitution which the photosensitive material (G) has is a photosensitive material in which, as illustrated in FIG. 8, the coloring material layer as in the photosensitive material (E) previously described comprises a plurality of coloring material layers 5-I, 5-II, 5-III respectively separately containing heat-diffusible coloring matters of yellow, magenta and cyan, and these coloring material layers 5-I, 5-II, 5-III are successively arranged on a film-like or sheet-like support 1 (hereinafter "the photosensitive material (G-e)" of the present invention). The protective layer 8 shown in FIG. 8 may be optionally provided.

A coloring material layer containing a black heat-diffusible coloring matter may also be optionally further provided.

All the constituent factors other than the above-described, of the photosensitive material (G-e) may be the same as those in the layer constitution of the photosensitive material (E).

A sixth embodiment of the layer constitution which the photosensitive material (G) has is a photosensitive material in which, as illustrated in common in FIG. 8, the coloring material layer as in the photosensitive material (F) previously described comprises a plurality of coloring material layers 5-I, 5-II, 5-III respectively separately containing heat-diffusible coloring matters of yellow, magenta and cyan, and these coloring material layers 5-I, 5-II, 5-III are successively arranged on a film-like or sheet-like support 1 (hereinafter "the photosensitive material (G-f)" of the present invention). The protective layer 3 shown in FIG. 8 may be optionally provided.

A coloring material layer containing a black heat-diffusible coloring matter may also be optionally further provided.

The photopolymerization initiator contained in each area of each coloring material layer (for example, 5-I) of the photosensitive material (G-f) should also preferably comprise, as previously described, a photopolymerization initiator having an absorption maximum wavelength different from those of the heat-diffusible coloring matter and polymerizable polymer precursor.

All the constituent factors other than the above-described, of the photosensitive material (G-f) of the present invention may be the same as those in the layer constitution of the photosensitive material (F).

The photosensitive material of the present invention should preferably be the photosensitive material (G) described above particularly when a multi-color image is formed, and should more preferably be any of the photosensitive materials (G-a) to (G-f). It, however, is by no means limited to these embodiments, and may include all the photosensitive materials so long as they contain as the essential components the photosensitive silver halide, organic silver salt, reducing agent, polymerizable polymer precursor, photopolymerization initiator and heat-diffusible coloring matter, as previously described.

The photosensitive material of the present invention takes the constitution as described above in detail. Thus, it is a photosensitive material that brings about the advantage that an image with a good contrast can be more quickly and more stably formed, an image with a superior brightness and chroma can be formed without being affected by the black color of a silver image, and an image with a high gradation can be obtained. In order to improve the contrast and density gradation, however, the photosensitive material of the present invention should preferably be a photosensitive material capable of forming a polymer image comprising a polymerized area and an unpolymerized area that satisfy the following formula (A).

$$T_{g2} - T_{g1} \geqq > 30° C. \quad (A)$$

wherein $T_{g1}$ represents a glass transition point of the unpolymerized area, and $T_{g2}$ represents a glass transition point of the polymerized area.

The photosensitive material of the present invention may preferably be a photosensitive material capable of forming the polymerized area and unpolymerized area that satisfy the above formula (A), when exposed to light with wavelength lies in a region of from 250 to 700 nm. To make more specific description, the photosensitive materials (A), (G-a), (C) and (G-c) previously described may more preferably be photosensitive materials capable of forming the polymerized area and unpolymerized area that satisfy the above formula (A) by area-selective polymerization of their photosensitive layers, and the photosensitive materials (B), (G-b), (E) and (G-e) previously described may more preferably be photosensitive materials capable of forming the polymerized area and unpolymerized area that satisfy the above formula (A) by area-selective polymerization of their polymerizing layers. The photosensitive material (D) previously described may also more preferably be a photosensitive material capable of forming the polymerized area and unpolymerized area that satisfy the above formula (A) as a result of area-selective polymerization of any one of its photosensitive layer and coloring material layer, particularly preferably both of the photosensitive layer and coloring material layer. The photosensitive materials (F) and (G-f) may more preferably be a photosensitive material capable of forming the polymerized area and unpolymerized area that satisfy the above formula (A) as a result of area-selective polymerization of any one of its polymerizing layer and coloring material layer, particularly preferably both of the polymerizing layer and coloring material layer.

The above formula (A) may particularly preferably be $T_{g2} - T_{g1} \geqq 50° C.$ The value of $T_{g1}$ is also preferred to be smaller, because the heat-diffusible coloring matter can be better diffused, the optical density on the image-receiving material becomes higher, and the sublimation and removal thereon takes place in a better state. An excessively lower value of $T_{g1}$, however, is not desirable since its corresponding area may become liquid, resulting in difficulty in handling. Hence the value of $T_{g1}$ should preferably range from $-10°$ to $80°$ C. in approximation. On the other hand, the value of $T_{g2}$ should preferably range from $80°$ to $220°$ C. in approximation.

A preferred combination in the polymerizing layer, photosensitive layer and coloring material layer which contain the polymerizable polymer precursor of the present invention satisfying the relationship of the $T_{g1}$ and $T_{g2}$ as described above, includes a combination of i) a binder that keeps the form as a layer and ii) a polymerizable polymer precursor that may become polymeric and/or be cross-linked and cured as a result of polymerization. A particularly preferable combination include a combination of i) a binder having a high glass transition temperature (Tg) and ii) a polymerizable polymer precursor that is liquid, but that may be formed into a polymer having a high Tg after it has been polymerized, or a polymer precursor that may be formed into a cured product having a high cross-link density as a result of polymerization of the polyfunctional polymerizable polymer precursor.

When taking the constitution that the polymerizing layer and coloring material layer are separated, the coloring material layer may preferably be formed using a binder having a low Tg so that the layer can readily release the heat-diffusible coloring matter contained therein, and also the polymerizing layer may preferably comprise a combination of the binder having a high Tg as described above and the polymerizable polymer precursor.

Though not an essential constituent requirement, it is preferred in the photosensitive material of the present invention to provide the protective layer previously described so that the thermal resistance at the time of the reaction by heating, between the organic silver salt and reducing agent at the silver latent image area may be increased, the photosensitive layer may be prevented from suffering a layer slippage at the time of heating, or the polymerization may be prevented from being inhibited by oxygen at the time of polymerization (at the time of the formation of a polymer latent image) and the rate of polymerization may be accelerated. The heat-diffusible coloring matter, however, can not permeate through the protective layer previously described, so that the protective layer must be removed (peeled or dissolved away) when the heat-diffusible coloring matter is transferred to the image-receiving material, resulting in complicate steps for image formation.

Accordingly, in the instance where the protective layer is provided on the photosensitive material of the present invention, it is preferred to provide a protective layer through which the heat-diffusible coloring matter can permeate as a result of heating.

Though depending on the type of the binder that constitute the protective layer and further on the thickness of the layer, it is not preferred for the photosensitive material, in view of its green shelf stability, polymerization performance and so forth, to have a protective layer through which the heat-diffusible coloring matter can permeate as a result of heating at less than 60° C.

Binders generally preferably used as a protective layer include cellulose esters as exemplified by cellulose acetate, cellulose propionate, cellulose butyrate, cellulose myristate, cellulose palmirate, cellulose acetate propionate, and cellulose acetate butyrate; vinyl resins as exemplified by polystyrene, polyvinyl chloride, polyvinyl acetate, polyvinyl butyral, polyvinyl acetal, and polyvinyl pyrrolidone; copolymer resins as exemplified by a styrene-butadiene copolymer, a styrene-acrylonitrile copolymer, a styrene-butadiene-acrylonitrile copolymer, and a vinyl chloride-vinyl acetate copolymer; acrylic resins as exemplified by polymethyl methacrylate, polymethyl acrylate, polybutyl acrylate, polyacrylic acid, polymethacrylic acid, polyacrylamide, and polyacrylonitrile; epoxy resins; phenol resins; polyolefins as exemplified by polyethylene, polypropylene, and chlorinated polyethylene; and polyesters.

Two or more of these may be used in combination, and these may also be used in combination with PVA or gelatin so long as the properties thereof may not be lost. Among these, cellulose esters, polyvinyl butyral, polyvinyl acetal and acrylic resins are particularly preferred in view of the permeability of the heat-diffusible coloring matter. Polyvinyl butyral and polyacetal are further particularly preferred in view of a good permeation efficiency and the advantage that the protective layer may not adhere to the image-receiving material side even when the transfer is carried out at a high temperature.

The permeation efficiency of the heat-diffusible coloring matter depends not only on the types of the binder to be used, but also on the film thickness of the protective layer. Thus, the protective layer in the present invention may have a layer thickness of from 0.1 to 200 $\mu$m, preferably from 0.2 to 10 $\mu$m, more preferably from 0.5 to 4 $\mu$m. It is also possible to add surface active agents, surface smoothing agents, etc. in the protective layer.

The image forming method using the photosensitive material described in the above will now described below.

The image forming method of the present invention is an image forming method, comprising the steps of;

(a) subjecting to imagewise exposure the photosensitive material comprising the photosensitive silver halide, organic silver salt, reducing agent, polymerizable polymer precursor, photopolymerization initiator and heat-diffusible coloring matter;

(b) heating the photosensitive material;

(c) subjecting at least a layer in the photosensitive material to whole areal exposure to form a polymer latent image, the layer containing the polymerizable polymer precursor and the photopolymerization initiator; and (d) laminating a layer containing the heat-diffusible coloring matter on the photosensitive material, followed by heating to transfer on an image-receiving material a color image comprised of the heat-diffusible coloring matter (hereinafter "the image forming method (A) of the present invention").

In more detail, the image forming method (A) is an image forming method, comprising the steps of;

(a) subjecting the photosensitive material comprising the photosensitive silver halide, organic silver salt, reducing agent, polymerizable polymer precursor, photopolymerization initiator and heat-diffusible coloring matter, to imagewise exposure to form a latent image comprised of silver metal;

(b) heating the photosensitive material on which the latent image comprised of silver metal has been formed, to form silver metal and an oxidized product of the reducing agent, thereby amplifying the latent image comprised of the silver metal to a latent image comprised of the oxidized product;

(c) subjecting the photosensitive material on which a pattern of the latent image comprised of the reducing agent and oxidized product, to whole areal exposure, thereby inhibiting the polymerization at the area where the the oxidized product is present and polymerizing the polymerizable polymer precursor at the area where the reducing agent is present, corresponding with the distribution of the reducing agent and oxidized product, to form a pattern of the polymer latent imager and (d) laminating an image-receiving material on the photosensitive material on which the pattern of the polymer image has been formed, followed by heating to diffusion-transfer to the image-receiving material the heat-diffusible coloring matter contained in said photosensitive material, corresponding with said pattern of the polymer latent image, to form a color image comprised of said heat-diffusible coloring matter, on said image-receiving material at its area corresponding to the unpolymerized area.

The image forming method (A) comprising the above steps (a) to (d), in which silver halide is utilized, can achieve a superior sensitivity in the writing of the latent image. In particular, when a way to form the polymer image is a whole areal exposure, the writing can be completed in a short time, so that the processing time in the respective steps from the writing for the image formation up to the development can be shortened in a good efficiency. Moreover, the step of forming the oxidized product from the reducing agent is effectively separated from the step of forming the polymer, so that the image can be obtained with a sufficiently stable contrast between the exposed area and unexposed area.

It is also possible, as previously described, to selectively diffusion-transfer the heat-diffusible coloring matter to the image-receiving material or the like, corresponding with the differences in heat-diffusibility of the heat-diffusible coloring matters, which differences are caused by the degree of cross-linking or the like at the polymerized area and unpolymerized area of the polymer latent image. Thus, the silver image and color image formed in the step of amplification are separated, and hence the resulting color image can be an image which is free of any turbidity and has a superior chroma and brightness, as well as having a superior density gradation.

The outline of the respective steps included in the image forming method (A) will be described below with reference to the drawings.

FIG. 9A to 9E are views to illustrate the image forming method (A) using the photosensitive material (A); FIGS. 10A to 10E are views to illustrate the image forming method (A) using the photosensitive material (B); FIGS. 11A to 11E are views to illustrate the image forming method (A) using the photosensitive material (C); FIGS. 12A to 12E are views to illustrate the image forming method (A) using the photosensitive material (D); FIGS. 13A to 13E are views to illustrate the image forming method (A) using the photosensitive material (E); and FIGS. 14A to 14E are views to illustrate the image forming method (A) using the photosensitive material (F).

In the image forming method (A), the above step (a) is a step of carrying out the writing of an image by using light, in which, as illustrated in FIGS. 9A to 14A, the photosensitive layer 2 is subjected to imagewise exposure or digital exposure to carry out exposure for any desired image.

As a result, silver metal 6 is produced on the photosensitive silver halide inside an exposed area 1-a, which forms the latent image. The silver metal 6 produced serves as a catalyst in the thermal reaction between the organic silver salt and reducing agent contained in the photosensitive layer 2.

As conditions for the exposure in carrying out the writing of this latent image, conditions under which the desired performance such as a sufficient contrast can be attained in the resulting polymer latent image may be suitably selected depending on, e.g., the concentration of the silver halide incorporated in the photosensitive layer.

Since the photosensitive silver halide is used in this step, it becomes possible to carry out the writing with a high sensitivity.

The support 1 and protective layer 3 are not essential constituent factors in the photosensitive material of the present invention. In instances where which the above exposure to light is carried out on the photosensitive material having these, however, those having light transmission properties are used as these support 1 and protective layer 3.

To specifically describe the above exposure conditions, the photosensitive material is subjected to image-wise exposure at an energy level up to 1 mJ/cm$^2$ at maximum, using light having a wavelength to which the silver halide has a sensitivity, as exemplified by light of about 400 nm or less in the case that the silver halide comprises silver chloride and has not been sensitized, light of about 450 nm or less in the case that the silver halide comprises silver bromide and has not been sensitized, light of about 480 nm or less in the case that the silver halide comprises silver iodobromide and has not been sensitized, and light within the sensitizing region in the case that the silver halide has been sensitized (e.g., light of about 1,000 nm or less when it has been infrared-sensitized), by using as a light source, sunlight, a tungsten lamp, a mercury lamp, a halogen lamp, a xenon lamp, a fluorescent lamp, an LED, a laser beam source, etc.

Next, in the above step (b), the photosensitive material 2 on which the latent image has been formed is heated, so that, as shown in FIGS. 9B to 14B, the silver metal 6 selectively acts as a catalyst in the exposed area 1-a and an organic silver salt reacts with the reducing agent, where the organic silver salt is reduced to a silver atom and at the same time the reducing agent is oxidized and converted into an oxidized product 7.

As a result, there are formed the exposed area 1-a containing the oxidized product 7 and the unexposed area containing the reducing agent 8. The reducing agent 8 used in the photosensitive layer 2 is a reducing agent having, as a result of being oxidized, a polymerization inhibitory power to the polymerizable polymer precursor where the polymerization inhibitory power is different from that to the reducing agent, and may preferably be the compound represented by Formula (I) to (V) previously described.

In the photosensitive layer 2, a latent image is formed, comprising the difference in polymerization inhibitory power, constituted by the distribution of the reducing agent 8 and oxidized product 7.

Figure 10A:
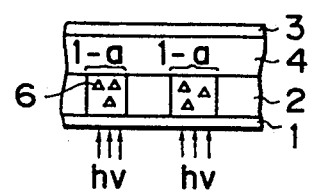
Figure 10B:
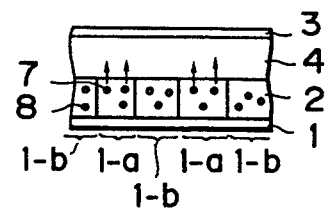
Figure 10C:
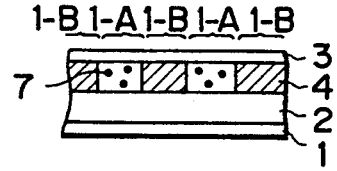
Figure 12A:
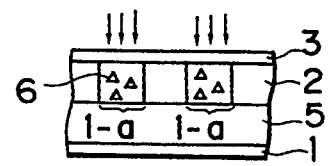
Figure 12B:
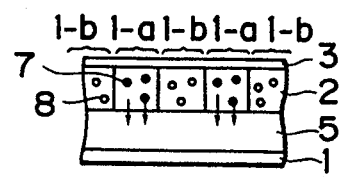
Figure 12C:
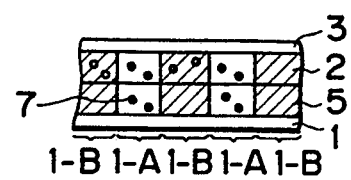
Figure 13A:
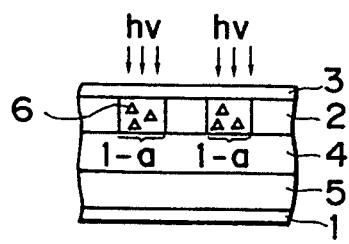
Figure 13B:
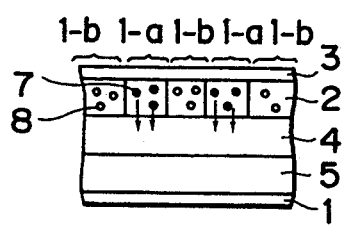
Figure 14B:
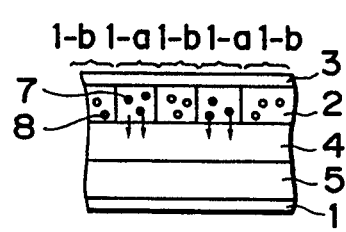
Figure 14C:
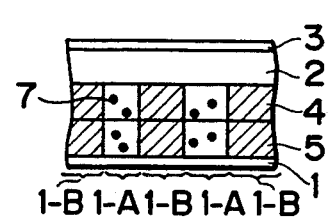

In instance where the photosensitive materials (B), (D), (E) and (F) as respectively shown in FIGS. 10B, 12B, 13B and 14B are used as photosensitive materials, as a result of the formation of the image comprising the difference in polymerization inhibitory power, constituted by the distribution of the reducing agent 8 and oxidized product 7, at least a part of the oxidized product 7 simultaneously undergoes heat-diffusion (diffusion by heat) or the like and thus moves to the polymerizing layer 4 side [FIGS. 10B and 13B, when the photosensitive materials (B) and (E) are used], to the coloring material layer 5 side [FIG. 12B, when the photosensitive material (D) is used], or both the polymerizing layer 4 and coloring material layer 5 sides [FIG. 14B, when the photosensitive material (F) is used].

The present invention, however, may not be limited to this embodiment it may include an embodiment in which the reducing agent 8 and oxidized product 7 are transferred together, according to which, as a result of transfer of these, it is possible to form the desired image having different polymerization inhibitory power to the polymerizable polymer precursor contained in the polymerizing layer and/or coloring material layer 5.

The heating in this step (b) is carried out by appropriately selecting necessary conditions under which the difference in polymerization inhibitory power, effective for the image formation, can be formed in the photosensitive layer. The heat treatment, though depending on the layer composition and so forth, may preferably be carried out at a temperature of from 60° C. to 200° C., preferably from 70° C. to 150° C., for from 0.01 second to 5 minutes, more preferably from 1 second to 60 seconds.

As heating means, a method is available in which a hot plate, a heat roll, a thermal head or the like is used, as well as a method in which the heating is carried out by electrification on a heat-generating element of the support, or a method in which the heating is carried out by irradiation by laser beams.

Next, in the above step (c), as a result of application of energy such as light to the photosensitive material, a difference in polymer-formation state is produced, as shown in FIGS. 9C to 14C, between the area 1-A in which the oxidized product 7 is present and the area 1-B in which no oxidized product 7 is present, and the part 1-B is polymerized because of this difference.

In this step (c), it is preferred for obtaining an image with a good contrast to form a latent image that there may become 30° C. or more a difference between $Tg_2$ of the polymerized area 1-B and $Tg_1$ of the unpolymerized area 1-A. The value of $Tg_1$ is also preferred to be smaller, because the heat-diffusible coloring matter can be better diffused, the optical density on the image-receiving material becomes higher, and the sublimation and removal thereon takes place in a better state. An excessively lower value of $Tg_1$, however, is not desirable since the corresponding area may become liquid, resulting in a difficulty in handling. Hence the value of $Tg_1$ should preferably range from −10° to 80 ° C. in approximation. On the other hand, the value of $Tg_2$ should preferably range from 80° to 220° C. in approximation.

In the case of photopolymerization, the photosensitive material is subjected to whole areal exposure at an energy up to 500 mJ/cm at maximum, by using the light having a wavelength of preferably from 250 to 700 nm, and more preferably from 300 to 500 nm.

In the steps (a) and (c), the silver halide usually has a sufficiently high sensitivity as competed with the photopolymerization initiator even with use of light having the same wavelength, so that the latent image attributable to the silver metal can be sufficiently written by, using light with an intensity that photopolymerization may not occur in the above step (a).

In the step (c), a means of heating the photosensitive layer may further be used at the time of exposure. This may be done by application of additional heating, or by utilization of thermal inertia in the above step (b).

Next, in the step (d), an image-receiving layer 11 formed on a support 10 and the photosensitive layer 2 or polymerizing layer 4 are laminated as shown in FIGS. 9D to 14D, followed by heating to an appropriate degree.

Figure 9C:
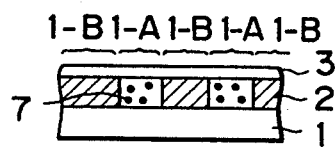
Figure 9D:
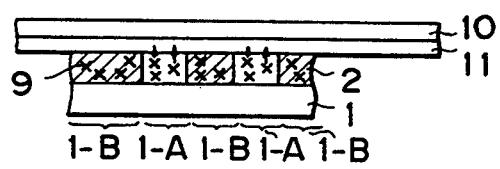

In the instance where the photosensitive material (A) is used, as shown in FIG. 9D, the heat-diffusible coloring matter 9 is present in the photosensitive layer 2, and the heat-diffusible coloring matter 9 present in the polymerized area 1-B in the photosensitive layer 2 has a lower heat-diffusibility than the heat-diffusible coloring matter 9 in the unpolymerized area 1-A, so that the heat-diffusible coloring matter 9 in the unpolymerized area 1-A is selectively diffusion-transferred as a result of the heating described above.

The laminating herein mentioned has the meaning not only that the layers are completely brought into close contact, but also that they are made close to each other to an extent that the coloring matter 9 can be transferred.

In FIG. 9, an embodiment is illustrated in which the photosensitive layer 2 and image-receiving layer 11 are laminated after the protective layer 3 has been removed. However, as previously described, the protective layer 3 may not be removed if the protective layer through which the heat-diffusible coloring matter 9 can permeate at the time of heating is used as the protective layer.

Figure 10D:
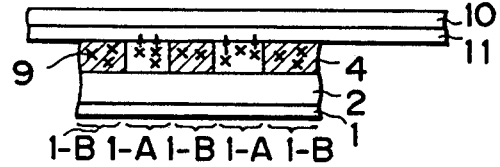
Figure 9E:
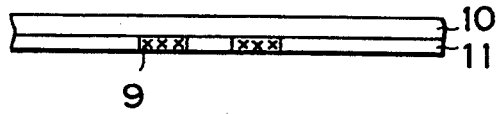
Figure 10E:
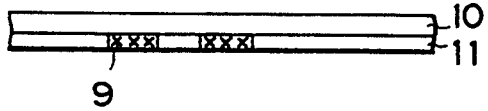
Figure 11A:
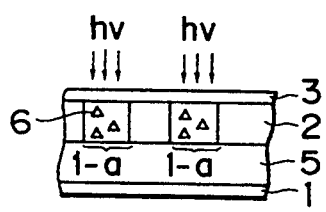
Figure 11B:
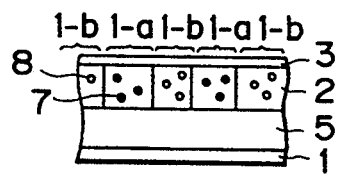

In the instance where the photosensitive material (B), as shown in FIG. 10D, the heat-diffusible coloring matter 9 is present in the polymerizing layer 4, and the heat-diffusible coloring matter 9 present in the polymerized area 1-B in the polymerizing layer 4 has a lower heat-diffusibility than the heat-diffusible coloring matter 9 in the unpolymerized area 1-A, so that the heat-diffusible coloring matter 9 in the unpolymerized area 1-A is selectively diffusion-transferred as a result of the heating described above. In this figure, the polymerizing layer 4 and image-receiving layer 11 are laminated after the photosensitive layer 3 has been removed. However, the protective layer 3 may not be removed if the protective layer, previously described, through which the heat-diffusible coloring matter 9 can permeate at the time of heating is used as the protective layer.

Figure 11C:
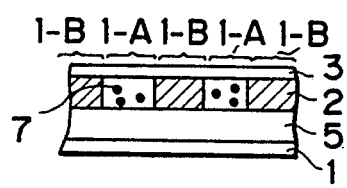
Figure 11D:
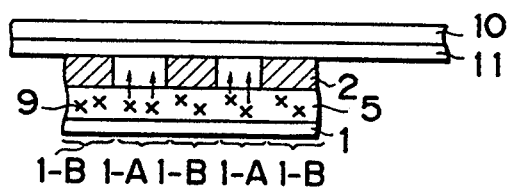

In the instance where the photosensitive material (C), as shown in FIG. 11D, the heat-diffusible coloring matter 9 is present in the coloring material layer 5, and the heat-diffusible coloring matter 9 in the polymerized area 1-B in the coloring material layer 5 has a heat-diffusibility that has been more suppressed as compared with the heat-diffusible coloring matter 9 in the unpolymerized area 1-A, so that the heat-diffusible coloring matter 9 in the unpolymerized area 1-A is selectively diffusion-transferred as a result of the heating described above.

In FIG. 11, an embodiment is illustrated in which the photosensitive layer 2 and image-receiving layer 11 are laminated after the protective layer 3 has been removed. However, as previously described, the protective layer 3 may not be removed if the protective layer through which the heat-diffusible coloring matter 9 can permeate at the time of heating is used as the protective layer.

Figure 12D:
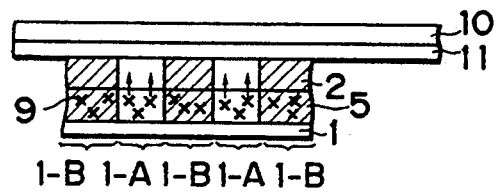
Figure 11E:
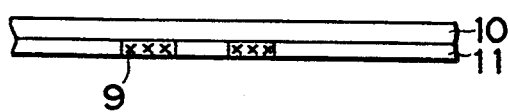
Figure 12E:
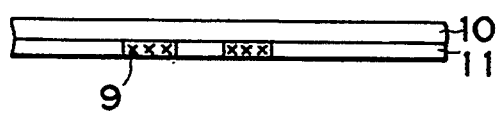
Figure 14A:
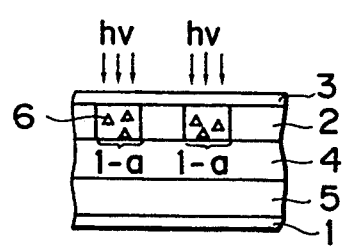

In the instance where the photosensitive material (D), as shown in FIG. 12D, the heat-diffusible coloring matter 9 is present in the coloring material layer 5, and the heat-diffusible coloring matter 9 present in the polymerized area 1-B in the coloring material layer 5 has a lower heat-diffusibility than the heat-diffusible coloring matter 9 in the unpolymerized area 1-A, so that the heat-diffusible coloring matter 9 in the unpolymerized area 1-A is selectively diffusion-transferred as a result of the heating described above.

The laminating herein mentioned has the meaning not only that the layers are completely brought into close contact, but also that they are made close to each other to the extent that the coloring matter 9 can be transferred.

In FIG. 12, an embodiment is illustrated in which the photosensitive layer 2 and image-receiving layer 11 are laminated after the protective layer 3 has been removed. However, as previously described, the protective layer 3 may not be removed if the protective layer through which the heat-diffusible coloring matter 9 can permeate at the time of heating is used as the protective layer.

Figure 13C:
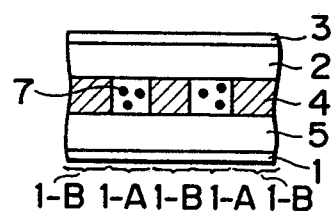
Figure 13D:
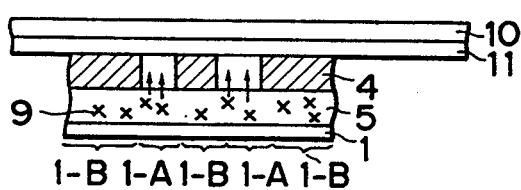

In the instance where the photosensitive material (E), as shown in FIG. 13D, the heat-diffusible coloring matter 9 is present in the coloring material layer 5, and the heat-diffusible coloring matter 9 in the polymerized area 1-B in the coloring material layer 5 has a heat-diffusibility that has been more suppressed as compared with the heat-diffusible coloring matter 9 in the unpolymerized area 1-A, so that the heat-diffusible coloring matter 9 in the unpolymerized area 1-A is selectively diffusion-transferred as a result of the heating described above.

In FIG. 13, an embodiment is illustrated in which the polymerizing layer and image-receiving material are directly laminated after the photosensitive layer has been removed. It, however, is possible to carry out the thermal transfer with the photosensitive layer remaining unremoved. When the photosensitive layer is removed, a binder that can be readily peeled from the polymerizing layer is of course used as the binder used in the photosensitive layer.

In respect of the protective layer 3 also, the protective layer 3 may not be removed if the protective layer, previously described, through which the heat-diffusible coloring matter 9 can permeate at the time of heating is used as the protective layer.

Figure 14D:
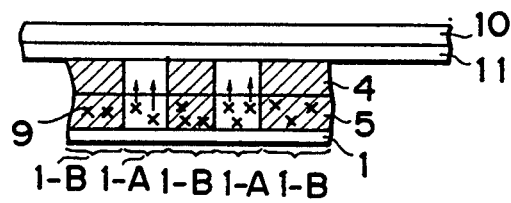
Figure 13E:
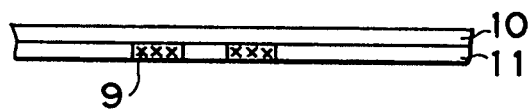
Figure 14E:
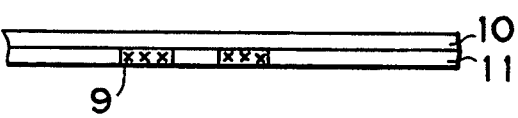

In the instance where the photosensitive material (F), as shown in FIG. 14D, the heat-diffusible coloring matter 9 is present in the coloring material layer 5, and the heat-diffusible coloring matter 9 present in the polymerized area 1-B in the coloring material layer 5 has a lower heat-diffusibility than the heat-diffusible coloring matter 9 in the unpolymerized area 1-A, so that the heat-diffusible coloring matter 9 in the unpolymerized area 1-A is selectively diffusion-transferred as a result of the heating described above.

The laminating herein mentioned has the meaning not only that the layers are completely brought into close contact, but also that they are made close to each other to the extent that the coloring matter 9 can be transferred.

In FIG. 14, an embodiment is illustrated in which the polymerizing layer and image-receiving material are directly laminated after the photosensitive layer has been removed. It, however, is possible to carry out the thermal transfer with the photosensitive layer remaining unremoved. When the photosensitive layer is removed, a binder that can be readily peeled from the polymerizing layer is of course used as the binder used in the photosensitive layer.

In respect of the protective layer 3 also, the protective layer 3 may not be removed if the protective layer, previously described, through which the heat-diffusible coloring matter 9 can permeate at the time of heating is used as the protective layer.

The reason why the diffusibility of the heat-diffusible coloring matter 9 is lowered owing to the polymerized area 1-B is that the molecular chain of the polymer in the polymerized area 1-B is relaxed with difficulty even by heating, as a result of polymerization of the polymerizable polymer precursor or, when the polyfunctional polymerizable polymer precursor is contained, as a result of its cross-linking, so that the diffusion of coloring matters is suppressed.

There are no particular limitations on the image-receiving layer of the image-receiving material used in this step (d) so long as the heat-diffusible coloring matter can be diffusion-transferred in a good state and a good image can be formed. There can be used various materials as exemplified by polyester resins, polycarbonate resins, polyvinyl acetate resins, polyurethane resins, polyamide resins, polycaprolactone resins, and polyvinyl chloride resins.

Optimal values for the heating temperature in this step (d) may vary depending on various conditions such as types of the heat-diffusible coloring matter and the degree of polymerization of the polymer, but the heating may preferably be carried out at a temperature of from 70° to 250° C., and more preferably from 80° to 200° C.

The above heating may also preferably be carried out so as to satisfy the following formula (B).

$$Tg_1 \leq Ttrans \leq Tg_2 \qquad (B)$$

wherein Ttrans represents a temperature of the photosensitive material, $Tg_1$ represents a glass transition point of the unpolymerized area of the above polymer latent image, and $Tg_2$ represents a glass transition point of the polymerized area of the above polymer latent image.

The relation of the above formula (B) will be described in detail with reference to the drawings.

Figure 15:
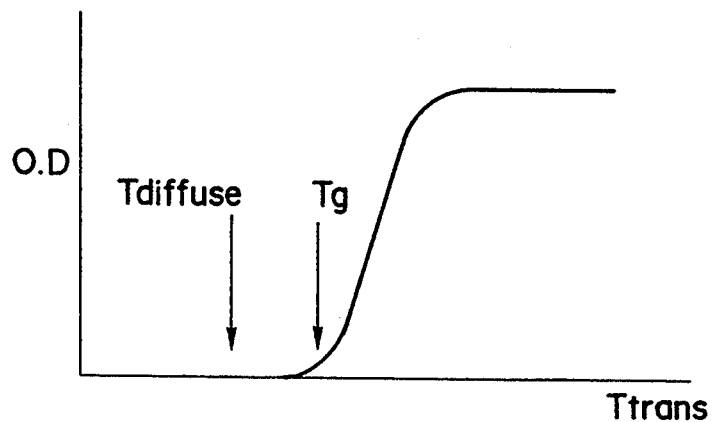
FIGS. 15 and 16 are graphs to show the relationship between temperature and optical density in carrying out image forming methods.

FIG. 15 is a graph to exemplify the relationship between the temperature (Ttrans) of a layer containing a coloring matter (heat-diffusible substance) and the optical density (O.D.) of the coloring matter (heat-diffusible substance) diffusion-transferred onto image-receiving paper from the inside of the layer, in the present image forming method. The optical density (O.D.) of the diffusion-transferred coloring matter (heat-diffusible substance) depends on i) the specific diffusion temperature (Tdiffuse) (in general, the smaller the molecular weight of the substance is, the lower this Tdiffus is; and the more polar groups the substance has, the higher it is) and ii) the glass transition point (Tg) of the constituent components (binder, etc.) of a layer containing the coloring matter (heat-diffusible substance). The Ttrans at which the coloring matter begins to be diffusion-transferred onto the image-receiving paper becomes more than Tdiffuse and substantially coincident with Tg. More specifically, the layer containing the coloring matter (heat-diffusible substance) is heated until the temperature (Ttrans) of the layer becomes not lower than the above Tdiffus and Tg (Ttrans≧Tdiffus). As a result, the coloring matter (heat-diffusible substance) in the layer is diffused and transferred, and thus an image comprising the substance can be obtained on the image-receiving material.

In the present invention, the diffusibility of the heat-diffusible coloring matter is suppressed to a certain extent by the molecular chain of the polymer at the polymerized area. Hence, the coloring matter in the polymerized area can be suppressed if the polymerized area is heated only to not higher than the glass transition point and the molecular chain is not relaxed (i.e., the molecular chain is made not to become relaxed even as a result of molecular vibration by heat).

Figure 16:
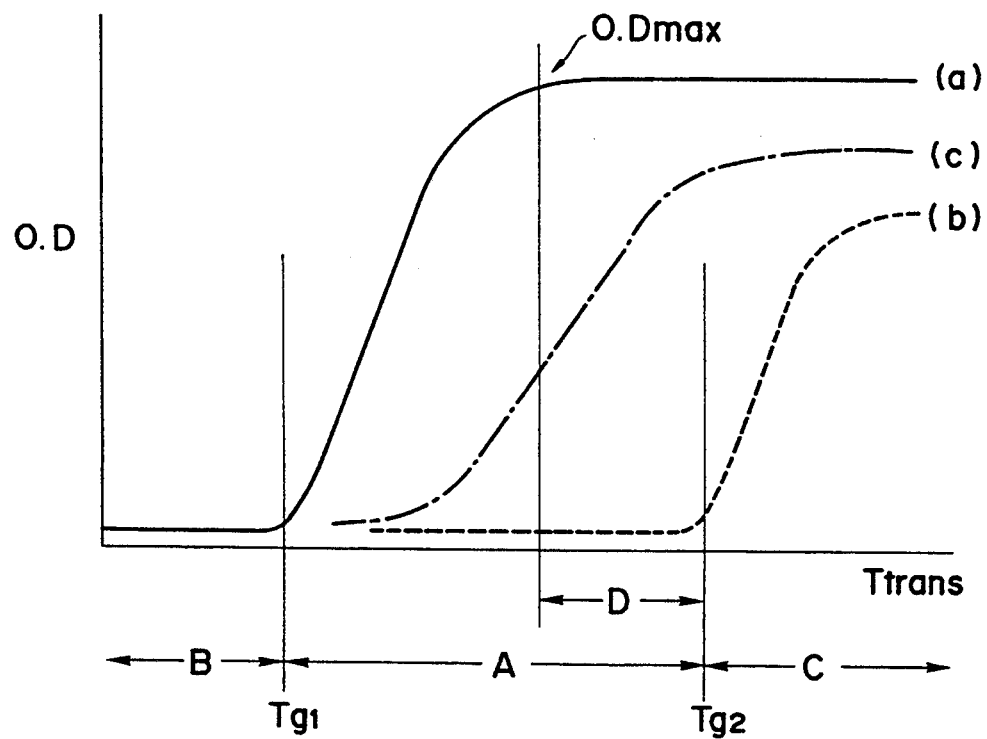

FIG. 16 is a graph to show the relationship between the temperature (Ttrans) of the heated photosensitive material and the optical density (O.D.) of the coloring matter diffusion-transferred onto image-receiving paper from the inside of the photosensitive material. In this graph, the curve (a) shows the above relationship in respect of the polymerized area and the curve (b) shows the above relationship in respect of the unpolymerized area. The temperature (Ttrans) of the photosensitive material is a value obtained by measurement on a heater and the surface of a heat roller used when the transfer is carried out.

As shown by the curve (a) in FIG. 16, the heat-diffusible coloring matter in the unpolymerized area of the photosensitive material begins to be transferred onto the image-receiving material, at the temperature corresponding to the glass transition point ($Tg_1$) of the unpolymerized area thereof, and the binder and polymerizable polymer precursor molecules constituting the above unpolymerized area are relaxed with a rise of Ttrans, so that the diffusion transfer performance of the heat-diffusible coloring matter can be improved and the optical density (O.D.) can be increased.

On the other hand, as shown by the curve (b) in the same FIG. 16, the heat-diffusible coloring matter in the polymerized area of the photosensitive material begins to be transferred onto the image-receiving material, at the temperature corresponding to the glass transition point ($Tg_2$) of the polymerized area thereof, and the binder and monomer molecules constituting the above unpolymerized area are relaxed with a rise of Ttrans, so that the diffusion transfer performance of the heat-diffusible coloring matter can be improved and the optical density (O.D.) can be increased.

Because of the relationship between the curves (a) and (b) as in the above, when Ttrans is lower than $Tg_1$ (the region B in FIG. 16), the heat-diffusible coloring matter is not transferred onto the image-receiving material from both the polymerized area and unpolymerized area of the photosensitive material.

On the other hand, when Ttrans is higher than $Tg_2$ (the region C in FIG. 16), the optical density (O.D.) of the heat-diffusible coloring matter transferred onto the image-receiving material from the unpolymerized area of the photosensitive material can be sufficiently high, but the heat-diffusible coloring matter is transferred also from the polymerized area, resulting in generation of fog, undesirably.

In the image forming method (A) of the present invention, the Ttrans should preferably be within the region A in FIG. 16 i.e., $Tg_1 \leq Ttrans \leq Tg_2$. A good image with a high contrast and free of fog can thereby be obtained.

In this method, which requires no heating at a high temperature, other components (the binder, polymerizable compound, etc.) contained in the photosensitive material can be suppressed from being melted or sublimated and then transferred to the image-receiving material, so that an image with a better image quality can be obtained.

It is further particularly preferred to control the Ttrans to be within the region D in FIG. 16, since the O.D. value of the image obtained on the image-receiving material can be made sufficiently high.

In the case that the gradation is obtained using the image forming method (A) of the present invention, the amount of transfer of the heat-diffusible coloring matter may be changed by changing the degree of polymerization in the layer containing the heat-diffusible coloring matter as shown by the curve (c) in FIG. 16.

More specifically, in this method, an image with a high gradation can be obtained by controlling the Tg of a latent image not to comprise only the two $Tg_1$ and $Tg_2$, but to comprise a gradational Tg within the range of from $Tg_1$ to $Tg_2$. In other words, the amount of exposure in the step of imagewise exposure in the method of the present invention may be changed, so that the quantity of silver latent image is changed, then the quantity of the oxidized product produced is changed after the heating step. Further, after the step of the whole areal exposure and/or heating, a polymer latent image is produced with a degree of polymerization corresponding with the quantity of the oxidized product produced. With an increase in the amount of imagewise exposure, the silver latent image is produced in a larger quantity, also resulting in the oxidized product produced in a larger quantity, so that the polymerization inhibitory power becomes stronger, and the Tg becomes lower with increase of the amount of imagewise exposure and finally reaches the initial Tg ($Tg_1$). Since the heat-diffusion performance becomes higher with the gradational Tg, the optical density of a color image obtained on the image-receiving material becomes higher. Namely, the optical density of the resulting color image becomes proportionally higher as the amount of exposure is increased in the step of imagewise exposure, so that the density gradation can be obtained following the gradational Tg. Herein, the $Tg_2$ in the above formula (B) in the case that the image with such a gradation is obtained refers to the highest glass transition point in the polymerized area.

As described above, the image forming method (A) of the present invention is a simple method that can obtain an image with a high gradation according to the operation of controlling the degree of polymerization (and degree of cross-linking) of the polymerizable polymer precursor contained in the photosensitive material.

After taking the steps (a) to (d) described above, an image comprising the coloring matter 9 can be obtained in the image-receiving layer 11, as shown in FIGS. 9 to 14E. This image is an image with a superior contrast, free from any inclusion of silver, and therefore an image with a superior brightness and chroma, without being affected by the black color of a silver image.

Utilizing the difference in the degree of polymerization or degree of cross-linking has further made it possible to obtain the density gradation with a high resolution that has not been conventionally obtainable.

An image formed using the image forming method (A) of the present invention refers to not only an image formed on the image-receiving layer 8, but also an image on the photosensitive layer 1, remaining after the heat-diffusible coloring matter 9 has been diffusion-transferred.

In the image forming method (A) of the present invention, preferable results can be obtained particularly when the photosensitive materials (E) and (C) of the present invention are used. Namely, the image-receiving layer and the coloring material layer containing the heat-diffusible coloring matter are separated by the photosensitive layer in which the polymer latent image has been formed or the polymerizing layer, without any direct contact between them, so that, in an attempt to perfectly suppress the transfer of the heat-diffusible coloring matter in the polymerized area, it becomes possible to do so and there can be obtained an image with a good contrast and very little ground fog.

Preferable results can be further obtained when the photosensitive materials (D) and (F) are obtained. Namely, even when the heat-diffusible coloring matter of the polymerized area in the coloring material layer has been excessively diffused, such diffusion is suppressed at the polymerized area in the photosensitive layer or polymerizing layer, so that color fog may be generated with great difficulty and there can be obtained an image with a much better contrast.

Carrying out the steps (a) to (d) in the image forming method (A) of the present invention described above, on a plurality of photosensitive materials of the present invention which contain heat-diffusible coloring matters having hues different from each other, enables formation of a multi-color image on a image-receiving material (hereinafter "the image forming method (B)" of the present invention).

More specifically, the image forming method (B) is an image forming method using a plurality of photosensitive materials of the present invention as previously described, each separately containing a heat-diffusible color-former having a hue different from each other as in, for example, yellow, magenta and cyan (and black, if desired), or a heat-diffusible coloring matter capable of exhibiting a hue different from each other as a result of reaction with a developer after diffusion transfer; which comprises the steps of;

(a) subjecting each photosensitive material to exposure according to the image information for each color;
(b) heating the photosensitive material;
(c) subjecting the photosensitive material to whole areal exposure to form a polymer latent image;
(d) successively laminating the same image-receiving material on each photosensitive material, followed by heating to form on the image-receiving material a color image comprised of a plurality of heat-diffusible coloring matters having different hues.

The photosensitive materials used in the image forming method (B) may be of any embodiment so long as they are the photosensitive materials of the present invention, but should preferably comprise the photosensitive materials (A) to (F).

Detailed embodiments in the above respective steps (a) to (d) may be entirely the same as those in the image forming method (A) of the present invention.

Multi-color image forming methods other than the above image forming method (B) will be described below.

One of the methods is an image forming method using the photosensitive material comprising a photosensitive silver halide, an organic silver salt, a reducing agent, a polymerizable polymer precursor, a photopolymerization initiator and a heat-diffusible coloring matter; a plurality of regions being arranged in in-plane in said photosensitive material, and hues of the heat-diffusible coloring matter, when heat-diffusible coloring matters have been transferred to an image-receiving material by heating, being different from each other at adjacent regions (the photosensitive material (G) of the present invention); which comprises the steps of:

(a) subjecting the photosensitive material to imagewise exposure;
(b) heating the photosensitive material;
(c) subjecting the photosensitive material to whole areal exposure to form a polymer latent image; and
(d) successively laminating the same image-receiving material on the areas, followed by heating to form in the image-receiving material a color image comprised of a plurality of the different heat-diffusible coloring matters (hereinafter "the image forming method (C)" of the present invention).

The image forming method (C) will be described below with reference to FIGS. 17 to 19.

Figure 17:
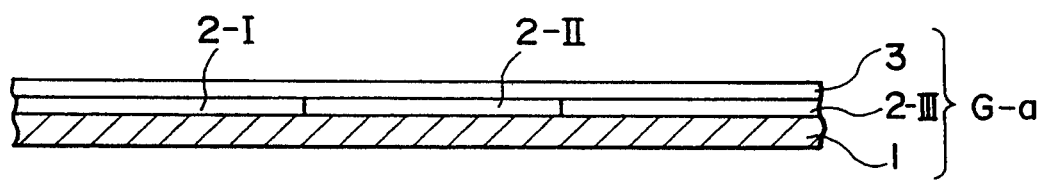

As illustrated in FIG. 17, photosensitive layers 2-I, 2-II, 2-III respectively separately containing heat-diffusible coloring matters of yellow, magenta and cyan are formed on a film-like or sheet-like support 1, and a protective layer 3 is further formed thereon to obtain a photosensitive material (G-a).

Figure 18:
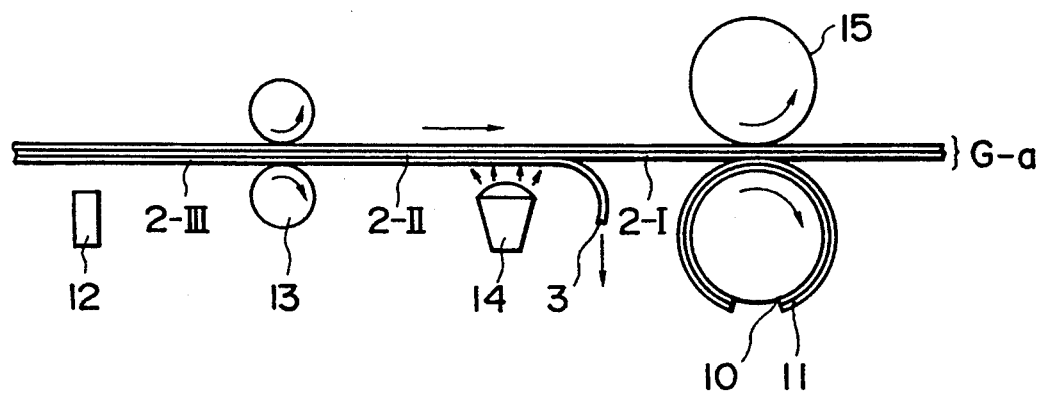
Figure 19:
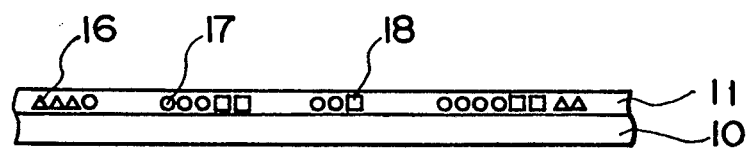

Subsequently, as shown in FIG. 18, this photosensitive material (G-a) is passed on or through an exposure unit 12, a heat developing unit 13 and then a whole areal exposure unit 14 in the order of the yellow photosensitive layer 2-I, magenta photosensitive layer 2-II and cyan photosensitive layer 2-III, and the formation of latent images comprised of silver metal, amplification thereof to latent images comprised of oxidized products, and conversion to polymer latent images by whole areal exposure are carried out respectively under suitable conditions. Finally, the protective layer 3 is removed, and then an image-receiving layer 11 of an image-receiving material and the photosensitive layers 2-I, 2-II, 2-III are successively brought into face-to-face contact, and yellow, magenta and cyan are passed through a thermal transfer unit 15, corresponding with the polymer latent image. A multi-color image comprising yellow 16, magenta 17 and cyan 18 as shown in FIG. 19 is formed on the image-receiving layer 11. A layer of black may be further provided if necessary.

The photosensitive material used in the the image forming method (C) may not be limited to the photosensitive material (G-a) as shown in FIG. 17, and may be of any embodiment so long as it comprises the photosensitive material (G), previously described. It, however, should preferably be any of the photosensitive materials (G-a) to (G-f).

Detailed embodiments in the above respective steps of the the image forming method (C) may be entirely the same as those in the image forming methods (A) and (B), previously described.

Another embodiment of the image forming method of the present invention is an image forming method, using a first sheet containing a photosensitive silver halide, an organic silver salt and a reducing agent, and a second sheet containing a heat-diffusible coloring matter, any one or both of which contain a polymerizable polymer precursor and a photopolymerization initiator; which comprises the steps of:

a) subjecting the first sheet to imagewise exposure;
b) forming a laminate by laminating the first sheet and the second sheet;
c) heating the laminate;
d) subjecting the laminate to whole areal exposure; and
e) heating at least the second sheet to transfer the heat-diffusible coloring matter to an image-receiving material (hereinafter "the image forming method (D)" of the present invention).

A further embodiment of the image forming method of the present invention is an image forming method using a first sheet containing a photosensitive silver halide, an organic silver salt and a reducing agent, and a second sheet containing a heat-diffusible coloring matter, any one or both of which contain a polymerizable polymer precursor and a photopolymerization initiator; which comprises the steps of:

a) subjecting the first sheet to imagewise exposure;
b) heating the first sheet;
c) forming a laminate by laminating the first sheet and the second sheet;
d) heating the laminate;
e) subjecting the laminate to whole areal exposure; and
f) heating at least the second sheet to transfer the heat-diffusible coloring matter to an image-receiving material (hereinafter referred to as "the image forming method (E)" of the present invention).

A still further embodiment of the image forming method of the present invention is an image forming method using a first sheet containing a photosensitive silver halide, an organic silver salt, a reducing agent, a polymerizable polymer precursor and a photopolymerization initiator and a second sheet containing a heat-diffusible coloring matter, which comprises the steps of:

a) subjecting the first sheet to imagewise exposure;
b) heating the first sheet;
c) subjecting the first sheet to whole areal exposure;
d) forming a laminate by laminating the first sheet and the second sheet; and
e) heating the laminate to transfer the heat-diffusible coloring matter to an image-receiving material (hereinafter referred to as "the image forming method (F)" of the present invention).

Namely, these are methods carried out by laminating the first sheet and the second sheet in the course of the steps.

The above first sheet and second sheet may be laminated after the oxidized product has been produced in the first sheet, i.e., after the imagewise exposure and heating of the first sheet have been carried out (the image forming method (E). However, as in the image forming method (D) of the present invention, the first layer and second layer may be laminated immediately after the imagewise exposure, so that the oxidation-reduction reaction and thermal conversion of the oxidized product can be achieved by the first heating.

In the step (c) of the image forming method (D) and the step (d) of the image forming method (E), a part of the oxidized product of the reducing agent, produced in the first layer is heat-moved to the second sheet, so that a latent image comprising the above oxidized product or the oxidized product and reducing agent is formed in the second sheet.

In the laminating in the step (b) of the image forming method (D) and the step (c) of the image recording method (E), the sheets may preferably be brought into direct contact, but may be brought into contact with distance to a certain extent so long as the oxidized product can be moved to the second sheet.

The polymerization of the second sheet in the step (d) of the image forming method (D) and the step (e) of the image forming method (E) may also be carried out after it has been separated from the first sheet. The first and second sheets may further be of multi-layer structure. For example, the second sheet may comprise a layer containing the polymerizable element and a layer containing the coloring matter. As the first sheet, there may also be used a laminate in which two layers are laminated where one contains the photosensitive silver halide, the organic silver salt and the reducing agent, and the other contains the polymerizable polymer precursor and the photopolymerization initiator.

Embodiments other than the above described, in the respective steps of the image forming method (D) may be the same as those in the image forming methods (A) to (C), previously described.

In the photosensitive material of the present invention, a latent image pattern is formed on photosensitive silver halide grains in the area imagewise exposed to light, and the latent image acts as a reaction catalyst to produce the oxidized product having a polymerization inhibitory power. The area in which the oxidized product has been formed is not polymerized in the next step of whole areal exposure, and the heat-diffusible coloring matter in the photosensitive material is diffused in the course of the last heating step. An image is thus formed. In this way, in the color image forming method making use of the photosensitive material of the present invention in which the color image is formed on the area of an image-receiving material corresponding to the latent image formed area, the color image is formed on the image-receiving material at its area corresponding to the imagewise exposed area, when a negative photosensitive silver halide having a good storage stability is used. Recently, methods of carrying out imagewise exposure according to the digital exposure using semiconductor lasers, He—Ne lasers, LED or the like are prevailing. Thus, in the case of usual characters or images, usual image scan is preferred because of the advantage that it requires a lower exposure ratio than back scan and hence the life of light sources can be prolonged. In the instance of the photosensitive material disclosed in Japanese Patent Application Laid-Open No. 61-75342, the area in which no silver latent image is present, i.e., the area in which the reducing agent remains is polymerized to form a polymerized pattern which is reverse to that of the present invention. In this instance, the same polymerized pattern as in the image forming method using the photosensitive material of the present invention, wherein no polymerization takes place in the imagewise exposed area in which the latent image has disappeared and the reducing agent remains, if a positive photosensitive silver halide (or internal latent image silver halide) is used. The positive internal latent image silver halide, however, is not preferred because of its poor storage stability. Thus, even using the photosensitive polymerizable element disclosed in Japanese Patent Application laid-Open No. 61-75342, the color image can not stably be formed on the image-receiving paper at its part corresponding to the imagewise exposed area as in the present invention.

EXAMPLES

The present invention will be described below by giving Examples. In the following, the "part(s)" is by weight.

Example 1

In 10 parts of a toluene-isopropanol mixed solution in which 0.8 part of polyvinyl butyral was dissolved, 0.1 part of AgBr and 0.6 part of silver behenate and 0.45 parts of behenic acid were dispersed. Subsequently, 0.5 part of 4-methoxynaphthol and 0.1 part of phthatazinone were dissolved in the resulting solution to obtain Solution A.

Apart therefrom, 0.16 part of 2,4-diethylthioxanthone ($\lambda max=380$ nm), 0.04 part of ethyl p-dimethylaminobenzoate, 2.0 parts of pentaerythritol tetraacrylate, 3.0 parts of a methyl methacrylatebutyl methacrylate copolymer and 1.8 parts of 1-methylaminoanthraquinone ($\lambda max=520$ nm) as a heat-diffusible dye were dissolved in 10 parts of methyl ethyl ketone to obtain Solution B.

These were next throughly blended in a proportion of Solution A: Solution B=1:5 (in weight ratio), and the resulting solution was applied to a polyethylene terephthalate (PET) film of 6 $\mu$m thick having been subjected to a heat-resisting treatment, using an applicator so as to give a dried film thickness of 2 $\mu$m, thereby providing a photosensitive layer. On this layer, a polyvinyl alcohol (PVA) film of 3 $\mu$m thick was further provided. On the PVA layer formed on the photosensitive layer, a negative film was laid, followed by exposure to light. The exposure was carried out for 10 msec using as a light source a fluorescent lamp having a fluorescent peak at 420 nm, which was set with a distance of 5 cm from the photosensitive layer.

The negative film was thereafter removed, and the PET film having the photosensitive layer was allowed to pass through a heat developing machine controlled to 105° C., in 20 seconds. The PET film thus processed was placed on a hot plate heated to 60° C., which was irradiated with light from a fluorescent lamp having a fluorescent peak at 380 nm, with a distance of 5 cm for 40 seconds.

Here, the completely polymerized area and completely unpolymerized area of a polymer image formed were taken out and measurement of Tg at the respective areas was made using a visco-elasticity measuring method. As a result, $Tg_2$ at the polymerized area was found to be 115° C.; and $Tg_1$ at the unpolymerized area, 20° C. Namely, $Tg_2-Tg_1=95°$ C.

Subsequently, the PVA film was removed by washing with water. Next, water was well removed. Thereafter, using as an image-receiving material a synthetic paper provided with an image-receiving layer formed with polyester resin, the photosensitive layer and the image-receiving layer were laid overlapping face-to-face, followed by heating from the PET film side at 115° C. for 20 seconds, thereby diffusion-transferring the dye from the photosensitive layer to the image-receiving layer. Thus, a sharp red dye image was obtained on the image-receiving paper. The dye image obtained corresponding to the silver latent image area (i.e., the area in which a silver image was produced by heating).

The above processings were all carried out in a darkroom.

Example 2

Example 1 was repeated to form a photosensitive layer protected with a PVA film, except that 0.5 part of silver benzotriazole was used in place of 0.6 part of silver behenate.

The latent image was further formed in the same manner as Example 1. Thereafter, the PET film having the photosensitive layer was allowed to pass through a heat developing machine controlled to 120° C., in 20 seconds. Subsequently, the whole areal exposure, washing with water, drying, and diffusion transfer of the dye were carried out in the same manner as Example 1. As a result, a sharp red dye image was obtained on the image-receiving paper.

In the present Example, the measurement of Tg revealed that $Tg_2=145°$ C., $Tg_1=30°$ C. and $Tg_2-Tg_1=115°$ C.

Example 3

In 10 parts of ethanol, 0.2 part of AgBrI, 0.5 part of silver behenate, 0.4 part of behenic acid, and 0.2 part of 8-hydroxyquinoline, 0.2 part of phthalazinone and 0.5 part of polyvinyl butyral were dispersed and dissolved to obtain Solution A.

Apart therefrom, 3.5 part of polymethyl methacrylate, 2.7 parts of trimethylolpropane triacrylate as a polymerizable polymer precursor, 0.26 part of benzyl dimethyl ketal ($\lambda max=340$ nm) and 3 parts of a compound of the following formula were dissolved in 10 parts of methyl ethyl ketone to obtain Solution B.

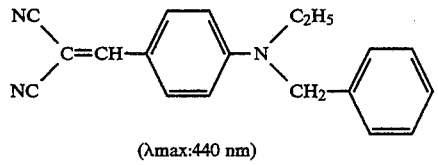

($\lambda max$:440 nm)

These were next throughly blended in a proportion of Solution A: Solution B=1:4 (in weight ratio) to prepare a coating solution. Subsequently, a photosensitive layer was formed in the same manner as Example 1.

On a PVA layer on the photosensitive layer thus obtained, a negative film was laid, followed by irradiation with light over it, from a fluorescent lamp of 420 nm for 20 msec with a distance of 5 cm, to form a latent image.

Subsequently, the material thus processed was allowed to pass through a heat developing machine controlled to 120° C., in 20 seconds. As a result, a silver image was produced in the latent image area. The whole area was further irradiated with light from a fluorescent lamp of 335 nm for 30 seconds with a distance of 3 cm. Thereafter, the PVA layer was removed by washing with water, and the dye was transferred on image-receiving paper in the same manner as Example 1. As a result, a sharp yellow dye image corresponding with the silver latent image area was obtained on the image-receiving paper.

In the present Example, the measurement of Tg revealed that $Tg_2=110°$ C., $Tg_1=10°$ C., and $Tg_2-Tg_1=100°$ C.

Comparative Example 1

Example 1 was repeated to prepare a photosensitive material, except that 2,4-diethylthioxanthone and ethyl p-dimethylaminobenzoate used in Example 1 as photopolymerization initiators were replaced with azobisisobutylonitrile as a thermopolymerization initiator. Then, a negative film was laid on the photosensitive layer, followed by exposure to light for 10 msec using as a light source a fluorescent lamp having a fluorescent peak at 420 nm, with a distance of 5 cm to form a latent image.

Thereafter, the negative film was removed, and the resulting material was allowed to pass through a heat developing machine controlled to 105° C., in 20 seconds. The PVA layer was further removed by washing with water, followed by air drying. The resulting material was laminated with image-receiving paper, which were heated at 130° C. for 20 seconds so that the dye may be diffusion-transferred from the photosensitive layer to the image-receiving layer. However, no dye image was imagewise obtained, with a poor contrast, resulting in the whole dying.

Example 4

| | |
|---|---|
| Behenic acid | 4 parts |
| AgBr | 1.2 parts |
| Silver behenate | 7 parts |
| Phthalazinone | 1.2 parts |
| Polyvinyl butyral | 10 parts |
| Toluene-butanol | 120 parts |
| 2,2'-Methylenebis(4,6-di-t-butylphenol) | 6 parts |
| 2,4-diethylthioxanthone($\lambda max = 380$ nm) | 3 parts |
| Ethyl p-dimethylaminobenzoate | 1 part |
| Pentaerythritol tetraacrylate | 20 parts |
| Acrylate-styrene copolymer | 20 parts |
| 1-Amino-2(p-methylphenoxy)-4-hydroxy-anthraquinone($\lambda max = 514$ nm, diffusible dye) | 6 parts |
| Methyl ethyl ketone | 40 parts |

The above composition was weighed, and dispersed and dissolved using a paint shaker to obtain a solution.

The solution was applied to a polyester film of 15 $\mu$m thick using an applicator so as to give a dried film thickness of 4 $\mu$m, and a polyvinyl alcohol (PVA) layer of 3 $\mu$m thick was further provided on the film to provide a photosensitive material of the present invention.

On the PVA layer formed on the photosensitive layer of the photosensitive material thus prepared, a negative film was laid, followed by exposure to light to carry out formation of a silver latent image.

The exposure was carried out for 1 second using as a light source a fluorescent lamp having a fluorescent peak at 420 nm, which was set with a distance of 5 cm from the photosensitive layer.

The negative film was thereafter removed, and the photosensitive material was allowed to pass through a heat developing machine controlled to 125° C., in 8 seconds to obtain silver image and oxidized product in the silver latent image area. The material thus processed was placed on a hot plate heated to 60° C., which was irradiated with light from a fluorescent lamp having a fluorescent peak at 390 nm, with a distance of 5 cm for 60 seconds. As a result, the non-latent image area was polymerized and the latent image area was unpolymerized.

Here, the completely polymerized area and completely unpolymerized area of the latent image were taken out and measurement of Tg at the respective areas was made using a visco-elasticity measuring method. As a result, $Tg_2$ at the polymerized area was found to be 110° C.; and $Tg_1$ at the unpolymerized area, 20° C. Namely, $Tg_2-Tg_1=90°$ C.

Subsequently, the PVA film was removed by washing the photosensitive material with water. Next, water was well removed. Thereafter, using as an image-receiving material a synthetic paper provided with an image-receiving layer formed with polyester resin, the photosensitive layer and the image-receiving layer were laid overlapping face-to-face, followed by heating from the photosensitive material side at 100° C. for 10 seconds, thereby diffusion-transferring the dye in the photosensitive layer to the image-receiving layer. Thus, a sharp red dye image corresponding to the silver latent image area was obtained on the image-receiving paper.

In the above transfer process, the dye in the unpolymerized area was transferred to the image-receiving layer in a good state, and the resulting transferred image area had an optical density of not less than 2.0. On the other hand, the dye in the polymerized area was little transferred, and the optical density on the image-receiving layer at the area corresponding to the polymerized area, i.e., "fog density", was about 0.03.

Images were also formed using various temperatures within the temperature range of not less than 20° C. ($Tg_1$) and less than 110° C. ($Tg_2$). As a result, in all the cases the fog density was not more than 0.10, and the transferred image area showed an optical density of not less than 1.50 at the temperature at which the dye is sufficiently sublimated (i.e., not less than 90° C.).

Example 5

| | |
|---|---|
| AgBrI | 0.2 part |
| Silver behenate | 0.5 part |
| Behenic acid | 0.4 part |
| 1-Methoxy-5-hydroxyanthracene | 0.4 part |
| Phthaladinone | 0.08 part |
| Toluene/isopropanol (1:1) | 10 parts |
| Methyl ethyl ketone | 20 parts |
| Polymethyl methacrylate | 1.0 part |
| Diffusible dye of the following formula | 0.4 parts |

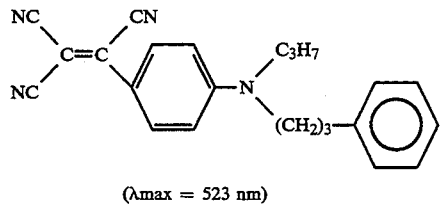

($\lambda$max = 523 nm)

| | |
|---|---|
| Kayarad DPHA | 0.8 parts |
| (available from Nihon Kayaku Co., Ltd.) | |
| 2-Chlorothioxanthone($\lambda$max = 380 nm) | 0.25 part |
| Ethyl p-dimethylaminobenzoate | 0.2 part |

The above were dispersed and dissolved to obtain a dispersion.

The above dispersion was applied on a polyethylene terephthalate (PET) film of 6 μm thick having been subjected to a heat-resisting treatment, using an applicator so as to give a dried film thickness of 3 μm, thereby providing a photosensitive layer. A polyvinyl alcohol (PVA) layer of 3 μm thick was further provided on the layer to provide a photosensitive material of the present invention.

On the PVA layer of the photosensitive material thus prepared, a negative film was laid, followed by exposure to light after its image to carry out formation of a latent image.

The exposure was carried out using as a light source a fluorescent lamp of 420 nm and a 15 W electric power, which was set with a distance of 5 cm from the photosensitive layer.

The negative film was thereafter removed, and the photosensitive material was allowed to pass through a heat developing machine controlled to 120° C., in 20 seconds. The whole area of the material thus processed was further irradiated with light from a fluorescent lamp of 390 nm and a 15 W electric power, with a distance of 3 μm for 45 seconds.

Here, the polymerized area and unpolymerized area of the latent image were taken out and measurement of Tg at the respective areas was made using a visco-elasticity measuring method. As a result, $Tg_2$ at the polymerized area was found to be 130° C.; and $Tg_1$ at the unpolymerized area, 30° C. Namely, $Tg_2-Tg_1=100°$ C.

Subsequently, the PVA film and photosensitive layer were removed, and the dye was transferred to image-receiving paper. Thus, a sharp red dye image corresponding with the silver latent image was obtained on the image-receiving paper.

In the above transfer process, the dye in the unpolymerized area was transferred to the image-receiving layer in a good state, and the resulting transferred image area had an optical density of 1.7. On the other hand, the dye in the polymerized area was little transferred, and the fog density was about 0.04.

Images were also formed using various temperatures within the temperature range of not less than 60° C. ($Tg_1$) and less than 150° C. ($Tg_2$). As a result, in all the cases the fog density was not more than 0.10, and the transferred image area showed an optical density of not less than 1.5 at the temperature at which the dye is sufficiently sublimated (i.e., not less than 100° C.).

Example 6

(Preparation of photosensitive layer)

The following composition was stirred using a homomixer under conditions of 5,000 rpm for 10 minutes to prepare an emulsion.

| | |
|---|---|
| Silver bromide | 1 part |
| Silver behenate | 5 parts |
| 4-Methoxynaphthol | 3.5 parts |
| Behenic acid | 2 parts |
| Phthalazinone | 0.8 part |
| Polyvinyl butyral | 10 parts |
| (degree of polymerization: 2,200) | |
| Isopropanol | 40 parts |
| Xylene | 40 parts |

Next, this emulsion was applied to a polyester film by using an applicator so as to give a dried film thickness of 4 μm, to obtain a photosensitive layer.

(Preparation of polymerizing layer)

The following composition was thoroughly stirred and uniformly dispersed to prepare a coating solution.

| | |
|---|---|
| Polymethyl methacrylate (Tg: 100° C.) | 50 parts |
| Trimethylolpropane triacrylate | 50 parts |
| 2,4-Diethylthioxanthone($\lambda$max = 380 nm) | 10 parts |
| Ethyl dimethylaminobenzoate | 10 parts |
| 1-Amino-2 (p-methylphenoxy)-4-hydroxy-anthraquinone($\lambda$max = 515 nm) | 10 parts |
| Methyl ethyl ketone | 870 parts |

Next, this coating solution was applied on the photosensitive layer, using an applicator so as to give a dried film thickness of 4 μm, immediately followed by drying, and a polyester film was further laminated on the resulting polymerizing layer, to obtain a photosensitive material.

(Image formation)

A step tablet was laid overlapping on the substrate side of the photosensitive material, which was exposed to light for 50 msec from the substrate side, using a 10 W electric power fluorescent lamp having a fluorescent peak at 420 nm, with a distance of 2 cm, to form a imagewise silver latent image. $Tg_2$ at the polymerized area was found to be 145° C.; Tg$_1$ at the unpolymerized area, 40° C.; and thus Tg$_2$−Tg$_1$=105° C.

Next, the mask was removed, and the material thus processed was passed through a heat developing machine controlled to 105° C., in 10 seconds to cause oxidation-reduction reaction to take place in the photosensitive layer. As a result, a silver image was imagewise formed in the latent image area.

Next, the photosensitive material was further heated under conditions of 125° C. and 20 seconds to make the oxidized product move to the polymerizing layer. Then the polymerizing layer of the photosensitive material was exposed to light for 20 seconds over its whole area from the laminate film side, using a 15 W fluorescent lamp having a fluorescent peak at 390 nm, with a distance of 2 cm. As a result, the area corresponding to the imagewise unexposed area (non-latent image area) was polymerized. Next, after the laminate film was peeled, the polymerizing layer and image-receiving paper were laid overlapping face-to-face, followed by heating at 100° C. for 10 seconds, for then the photosensitive material and image-receiving paper were peeled. As a result, in the area corresponding to the imagewise unexposed area, the diffusion of the red dye contained therein was suppressed as a result of the formation of a polymer image. In the imagewise exposed area, on the other hand, the polymerization was restricted and the red dye was diffused as a result of the transfer of the oxidized product of 4-methoxynaphthol, so that a red dye image of a negative relationship to the step tablet were obtained on the image-receiving paper. The resulting image was sharp and had superior brightness and chroma, also having density gradation corresponding to the step tablet.

Example 7

(Preparation of photosensitive layer)

The following composition was stirred using a homomixer under conditions of 5,000 rpm for 10 minutes to prepare an emulsion.

| | |
|---|---|
| Silver bromide | 1 part |
| Silver behenate | 5 parts |
| 2,2′-methylenebis(4-methylphenol) | 3 parts |
| Behenic acid | 2 parts |
| Phthalazinone | 0.6 part |
| Polyvinyl butyral | 10 parts |
| Isopropanol | 40 parts |
| Xylene | 39 parts |

Next, this emulsion was applied to a polyester film of 50 μm thick, using an applicator so as to give a dried film thickness of 4 μm to obtain a photosensitive layer.

(Preparation of polymerizing layer)

The following composition was stirred using a homomixer under conditions of 5,000 rpm for 10 minutes to prepare a coating solution.

| | |
|---|---|
| Polymethyl methacrylate | 50 parts |
| Kayarad DPHA (available from Nihon Kayaku Co., Ltd.) | 50 parts |
| Benzyl dimethyl ketal (λmax = 340 nm) | 15 parts |
| Diffusible dye of the formula: | 10 parts |

-continued

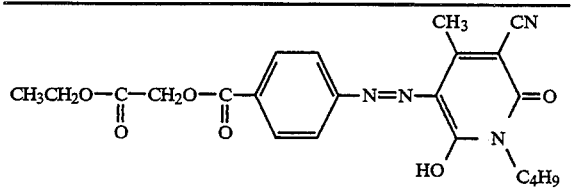

(λmax = 426 nm)

| | |
|---|---|
| Methyl ethyl ketone | 875 parts |

Next, this coating solution was applied to a polyester film, using an applicator so as to give a dried film thickness of 3 μm to obtain a polymerizing layer.

(Image formation)

A step tablet was laid overlapping on the photosensitive material, which was exposed to light for 50 msec from the step tablet side, using a 15 W electric power fluorescent lamp having a fluorescent peak at 420 nm, with a distance of 2 cm to form a silver latent image.

Next, the step tablet was removed, and the material thus processed was allowed to pass through a heat developing machine controlled to 120° C., in 10 seconds. As a result, a silver image was formed in the imagewise exposed area (the latent image area). Then the photosensitive layer and polymerizing layer were brought into direct face-to-face contact, followed by heating under conditions of 125° C. and 20 seconds, to cause the distribution of the oxidized product of 2,2′-methylenebis(4-methylphenol) in the photosensitive layer move to the polymerizing layer. The photosensitive layer and polymerizing layer were separated by peeling. The polymerizing layer was laminated with a polyester film, and the whole area thereof was subjected to exposure for 30 seconds using a 15 W fluorescent lamp having a fluorescent peak at 340 nm, with a distance of 2 cm. Tg$_1$ at the unpolymerized area was found to be 40° C.: Tg$_2$ at the polymerized area, 138° C.; and thus Tg$_2$−Tg$_1$=98° C.

Next, the polyester film laminated was peeled, and the polymerizing layer was laminated on image-receiving paper, followed by heating at 100° C. for 10 seconds. As a result, the yellow dye contained was diffusion-transferred, and thus a yellow dye image of a negative relationship to the step tablet was obtained on the image-receiving paper at its area corresponding to the silver latent image area. The resulting image was sharp and had superior brightness and chroma, also having density gradation corresponding with the step tablet.

Example 8

| | |
|---|---|
| Heat-diffusible dye: | |
| 1-Amino-2(p-methylphenoxy)-4-hydroxyanthraquinone | 2.5 parts |
| Methyl methacrylate/n-butyl acrylate copolymer | 7.5 parts |
| Methyl ethyl ketone | 90 parts |

The above composition was weighed out, and uniformly dissolved by means of an ultrasonic dispersion machine to obtain Solution A.

| | |
|---|---|
| Behenic acid | 4 parts |
| AgBr | 1 part |
| Silver behenate | 5 parts |
| 4-Methoxy-1-naphthol | 0.6 part |

-continued

| | |
|---|---|
| Phthalazinone | 2.5 parts |
| Trimethylolpropane triacrylate | 10 parts |
| 2,4-Diethylthioxanthone | 1.5 parts |
| Ethyl dimethylaminobenzoate | 1.5 parts |
| Poly-t-butyl methacrylate | 10 parts |
| Ethanol | 164.5 parts |

The above composition was weighed, and dispersed using a paint shaker to obtain Solution B.

Solution A was applied on a polyethylene terephthalate (PET) film of 22 μm thick using an applicator so as to give a dried film thickness of 4 μm to provide a coloring material layer.

Next, Solution B was applied to the coloring material layer, using an applicator so as to give a dried film thickness of 2 to 3 μm to provide a photosensitive layer. A polyvinyl alcohol (PVA) layer of 3 μm thick was further provided on the photosensitive layer to prepare a photosensitive material of the present invention.

On the PVA layer formed on the photosensitive material of the present invention thus prepared, a negative film was laid, followed by exposure to light to carry out formation of a silver latent image.

The exposure was carried out for 10 msec using as a light source a fluorescent lamp having a fluorescent peak at 420 nm, which was set with a distance of 5 cm from the photosensitive material.

The negative film was thereafter removed, and the PET film on the photosensitive material was allowed to pass through a heat developing machine controlled to 115° C., in 25 seconds to form a silver image in the imagewise exposed area. The material thus processed was further placed on a hot plate heated to 60° C., which was irradiated with light from a fluorescent lamp having a fluorescent peak at 390 nm, with a distance of 5 cm for 45 seconds to polymerize the imagewise unexposed area (non-latent image area). $Tg_1$ at the unpolymerized area was found to be 30° C.; $Tg_2$ at the polymerized area, 115° C.; and thus $Tg_2-Tg_1=85°$ C.

Subsequently, the PVA film was removed by washing with water, followed by drying. Thereafter, using as an image-receiving material a synthetic paper provided thereon with an image-receiving layer formed with polyester resin, the photosensitive material and the image-receiving layer were laid overlapping face-to-face, followed by heating from the PET film side under at 100° C. for 20 seconds, thereby diffusion-transferring the dye from the photosensitive material to the image-receiving layer. Thus, a sharp red dye image corresponding to the imagewise exposed area was obtained on the image-receiving paper. The optical density at the area corresponding to the imagewise unexposed area was as low as 0.04 with very little ground fog.

Example 9

| | |
|---|---|
| Heat-diffusible dye: | |
| 1-Amino-2(p-methylphonoxy)-4-hydroxyanthraquinone | 2.5 parts |
| Binder: | |
| Polyvinyl butyral | 7.5 parts |
| m-Butanol/xylene (50/50) | 90 parts |

The above composition was weighed out, and uniformly dissolved by means of an ultrasonic dispersion machine to obtain Solution C.

| | |
|---|---|
| Behenic acid | 4 parts |
| AgBrI | 0.8 part |
| Silver behenate | 5 parts |
| 2,2'-Methylenebis(4,6-di-t-butylphenol) | 2 parts |
| Phthalazinone | 1 part |
| Kayarad DPHA | 15 parts |
| (available from Nihon Kayaku Co., Ltd.) | |
| Polymethyl methacrylate | 15 parts |
| 2,4-Diethylthioxanthone | 2 parts |
| Ethyl dimethylaminobenzoate | 2 parts |
| Methyl ethyl ketone | 154.2 parts |

The above composition was weighed, and dispersed using a paint shaker to obtain Solution D.

Solution C was applied to a PET film of 22 μm thick, using an applicator so as to give a dried film thickness of 2 to 3 μm. Thus a PET film provided with a coloring material layer was obtained.

Next, Solution D was applied to a PET film of 12 μm thick, using an applicator so as to give a dried film thickness of 4 to 5 μm. Thus a PET film provided with a photosensitive layer was obtained.

The coating surfaces of the PET films respectively having the coloring material layer and photosensitive layer were brought into direct face-to-face contact and laminated at 80° C. for 1 kg/cm, to prepare a photosensitive material comprising the PET film of 22 μm thick, coloring material layer, photosensitive layer, and PET film of 12 μm thick which were laminated in this order.

On the PVA layer formed on the photosensitive material of the present invention thus prepared, a negative film was laid, followed by exposure to light to carry out formation of a silver latent image.

The exposure was carried out for 10 msec using as a light source a fluorescent lamp having a fluorescent peak at 420 nm, which was set with a distance of 5 cm from the photosensitive material.

The negative film was thereafter removed, and the photosensitive material was passed through a heat developing machine controlled to 115° C., in 20 seconds to form a silver image in the imagewise exposed area (latent image area). The material thus processed was further placed on a hot plate heated to 60° C., which was irradiated with light from a fluorescent lamp having a fluorescent peak at 390 nm, with a distance of 5 cm for 35 seconds to form a polymer image in the imagewise unexposed area. $Tg_1$ at the unpolymerized area was found to be 25° C.; $Tg_2$ at the polymerized area, 120° C.; and thus $Tg_2-Tg_1=95°$ C.

Subsequently, the PVA film on the photosensitive layer side was removed, followed by drying. Thereafter, using as an image-receiving material a synthetic paper provided thereon with an image-receiving layer formed with polyester resin, the photosensitive material and the image-receiving layer were laid overlapping face-to-face, followed by heating at 110° C. and 10 seconds, thereby diffusion-transferring the dye from the photosensitive material to the image-receiving layer. Thus, a sharp red dye image corresponding to the imagewise exposed area was obtained on the image-receiving paper. The optical density at the area corresponding to the imagewise unexposed area was as low as 0.04 with very little fogging.

Example 10

| |
|---|
| Heat-diffusible dye: |

-continued

| | |
|---|---|
| 1-Amino-2(p-methylphenoxy)-4-hydroxy-anthraquinone | 2.5 parts |
| Photopolymerization initiator: | |
| 2,4-Diethylthioxanthone | 1.5 parts |
| Ethyl dimethylaminobenzoate | 1 part |
| Polymer precursor: | |
| Trimethylolpropane triacrylate | 10 parts |
| Binder: | |
| Polymethyl methacrylate (Tg: 105° C.) | 10 parts |
| Solvent: | |
| Methyl ethyl ketone | 75 parts |

The above composition was weighed out, and uniformly dissolved using an ultrasonic dispersion machine to obtain Solution A. Solution A was applied to a polyester film of 12 μm thick having been subjected to anchoring, so as to give a dried film thickness of 4 to 5 μm to provide a coloring material layer.

| | |
|---|---|
| Behenic acid | 4 parts |
| Phthalazinone | 1.5 parts |
| AgBr | 1.2 part |
| Silver behenate | 7 parts |
| Polyvinyl butyral | 10 parts |
| Pentaerithritol tetraacrylate | 4 parts |
| 1,1'-Dihydroxy-2,2'-binaphthyl | 5 parts |
| 2,4-diethylthioxanthone | 0.5 part |
| Ethyl dimethylaminobenzoate | 0.4 part |
| Toluene/butanol | 120 parts |

The above composition was weighed, and thoroughly blended using a paint shaker to obtain Solution B.

Solution B was applied to the substrate provided with the coloring material layer so as to give a dried film thickness of 5 to 6 μm to provide a photosensitive layer.

On the photosensitive material of the present invention thus prepared, a lithographic film was laid, followed by imagewise exposure by irradiation with light for 1 second using a fluorescent lamp having a fluorescent peak at 420 nm, with a distance of 5 cm to carry out formation of a silver latent image.

The lithographic film was thereafter removed, and the photosensitive material was passed through a heat developing machine at 120° C. in 20 seconds to form a silver image in the imagewise exposed area. The material thus processed was further placed on a hot plate heated to 60° C., which was irradiated with light from a fluorescent lamp having a fluorescent peak at 390 nm, with a distance of 1 cm for 40 seconds to form polymer images in the imagewise unexposed areas of the photosensitive layer and coloring material layer.

An image-receiving material comprising synthetic paper provided thereon with an image-receiving layer formed with polyester resin, and the photosensitive layer were directly laid overlapping face-to-face, followed by heating from the photosensitive material side at 100° C. for 20 seconds, thereby diffusion-transferring the dye from the coloring material layer to the image-receiving layer. Thus, a sharp red dye image corresponding with the imagewise exposed area was obtained on the image-receiving paper.

The above processings were all carried out in a darkroom.

The O.D. value at the imagewise exposed area was 1.10, and the O.D. value at the imagewise unexposed area was 0.02.

The completely polymerized area and unpolymerized area of this latent image were taken out and measurement of Tg at the respective areas was made using a visco-elasticity measuring method. As a result, $Tg_2$ at the polymerized area was found to be 120° C.; and $Tg_1$ at the unpolymerized area, 28° C.

Example 11

(Formation of coloring material layer)

| | |
|---|---|
| Acrylic resin (glass transition point Tg: 50° C.; Mw: 50,000) | 70 parts |
| Heat-diffusible dye: (the following formula) | 30 parts |

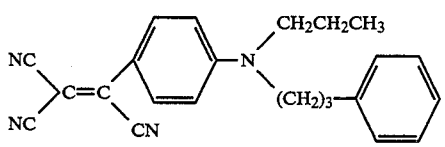

| | |
|---|---|
| Methyl ethyl ketone | 500 parts |

The above composition was weighed, and uniformly dissolved using an ultrasonic dispersion machine to obtain Solution A. Solution A was applied to a polyester film of 12 μm thick having been subjected to anchoring, so as to give a dried film thickness of 2 to 3 μm to provide a coloring material layer.

(Formation of polymerizing layer)

| | |
|---|---|
| Polyvinyl butyral (Tg: 112° C.; Mw: 20,000) | 50 parts |
| Kayarad DPHA (available from Nihon Kayaku Co., Ltd.) | 50 parts |
| 2,4-Diethylthioxanthone | 5 parts |
| Ethyl dimethylaminobenzoate | 5 parts |
| Isopropanol | 390 parts |

The above composition was weighed out, and uniformly dissolved using an ultrasonic dispersion machine to obtain Solution B. Solution B was applied to the coloring material layer so as to give a dried film thickness of 5 to 6 μm to provide a polymerizing layer.

(Formation of photosensitive layer)

| | |
|---|---|
| Behenic acid | 4 parts |
| AgBr | 1.2 parts |
| Silver behenate | 7 parts |
| Phthalazinone | 1 part |
| Polyvinyl butyral (Tg: 50° C.; Mw: 10,000) | 15 parts |
| 2,2'-Methylenebis(4-methoxyphenol) | 5 parts |
| Toluene/butanol (1:1) | 120 parts |

The above composition was weighed out, and thoroughly blended using a paint shaker to obtain Solution C. Solution C was applied on a polyester film of 12 μm thick having been subjected to anchoring, so as to give a dried film thickness of 6 to 7 μm to provide a photosensitive layer.

(Preparation of photosensitive material)

An aqueous polyvinyl alcohol (PVA) solution was applied to the photosensitive layer so as to give a dried film thickness of 1 to 2 μm to provide a peel layer. The photosensitive layer was laid overlapping on a laminate previously formed of the substrate, coloring material layer and polymerizing layer, in the manner that the PVA peel layer side may come into face-to-face contact with the polymerizing layer, followed by laminating under heating to obtain a magenta photosensitive material of the present invention.
(Image formation)

On the resulting photosensitive material, a lithographic film was laid, followed by imagewise exposure by irradiation with light for 2 seconds using a fluorescent lamp having a fluorescent peak at 420 nm, with a distance of 5 cm to carry out formation of a silver latent image.

The lithographic film was thereafter removed, and the photosensitive material was allowed to pass through a heat developing machine at 120° C. in 20 seconds to form a silver image in the imagewise exposed area. The material thus processed was further placed on a hot plate heated to 60° C., which was irradiated with light from a 10 W electric power fluorescent lamp having a fluorescent peak at 390 nm, with a distance of 1 cm for 40 seconds to form a polymer image in the polymerizing layer at the area corresponding to the imagewise unexposed area.

The photosensitive layer and PVA peel layer were peeled from the surface of the polymerizing layer. An image-receiving paper comprising synthetic paper provided with an image-receiving layer formed with polyester resin, and the polymerizing layer were directly laid overlapping face-to-face, followed by heating at 100° C. for 20 seconds, thereby diffusion-transferring the heat-diffusible dye to the image-receiving layer. Thus, a sharp red image corresponding to the imagewise exposed area was obtained on the image-receiving paper.

The above processings were all carried out in a darkroom.

The O.D. value at the imagewise exposed area was 1.22, and the O.D. value at the imagewise unexposed area was 0.02.

The completely polymerized area and completely unpolymerized area of this latent image were taken out and measurement of Tg at the respective areas was made using a visco-elasticity measuring method. As a result, $Tg_2$ at the polymerized area was found to be 135° C. and $Tg_1$ at the unpolymerized area, 30° C. .

Example 12
(Preparation of photosensitive material for cyan)

| | |
|---|---|
| Acrylic resin | 70 parts |
| (glass transition point Tg: 50° C.; Mw: 50,000) | |
| Heat-diffusible cyan dye: (the following formula) | 30 parts |

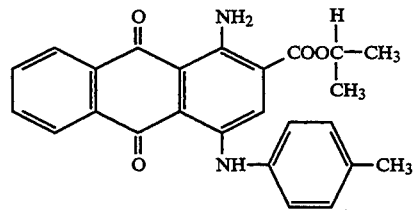

| | |
|---|---|
| Methyl ethyl ketone | 400 parts |

Using the above composition, a coating solution was prepared in the same manner as Example 11 to form a layer containing the heat-diffusible coloring matter.

A photosensitive material for cyan was prepared in the same manner as Example 11 but using the above heat-diffusible coloring matter-containing layer.
(Preparation of photosensitive material for yellow)

A photosensitive material for yellow was prepared in the same manner as the above photosensitive material for cyan, but using a heat-diffusible yellow dye of the following formula as the heat-diffusible coloring matter.

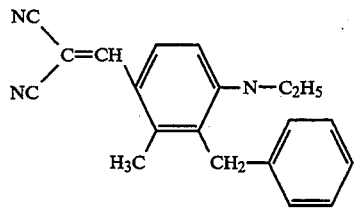

(Image formation)

First, using the photosensitive material for magenta in Example 11, a red image was formed following the same procedures as Example 11. Next, using the above photosensitive material for cyan, the cyan dye was transferred onto the red image following the similar procedures. Similarly, using the photosensitive material for yellow, the yellow dye was further transferred onto it.

The image obtained in the above way was a sharp full-color image comprised of the three dyes of yellow, magenta and cyan colors, having superior brightness and chroma.

Example 13

(Emulsion A for magenta)

| | |
|---|---|
| Silver behenate | 5.0 parts |
| Behenic acid | 4.0 parts |
| Silver bromide | 1.0 part |
| 4-Methoxy-1-naphthol | 2.5 parts |
| Phthalazinone | 1 part |
| Polymethyl methacrylate | 10.0 parts |
| Kayarad DPHA | 10.0 parts |
| (available from Nihon Kayaku Co., Ltd.) | |
| 2,4-Diethylthioxanthone | 2.0 parts |
| Ethyl dimethylaminobenzoate | 1.0 parts |
| 1-Amino-2(p-methylphenoxy)-4-hydroxy-anthraquinone | 2.0 parts |
| Methyl ethyl ketone | 90 parts |
| Xylene | 50 parts |
| n-Butanol | 30 parts |

The above composition was thoroughly dispersed using a homomixer to prepare Emulsion A for magenta.
(Emulsion B for cyan)

| | |
|---|---|
| Silver behenate | 5.0 parts |
| Behenic acid | 4.0 parts |
| Silver bromide | 1.0 part |
| 4-Methoxy-1-naphthol | 2.5 parts |
| Phthalazinone | 1 part |
| Polymethyl methacrylate | 10.0 parts |
| Trimethylolpropane triacrylate | 10.0 parts |
| Benzyl dimethyl ketal | 2.0 parts |
| Head-diffusible dye of the formula: | 2.0 parts |

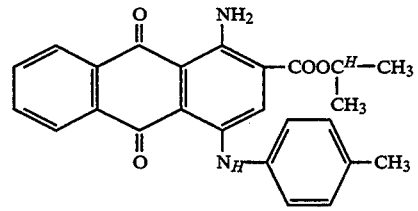

| | |
|---|---|
| Methyl ethyl ketone | 90 parts |

-continued

| | |
|---|---|
| Xylene | 50 parts |
| n-Butanol | 30 parts |

The above composition was thoroughly dispersed using a homomixer to prepare Emulsion B for cyan.

(Emulsion C for yellow)

| | |
|---|---|
| Silver behenate | 5.0 parts |
| Behenic acid | 4.0 parts |
| Silver bromide | 1.0 part |
| 4-Methoxy-1-naphthol | 2.5 parts |
| Phthalazinone | 1 part |
| Polymethyl methacrylate | 10.0 parts |
| Kayarad DPHA (available from Nihon Kayaku Co., Ltd.) | 10.0 parts |
| Benzyl dimethyl ketal | 2.5 parts |
| Head-diffusible dye of the formula: | 2.5 parts |

[chemical structure]

| | |
|---|---|
| Methyl ethyl ketone | 90 parts |
| Xylene | 60 parts |

The above composition was thoroughly dispersed using a homomixer to prepare Emulsion C for yellow.

Emulsion A for magenta, Emulsion B for cyan and Emulsion C for yellow were applied to a polyester film of 22 μm thick having been subjected to anchoring, using a three-color gravure coater so as to give a dried film thickness of 4 to 5 μm to form photosensitive layers of the respective hues in multi-colored stripes. A polyester film of 6 μm thick was further laminated on these photosensitive layers. A photosensitive material was thus obtained.

(Formation of magenta image)

On the magenta photosensitive layer of the photosensitive material, a negative lithographic film for magenta images was laid overlapping, followed by imagewise exposure using a 10 W fluorescent lamp having a fluorescent peak at 420 nm, with a distance of 2 cm for 50 msec to form an imagewise silver latent image.

The negative film was next removed, and the photosensitive material was allowed to pass through a heat developing machine controlled to 120° C., in 16 seconds to cause oxidation-reduction reaction to take place in the magenta photosensitive layer. As a result, a silver image was imagewise formed in the latent image area.

Next, the whole area of the magenta photosensitive layer was subjected to exposure to light from a 15 W electric power fluorescent lamp having a fluorescent peak at 390 nm, with a distance of 2 cm for 40 seconds to polymerize the imagewise unexposed area. The laminated polyester film was peeled, and then an image-receiving material and the magenta photosensitive layer were brought into direct face-to-face contact, followed by heating from the photosensitive material side under conditions of 100° C. and 10 seconds. The photosensitive material was peeled from the image-receiving material. As a result, a sharp magenta dye image corresponding with the imagewise exposed area was formed on the image-receiving material.

(Formation of cyan image)

On the cyan photosensitive layer of the photosensitive material, a negative lithographic film for cyan images was laid overlapping, followed by imagewise exposure using a 10 W electric powerfluorescent lamp having a fluorescent peak at 420 nm, with a distance of 2 cm for 50 msec to form an imagewise silver latent image.

The negative film was next removed, and the photosensitive material was passed through a heat developing machine controlled to 115° C., in 20 seconds to cause oxidation-reduction reaction to take place in the cyan photosensitive layer. As a result, a silver image was imagewise formed in the latent image area.

Next, the whole area of the cyan photosensitive layer was subjected to exposure to light from a 15 W electric power fluorescent lamp having a fluorescent peak at 340 nm, with a distance of 2 cm for 30 seconds to polymerize the imagewise unexposed area (non-latent image area). The laminated polyester film was peeled, and then the image-receiving material in which the magenta dye image has been formed, and the cyan photosensitive layer were brought into direct face-to-face contact, followed by heating from the photosensitive material side under conditions of 100° C. and 10 seconds. The photosensitive material was peeled from the image-receiving material. As a result, a sharp cyan dye image was formed on the image-receiving material in addition to the magenta dye image.

(Formation of yellow image)

On the yellow photosensitive layer of the photosensitive material, a negative lithographic film for yellow images was laid overlapping, followed by imagewise exposure using a 10 W electric power fluorescent lamp having a fluorescent peak at 420 nm, with a distance of 5 cm for 50 msec to form an imagewise silver latent image.

The negative film was next removed, and the photosensitive material was allowed to pass through a heat developing machine controlled to 120° C., in 12 seconds To cause oxidation-reduction reaction to take place in the yellow photosensitive layer. As a result, a silver image was imagewise formed in the latent image area.

Next, the whole area of the yellow photosensitive layer was subjected to exposure to light from a 15 W electric power fluorescent lamp having a fluorescent peak at 340 nm, with a distance of 2 cm for 40 seconds to polymerize the imagewise unexposed area. The laminated polyester film was peeled, and then the image-receiving material in which the magenta and cyan dye images have been formed, and the yellow photosensitive layer were brought into direct face-to-face contact, followed by heating from the photosensitive material side at 100° C. for 10 seconds. The photosensitive material was peeled from the image-receiving material. As a result, a sharp multi-color image comprised of magenta, cyan and yellow was formed on the image-receiving material.

The above processings were all carried out in a dark room.

Example 14

(Coating Solution A for yellow)

| | |
|---|---|
| Methyl methacrylate/ethyl methacrylate copolymer | 10.0 parts |
| Trimethyrolpropane triacrylate | 8.0 parts |
| Benzyl dimethyl ketal | 2.0 parts |
| Heat-diffusible dye of the formula: | 3.0 parts |

-continued

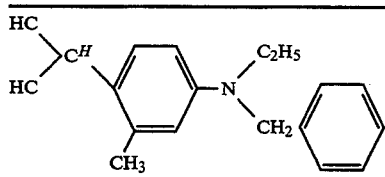

| Methyl ethyl ketone | 177 parts |

The above composition was thoroughly dispersion blended using a homomixer to prepare Coating Solution A for yellow.

(Coating Solution B for magenta)

| Polymethyl methacrylate | 10.0 parts |
| Trimethyrolpropane triacrylate | 10.0 parts |
| 2,4-Diethylthioxanthone | 2.0 parts |
| Ethyl dimethylaminovenzoate | 2.0 parts |
| 1-Amino-2(p-methylphenoxy)-4-hydroxy-anthraquinone | 3.0 parts |
| Methyl ethyl ketone | 173 parts |

The above composition was thoroughly dispersion blended using a homomixer to prepare Coating Solution B for magenta.

(Coating Solution C for cyan)

| Polymethyl methacrylate | 10.0 parts |
| Trimethyrolpropane triacrylate | 10.0 parts |
| Benzyl dimethyl ketal | 2.0 parts |
| Heat-diffusible dye of the formula: | 3.0 parts |

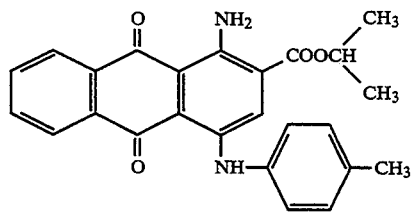

| Methyl ethyl ketone | 173 parts |

The above composition was thoroughly dispersion blended using a homomixer to prepare Coating Solution C for cyan.

Coating Solution A for yellow, Coating Solution B for magenta and Coating Solution C for cyan were applied on a polyester film 22 $\mu$m thick having been subjected to anchoring, using a three-color gravure coater so as to give a dried film thickness of 4 to 5 $\mu$m to form polymerizing layers of the respective hues in multi-colored stripes.

Sequently, the coating liquid having the following composition was prepared

| Silver behenate | 5.0 parts |
| Behenic acid | 2.0 parts |
| AgBr | 0.6 part |
| Polyvinyl butyral | 5.0 parts |
| 1,1'-Bis(2-hydroxy-35-dimethylphenyl)-3,3-dimethylpropane | 2.5 parts |
| Phthalazinone | 0.8 part |
| 1-Carboxymethyl-5-[(3-ethylnaphtho[1,2-d]oxazoline-2-indene)-diethylidene]-3-ethylthiohidantoin | 0.001 part |
| Xylene/n-butanol(50/50 v/v %) | 60 parts |

This coating liquid was applied to a polyester film of 15 $\mu$m thick so as to give a photosensitive layer having a dried film thickness of 12 $\mu$m. The polymerizing layer having been formed and the photosensitive layer were directly come into face to face, followed by lamination under a pressure at 60° C., giving a photosensitive material.

The writing of an image with a He—Ne laser (output: 5 mW) was carried out on the photosensitive layer provided on the yellow polymerizing layer of the photosensitive material, using a drum scanning laser beam printer (available from Abe Sekkei), followed by heating at 125° C. for 5 seconds to form a silver image in the exposed area of the photosensitive layer. On a hot plate of 80° C., the photosensitive material was exposed to light using a 10 W electric power fluorescent lamp having a fluorescent peak at 340 nm, with a distance of 1 cm for 40 seconds. The photosensitive layer was peeled, and then an image-receiving paper having an image-receiving layer previously formed thereon, and the yellow polymerizing layer were laid overlapping each other, followed by heating at 100° C. for 10 seconds. As a result, a sharp yellow image corresponding to the imagewise exposed area and being superior in both brightness and chroma was formed on the image-receiving paper.

Similarly, the writing of an image and heat developing were carried out on the photosensitive layer provided on the magenta polymerizing layer, under the same conditions as those for the formation of the yellow image, to form a silver image in the exposed area of the photosensitive layer. Next, the photosensitive material was exposed to light using a 10 W electric power fluorescent lamp having a fluorescent peak at 380 nm, with a distance of 1 cm for 30 seconds. The photosensitive layer was peeled, and then the image-receiving paper on which the yellow image has been formed, and the magenta polymerizing layer were laid overlapping each other, followed by heating at 100° C. for 10 seconds. As a result, a sharp magenta image corresponding to the imagewise exposed area and being superior in both brightness and chroma was formed on the image-receiving paper.

Similarly, the writing of an image and heat developing were carried out on the photosensitive layer provided on the cyan polymerizing layer, under the same conditions as those for the formation of the yellow image, to form a silver image in the exposed area of the photosensitive layer. Next, the photosensitive material was exposed to light using a 10 W electric power fluorescent lamp having a fluorescent peak at 340 nm, with a distance of 1 cm for 30 seconds. The photosensitive layer was peeled, and then the image-receiving paper on which the yellow and magenta images have been formed, and the cyan polymerizing layer were laid overlapping each other, followed by heating at 100° C. and 10 seconds. As a result, a sharp cyan image corresponding with the imagewise exposed area and being superior in both brightness and chroma was formed on the image-receiving paper.

The resulting multi-color image was an image with superior brightness and chroma.

Example 15

A dispersion comprising the following composition was prepared in a darkroom.

| | |
|---|---|
| AgBr | 0.7 part |
| Behenic acid | 2.5 parts |
| Silver behenate | 4.5 parts |
| Phthalazinone | 0.7 part |
| Polymethyl methacrylate (average molecular weight: 480,000) | 10.0 parts |
| Dipentaerythritol hexaacrylate | 10.0 parts |
| 2,4-Diethylthioxanthone | 0.4 part |
| Ethyl 4-dimethylaminobenzoate | 0.6 part |
| 4-Methoxy-1-naphthol | 2.8 parts |
| 1-Amino-2(p-methylphonoxy)-4-hydroxy-anthraquinone | 2.0 parts |
| Xylene | 60 parts |
| n-Butanol | 60 parts |

A homomixer was used in carrying out dispersion. The resulting dispersion was applied to a polyethylene terephthalate film (PET film) so as to give a dried film thickness of 5 μm.

A polyvinyl butyral layer (Tg: 115° C.) was provided thereon by coating so as to give a dried film thickness of 2 μm.

A negative image film was laid overlapping on the photosensitive material thus prepared, followed by imagewise exposure for 10 seconds using a 500 W electric power ultrahigh-pressure mercury lamp, through a filter that absorbs light of not more than 400 nm.

The negative film was thereafter removed, and the photosensitive material was allowed to pass through a heat developing machine controlled to 125° C., in 16 seconds. Thereafter, the filter was removed, and photosensitive material was subjected to whole areal exposure using the above light source, for 60 seconds under heating at 80° C. Etching was carried out using methyl ethyl ketone. As a result, a positive polymer image was formed on the PET film. It was possible to take out the polymer image when the irradiation for the whole areal exposure was made within 20 seconds to 180 seconds.

Using a sample obtained after the whole areal exposure, without no etching, and using an image-receiving material comprising an image-receiving paper coated with polyester, the photosensitive layer and image-receiving layer were laid overlapping in face-to-face contact, and a 130° C. heat roller was passed thereon at a speed of 5 mm/sec. The photosensitive material was peeled. As a result, a positive image comprised of the magenta dye, corresponding to the imagewise exposed area, was formed on the image-receiving paper. The optical maximum density of the magenta image was 1.15 and the optical minimum density thereof was 0.27.

Example 16

A solution comprising the following composition was prepared.

| | |
|---|---|
| Polymethyl methacrylate | 10.0 parts |
| Pentaerythritol triacrylate | 10.0 parts |
| Camphorquinone | 0.7 part |
| 3.3'-Carbonylbis(7-diethylaminocumarin) | 0.7 part |
| Ethyl p-dimethylaminobenzoate | 1.0 part |
| Heat-diffusible dye of the formula: | 2.0 parts |

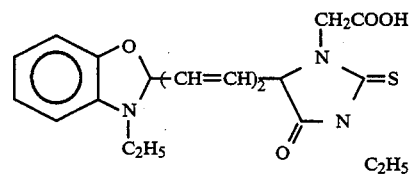

| | |
|---|---|
| Methyl ethyl ketone | 80.0 parts |

This solution was applied to a PET film so as to give a dried film thickness of 5 μm to form a polymerizing layer. On this layer, a photosensitive layer with a dried film thickness of 4 μm was formed using the following dispersion.

| | |
|---|---|
| Behenic acid | 1.8 parts |
| Silver behenate | 4.0 parts |
| Silver bromide | 0.6 part |
| Polyvinyl butyral | 8.0 parts |
| Phthalazinone | 0.9 part |
| 8-Hydroxyquinoline | 2.9 parts |
| Toluene | 40 parts |
| n-Butanol | 60 parts |

N,N-dimethylformamide 1 wt. % solution of the compound of the following formula:

On this layer, a polyvinyl butyral layer (Tg: 105° C.) was formed as a protective layer so as to give a dried film thickness of 3 μm.

The resulting photosensitive material was imagewise exposed to light from the photosensitive layer side, using a 5 mW He—Ne laser, followed by heating for 30 seconds using a heat developing machine of 110° C. Thereafter, using the ultrahigh-pressure mercury lamp used in Example 15, whole areal exposure was carried out for 60 seconds under heating at 60° C. Subsequently the photosensitive material was laid overlapping on an image-receiving paper, and a 120° C. heat roller was passed thereon at a speed of 5 mm/sec. As a result, a cyan image corresponding to the imagewise exposed area was formed on the image-receiving paper.

Example 17

Example 16 was repeated to prepare a photosensitive material, except that the polyvinyl butyral (Tg: 105° C.) of the protective layer was replaced with polyvinyl acetal (Tg: 80° C.). Evaluation was made in the same manner as Example 16. As a result, a cyan image corresponding with the imagewise exposed area was formed on the image-receiving paper.

Example 18

(Formation of coloring material layer)

| | |
|---|---|
| 1-Amino-2(p-methylphenoxy)-4-hydroxy-anthraquinone | 2.5 parts |

-continued

| | |
|---|---|
| 2,4-Diethylthioxanthone | 1.5 parts |
| Ethyl dimethylaminobenzoate | 1 part |
| Kayarad DPHA | 10 parts |
| (available from Nihon Kayaku Co., Ltd.) | |
| Acrylic resin | 10 parts |
| Methyl ethyl ketone | 75 parts |

The above composition was weighed out, and thoroughly dissolved using an ultrasonic dispersion machine to obtain Solution A. Solution A was applied to a polyester film of 9 μm thick having been subjected to anchoring, so as to give a dried film thickness of 2 to 3 μm to provide a coloring material layer containing a polymerizable polymer precursor.
(Formation of polymerizing layer)

| | |
|---|---|
| Polyvinyl butyral (Tg: 112° C.; Mw: 20,000) | 50 parts |
| Trimethylolpropane triacrylate | 40 parts |
| 2,4-Diethylthioxanthone | 5 parts |
| Ethyl dimethylaminobenzoate | 5 parts |
| Isopropanol | 390 parts |

The above composition was weighed out, and thoroughly dissolved using an ultrasonic dispersion machine to obtain Solution B. Solution B was applied to the coloring material layer so as to give a dried film thickness of 5 to 6 μm to provide a polymerizing layer.
(Formation of photosensitive layer)

| | |
|---|---|
| Behenic acid | 4 parts |
| AgBr | 1.2 parts |
| Silver behenate | 5 parts |
| 2,2'-Methylenebis(4-methoxyphenol) | 5 parts |
| Phthalazinone | 1 part |
| Polyvinyl butyral (Tg: 55° C.) | 15 parts |
| Xylene/butanol (50:50) | 120 parts |

The above composition was weighed, and thoroughly blended using a homomixer to obtain Solution C. Solution C was applied to a polyester film of 6 μm thick having been subjected to anchoring, so as to give a dried film thickness of 5 to 6 μm to obtain a photosensitive layer.
(Preparation of photosensitive material)

An aqueous polyvinyl alcohol (PVA) solution was further applied on the photosensitive layer so as to give a dried film thickness of 1 to 2 μm. The polymerizing layer previously formed and the photosensitive layer were overlapped in the manner that the polymerizing layer and the polyester film provided on the photosensitive layer may directly come into face-to-face contact, followed by laminating under heating to obtain a photosensitive material of the present invention, comprising the photosensitive layer, polymerizing layer, and coloring material layer containing the heat-diffusible coloring matter and photopolymerization initiator.
(Image formation)

On the resulting photosensitive material of the present invention, a lithographic film was laid, followed by imagewise exposure by irradiation with light for 0.5 second using a fluorescent lamp having a fluorescent peak at 420 nm, with a distance of 5 cm to form a silver latent image.

The lithographic film was thereafter removed, and the photosensitive material was allowed to pass through a heat developing machine at 120° C. in 20 seconds to form a silver image in the imagewise exposed area. The material thus processed was further placed on a hot plate heated to 60° C. which was irradiated with light from a 10 W electric power fluorescent lamp having a fluorescent peak at 390 nm, with a distance of 1 cm for 40 seconds to form polymer latent images in the polymerizing layer and coloring material layer at the ares corresponding to the imagewise unexposed area.

The photosensitive layer was peeled from the surface of the polymerizing layer together with the polyester film of 6 μm thick provided on the photosensitive layer. An image-receiving paper comprising synthetic paper provided thereon with an image-receiving layer formed with polyester resin, and the polymerizing layer were directly laid overlapping face-to-face, followed by heating at 100° C. for 20 seconds, thereby diffusion-transferring the heat-diffusible dye to the image-receiving layer. Thus, a sharp red dye image corresponding to the imagewise exposed area was obtained on the image-receiving paper.

The above processings were all carried out in a darkroom.

The O.D. value at the imagewise exposed area was 1.22, and the O.D. value at the imagewise unexposed area was 0.02.

The completely polymerized area and completely unpolymerized area of this latent image in the polymerizing layer were taken out and measurement of Tg at the respective areas was made using a visco-elasticity measuring method. As a result, $Tg_2$ at the polymerized area was found to be 140° C.; and $Tg_1$ at the unpolymerized area, 20° C.

Comparative Example 2

| | |
|---|---|
| AgBr | 1 part |
| Silver behenate | 5 parts |
| Behenic acid | 4 parts |
| 4-Methyl-1-phenyl-3-pyrazolidone | 4 parts |
| Triethanolamine | 0.8 part |
| Azobizisobutylonitrile | 3 parts |
| Kayarad DPHA | 30 parts |
| (available from Nihon Kayaku Co., Ltd.) | |
| Polymethyl methacrylate | 45 parts |
| 1-Amino-2(p-methylphenoxy)-4-hydroxy-anthraquinone | 10 parts |
| (available from Mitsui Toatsu Dyes, Inc.) | |
| Xylene/n-butanol | 400 parts |

The above composition was thoughly stirred and blended using a homomixer to prepare a coating emulsion. The emulsion was applied on a polyester film of 25 μm thick so as to give a dried film thickness of 3 to 4 μm to form a photosensitive layer. A polyester film of 6 μm thick was laminated on that layer to obtain a photosensitive material.
(Image formation)

On the above photosensitive material, a lithographic film was laid, followed by imagewise exposure by irradiation with light for 0.5 second using a fluorescent lamp having a fluorescent peak at 420 nm, with a distance of 5 cm to form a silver latent image.

The lithographic film was removed, and the photosensitive material was allowed to pass through a heat developing machine at 125° C. in 20 seconds to form a silver image in the silver latent image area (imagewise exposed area). The material thus processed was further placed on a hot plate heated to 70° C., for 50 seconds to form a polymer latent image. The polyester film of 6 μm thick was peeled, and then an image-receiving paper and the photosensitive layer were overlapped, followed by heating at 95° C. for 15 seconds, and thereafter the image-receiving paper was peeled. As a result, the red dye was transferred onto the image-receiving paper over the whole area thereof, where no clear image was obtained.

Comparative Example 3

| AgBr | 1.2 parts |
|---|---|
| Silver behenate | 7 parts |
| Behenic acid | 4 parts |
| 2,2'-Methylenebis(4,6-di-t-butylphenol) | 6 parts |
| Phthalazinone | 1.2 parts |
| 2,4-Diethylthioxanthone | 3 parts |
| Ethyl dimethylaminobenzoate | 2 parts |
| Polyvinyl butyral | 10 parts |
| Polymethyl methacrylate | 20 parts |
| Pentaerythritol tetraacrylate | 30 parts |
| Diacryl Red Violet RL-F | 7 parts |
| Xylene/butanol | 400 parts |

The above composition was weighed out, and thoroughly dispersed using a homomixer to prepare a coating solution.

The above solution was applied to a polyester film of 15 μm thick, using an applicator so as to give a dried film thickness of 4 μm to form a photosensitive layer. A polyester film of 6 μm thick was further laminated on that layer to provide a photosensitive material.

On the above photosensitive material, a negative film was laid, followed by exposure to light after its image for 1 second using a fluorescent lamp having a fluorescent peak at 420 nm, with a distance of 5 cm to form a silver latent image in the exposed area.

The negative film was removed, and the photosensitive material was allowed to pass through a heat developing machine controlled to 125° C., in 8 seconds to form a silver image and the oxidized product in the silver latent image area.

The material thus processed was further placed on a hot plate heated to 60° C., followed by irradiation with light from a fluorescent lamp having a fluorescent peak at 390 nm, with a distance of 5 cm for 60 seconds. As a result, the non-latent image area (imagewise unexposed area) was polymerized and the latent image area was unpolymerized.

Next, the polyester film of 6 μm thick was peeled, and then an image-receiving material and the photosensitive layer were overlapped, followed by heating at 100° C. and 10 seconds. Thereafter the image-receiving material was peeled, but no image was formed. Thereafter, the photosensitive layer was etched using ethanol. As a result, the imagewise exposed area was dissolved and the imagewise unexposed area remained, where a colored, violet, polymer image was obtained.

Example 19

(Preparation of photosensitive layer)
The following composition was stirred using a homomixer under conditions of 5,000 rpm for 10 minutes to prepare an emulsion.

| Silver bromide | 1 part |
|---|---|
| Silver behenate | 5 parts |
| 2,2'-methylenebis(4-methylphenol) | 3 parts |
| Behenic acid | 2 parts |
| Phthalazinone | 0.6 part |
| Polyvinyl butyral | 10 parts |
| Isopropanol | 40 parts |

| Xylene | 39 parts |
|---|---|

Next, this emulsion was applied to a polyester film of 50 μm thick, using an applicator so as to give a dried film thickness of 4 μm to obtain a photosensitive layer.
(Preparation of polymerizing layer)
The following composition was stirred using a homomixer under conditions of 5,000 rpm for 10 minutes to prepare a coating solution.

| Polymethyl methacrylate | 50 parts |
|---|---|
| trimethylolpropane triacrylate | 50 parts |
| Benzyl dimethyl ketal | 15 parts |
| Diffusible dye of the formula: | 10 parts |

$$CH_3CH_2O-\underset{\underset{O}{\|}}{C}-CH_2O-\underset{\underset{O}{\|}}{C}-\langle\rangle-N=N-\underset{HO}{\overset{CH_3}{\underset{\|}{\bigcirc}}}\overset{CN}{\underset{N\diagdown C_4H_9}{=O}}$$

(λmax = 426 nm)

| Methyl ethyl ketone | 875 parts |
|---|---|

Next, this coating solution was applied to a polyester film, using an applicator so as to give a dried film thickness of 3 μm to obtain a polymerizing layer.
(Image formation)
A step tablet was laid overlapping on the photosensitive material, which was exposed to light for 50 msec from the step tablet side, using a 15 W electric power fluorescent lamp having a fluorescent peak at 420 nm, with a distance of 2 cm to form a silver latent image.

Next, the step tablet was removed, and the photosensitive layer and polymerizing layer were brought into direct face-to-face contact, and sequently the material thus processed was allowed to pass through a heat developing machine controlled to 120° C., in 10 seconds. At this time, a silver image was formed in the imagewise exposed area (the latent image area), and simultaneously the oxidized product of 2,2'-methylenebis(4-methylphenol) in the photosensitive layer was formed to cause the distribution of the oxidized product to move to the polymerizing layer. The photosensitive layer and polymerizing layer were separated by peeling. The polymerizing layer was laminated with a polyester film, and the whole area thereof was subjected to exposure for 30 seconds using a 15 W fluorescent lamp having a fluorescent peak at 340 nm, with a distance of 2 cm.

Next, the polyester film laminated was peeled, and the polymerizing layer was laminated on image-receiving paper, followed by heating at 100° C. for 10 seconds. As a result, the yellow dye contained was diffusion-transferred, and thus a yellow dye image of a negative relationship to the step tablet was obtained on the image-receiving paper at its area corresponding to the silver latent image area. The resulting image was sharp and had superior brightness and chroma, also having density gradation corresponding with the step tablet.

Example 20

Heat-diffusible dye:
1-Amino-2(p-methylphonoxy)-4-hydroxy-anthraquinone 2.5 parts -continued

| Binder: | |
|---|---|
| Polyvinyl butyral | 7.5 parts |
| m-Butanol/xylene (50/50) | 90 parts |

The above composition was weighed out, and uniformly dissolved by means of an ultrasonic dispersion machine to obtain Solution A. A sheet 2 was prepared by applying the solution A to a PET film of 22 μm thick using an applicator so as to give a dried film thickness of 2 μm.

The following composition was weighed, and dispersed using a paint shaker to obtain Solution B.

| Behenic acid | 4 parts |
|---|---|
| AgBrI | 0.8 part |
| Silver behenate | 5 parts |
| 2,2'-Methylenebis(4,6-di-t-butylphenol) | 2 parts |
| Phthalazinone | 1.6 part |
| Kayarad DPHA | 15 parts |
| (available from Nihon Kayaku Co., Ltd.) | |
| Polymethyl methacrylate | 15 parts |
| 2,4-Diethylthioxanthone | 2 parts |
| Ethyl dimethylaminobenzoate | 2 parts |
| Methyl ethyl ketone | 154.2 parts |

A sheet 1 was prepared by applying Solution B to a PET film of 22 μm thick, using an applicator so as to give a dried film thickness of 2 to 3 μm, and laminating another PET film of 6 μm thick on the dried film.

On the sheet 1 thus prepared, a negative film was laid, followed by exposure to light to carry out formation of a silver latent image.

The exposure was carried out for 10 msec using as a light source a fluorescent lamp having a fluorescent peak at 420 nm, which was set with a distance of 5 cm from the photosensitive material.

The negative film was thereafter removed, and the photosensitive material was passed through a heat developing machine controlled to 115° C., in 20 seconds to form a silver image in the imagewise exposed area (latent image area). The material thus processed was further placed on a hot plate heated to 60° C., which was irradiated with light from a fluorescent lamp having a fluorescent peak at 390 nm, with a distance of 5 cm for 35 seconds to form a polymer image in the imagewise unexposed area. $Tg_1$ at the unpolymerized area of the sheet 1 was found to be 25° C.; $Tg_2$ at the polymerized area, 120° C.; and thus $Tg_2 - Tg_1 = 95°$ C.

Subsequently, the PET film of 6 μm thick was removed, and the dried films of the sheets 1 and 2 was directly come into face to face contact, followed by laminating under a pressure of 1 kg/cm² at 80° C.

The PET film of 12 μm thick of the sheet 1 was removed. Thereafter, using as an image-receiving material a synthetic paper provided thereon with an image-receiving layer formed with polyester resin, the photosensitive material and the image-receiving layer were laid overlapping face-to-face, followed by heating at 110° C. and 10 seconds, thereby diffusion-transferring the dye from the photosensitive material to the image-receiving layer. Thus, a sharp red dye image corresponding to the imagewise exposed area was obtained on the image-receiving paper. The optical density at the area corresponding to the imagewise unexposed area was as low as 0.04 with very little fogging.

As can be apparent from the foregoing, according to the present invention, a polymer latent image with good contrast can be formed promptly and stably. In addition, an image which is excellent in brightness and chromaticity can also be formed without being affected by a black color of silver images. Furthermore, an image with good gradation can be obtained, and gradation of the image can be controlled with ease. The steps for forming the image can be readily carried out.

We claim:

1. An image-forming method using a photosensitive material comprising (i) a photosensitive layer consisting essentially of a binder, a photosensitive silver halide, an organic silver salt and a reducing agent, (ii) a polymerizing layer consisting essentially of a polymerizable polymer precursor and a photopolymerization initiator and (iii) a coloring material layer consisting essentially of a heat-diffusible coloring matter, comprising the steps of:
   (a) subjecting said photosensitive material to imagewise exposure;
   (b) heating said photosensitive material to form an image comprised of silver metal on said exposed area of said photosensitive material;
   (c) subjecting at least said polymerizing layer to polymerization exposure with light to polymerize an area corresponding to said unexposed area of said photosensitive material where silver metal is not formed; and
   (d) heating at least said coloring material layer to transfer said heat-diffusible coloring matter to an image-receiving material, thus forming a color image.

2. An image forming method according to claim 1, further comprising selecting as said photosensitive materials a plurality of color materials that form color images having different hues from each other and repeating steps (a)–(d) for each photosensitive material to form an image on a single image-receiving material.

3. An image forming method using a photosensitive material comprising (i) a photosensitive layer containing a photosensitive silver halide, an organic silver salt and a reducing agent; (ii) a polymerizing layer containing a polymerizable polymer precursor and a photopolymerization initiator; and (iii) a coloring material layer containing a heat-diffusible coloring matter, said photosensitive layer, said polymerizing layer and said coloring material layer defining a plurality of regions arranged in in-plane in said photosensitive material, wherein hues of said heat-diffusible coloring matter, when heat-diffusible coloring matters have been transferred to an image-receiving material by heating differ from each other at adjacent regions; which comprises the steps of:
   (a) subjecting said photosensitive material to imagewise exposure;
   (b) heating said photosensitive material to form an image comprised of silver metal on said exposed area of said photosensitive material;
   (c) subjecting at least said polymerizing layer to polymerization exposure with light to polymerize an area corresponding to said unexposed area of said photosensitive material where silver metal is not formed; and
   (d) heating said coloring material layer to transfer said heat-diffusible coloring matter to an image-receiving material.

4. An image forming method according to claim 3, wherein said coloring material layer further contains said polymerizable polymer precursor and said photopolymerization initiator.

5. An image forming method according to claim 3, wherein said steps (a)–(d) are applied to at least two of said plurality of regions.

6. An image-forming method using a photosensitive material comprising (i) a photosensitive layer consisting essentially of a binder, a photosensitive silver halide, an organic silver salt and a reducing agent, (ii) a polymerizing layer consisting essentially of a polymerizable polymer precursor and a photopolymerization initiator and (iii) a coloring material layer consisting essentially of a heat-diffusible coloring matter, a polymerizable polymer precursor and a photopolymerization initiator comprising the steps of:

(a) subjecting said photosensitive material to imagewise exposure;
(b) heating said photosensitive material to form an image comprised of silver metal on said exposed area of said photosensitive material;
(c) subjecting at least said polymerizing layer to polymerization exposure with light to polymerize an area corresponding to said unexposed area of said photosensitive material where silver metal is not formed; and
(d) heating at least said coloring material layer to transfer said heat-diffusible coloring matter to an image-receiving material, thus forming a color image.

* * * * *

UNITED STATES PATENT AND TRADEMARK OFFICE
CERTIFICATE OF CORRECTION

PATENT NO. : 5,415,974
DATED : May 16, 1995
INVENTOR(S) : MASATO KATAYAMA, ET AL.

It is certified that error appears in the above-identified patent and that said Letters Patent is hereby corrected as shown below:

ON TITLE PAGE

In [19] United States Patent: "Kotayama et al."
            should read --Katayama et al.--.

In [75] Inventors: "Masato Kotayama," should read
            --Masato Katayama,--.

In [56] References Cited, under U.S. PATENT DOCUMENTS:
            "4,764,451  8/1988  Ishikawa" (second occurrence)
            should be deleted.

In [57] ABSTRACT, Line 11: "A" should read --An--.

COLUMN 1

Line 45, "uses" should read --use--.

COLUMN 2

Line 20, "an" should be deleted.

COLUMN 3

Line 7, "form" should read --forming--.

COLUMN 4

Line 59, "illustrates" should read --illustrate--.
   Line 68, "methods;" should read --methods.--.

UNITED STATES PATENT AND TRADEMARK OFFICE
CERTIFICATE OF CORRECTION

PATENT NO. : 5,415,974
DATED : May 16, 1995
INVENTOR(S) : MASATO KATAYAMA, ET AL.

It is certified that error appears in the above-identified patent and that said Letters Patent is hereby corrected as shown below:

COLUMN 5

Line 5, "described" should read --be described--.

COLUMN 6

Line 3, "form" should read --forming--.

COLUMN 20

Line 14, "burytic" should read --butyric--.

COLUMN 21

Line 7, "methoxyphenonl," should read --methoxyphenol,--.
Line 12, "(p-hydropxyphenyl)" should read --(p-hydroxyphenyl)--.
Line 21, "α-naphtol, ß-naphtol," should read --α-naphthol, ß-naphthol,--.

COLUMN 22

Line 16, "R1, R2, $R^3$, $R^5$" should read --$R_1$, $R_2$, $R_3$, $R_5$--.
Line 17, "$R^6$" should read --$R_6$-- and "atom" should read --atom,--.
Line 22, "$R^4$" should read --$R_4$--.
Line 55, "$R^7$ and $R^8$" should read ---$R_7$ and $R_8$--.
Line 59, "$R^9$" should read --$R_9$--.
Line 61, "$R^1$ to $R^6$" should read --$R_1$ to $R_6$--.

COLUMN 23

Line 45, "represented" should read --represented by--.

UNITED STATES PATENT AND TRADEMARK OFFICE
CERTIFICATE OF CORRECTION

PATENT NO. : 5,415,974
DATED : May 16, 1995
INVENTOR(S) : MASATO KATAYAMA, ET AL.

It is certified that error appears in the above-identified patent and that said Letters Patent is hereby corrected as shown below:

COLUMN 27

Line 4, "cupper;" should read --copper;--.
Line 68, "layer'" should read --layer.--.

COLUMN 28

Line 10, "color-chang" should read --color-change--.

COLUMN 29

Line 59, "layer," should read --later,--.

COLUMN 30

Line 51, "INm" should read --1 µm--.
Line 63, "laminating-the" should read --laminating the--.

COLUMN 31

Line 50, "has release" should read --can release--.
Line 59, "a advantage" should read --an advantage--.

COLUMN 33

Line 66, "-in" should read --in--.

COLUMN 37

Line 62, "1 cyan," should read --cyan,--.

UNITED STATES PATENT AND TRADEMARK OFFICE
CERTIFICATE OF CORRECTION

PATENT NO. : 5,415,974
DATED : May 16, 1995
INVENTOR(S) : MASATO KATAYAMA, ET AL.

It is certified that error appears in the above-identified patent and that said Letters Patent is hereby corrected as shown below:

COLUMN 39

Line 22, "$T_{g2}-T_{g1}\geqq>30°C.$" should read --$T_{g2}-T_{g1}\geqq 30°C.$--.

COLUMN 40

Line 11, "include" should read --includes--.
Line 46, "complicate" should read --complicated--.
Line 53, "constitute" should read --constitutes--.
Line 63, "palmirate," should read --palmitate--.

COLUMN 42

Line 7, "imager" should read --image;--.

COLUMN 43

Line 17, "which" should be deleted.

COLUMN 44

Line 10, "embodiment it" should read --embodiment.  It--.
Line 58, "500 mJ/cm" should read --500 mJ/cm$^2$--.
Line 63, "competed" should read --compared--.

COLUMN 47

Line 53, "Tdiffus" should read --Tdiffuse--.
Line 64, "Tdiffus" should read --Tdiffuse-- and "(Ttrans$\geqq$Tdiffus)." should read --(Ttrans$\geqq$Tdiffuse).--.

UNITED STATES PATENT AND TRADEMARK OFFICE
CERTIFICATE OF CORRECTION

PATENT NO. : 5,415,974
DATED : May 16, 1995
INVENTOR(S) : MASATO KATAYAMA, ET AL.

It is certified that error appears in the above-identified patent and that said Letters Patent is hereby corrected as shown below:

COLUMN 50

Line 26, "on a" should read --on an--.

COLUMN 54

Line 3, "phthatazi-" should read --phthalazi- --.
    Line 9, "methacrylatebutyl" should read
        --methacrylate/butyl--.
    Line 14, "throughly" should read --thoroughly--.

COLUMN 55

Line 14, "part" should read --parts--.
    Line 29, "throughly" should read --thoroughly--.

COLUMN 58

Line 67, "form a" should read --form an--.

COLUMN 63

Line 26, "Pentaerithritol" should read --Pentaerythritol--.

COLUMN 68

Line 39, "To" should read --to--.
    Line 65, "Trimethyrolpropane" should read
        --Trimethylolpropane--.

UNITED STATES PATENT AND TRADEMARK OFFICE
CERTIFICATE OF CORRECTION

PATENT NO. : 5,415,974

DATED : May 16, 1995

INVENTOR(S) : MASATO KATAYAMA, ET AL.

It is certified that error appears in the above-identified patent and that said Letters Patent is hereby corrected as shown below:

COLUMN 69

Line 18, "Trimethyrolpropane" should read --Trimethylolpropane--.
Line 20, "dimethylaminovenzoate" should read --dimethylaminobenzoate--.
Line 32, "Trimethyrolpropane" should read --Trimethylolpropane--.
Line 55, "Sequently," should read --Subsequently,--.

COLUMN 74

Line 6, "ares" should read --area--.
Line 47, "thoughly" should read --thoroughly--.

COLUMN 77

Line 50, "was" should read --were--.

Signed and Sealed this

Twenty-fourth Day of October, 1995

Attest:

BRUCE LEHMAN

Attesting Officer

Commissioner of Patents and Trademarks